(12) United States Patent
Takata et al.

(10) Patent No.: US 7,575,850 B2
(45) Date of Patent: Aug. 18, 2009

(54) CHEMICALLY AMPLIFIED RESIST COMPOSITION

(75) Inventors: Yoshiyuki Takata, Toyonaka (JP); Satoshi Yamamoto, Hyogo (JP); Satoshi Yamaguchi, Kawachinagano (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/021,149

(22) Filed: Jan. 28, 2008

(65) Prior Publication Data

US 2008/0193874 A1      Aug. 14, 2008

(30) Foreign Application Priority Data

Jan. 30, 2007   (JP) .............................. 2007-018998

(51) Int. Cl.
    *G03F 7/004* (2006.01)
(52) U.S. Cl. .................... 430/270.1; 430/910; 430/921; 430/922
(58) Field of Classification Search .............. 430/270.1, 430/910, 921, 922
    See application file for complete search history.

(56) References Cited

U.S. PATENT DOCUMENTS

| | | | |
|---|---|---|---|
| 7,262,321 B2 | 8/2007 | Harada et al. | |
| 7,301,047 B2 | 11/2007 | Yoshida et al. | |
| 7,304,175 B2 | 12/2007 | Harada et al. | |
| 2003/0068573 A1 | 4/2003 | Takata et al. | |
| 2004/0018445 A1 | 1/2004 | Akita et al. | |
| 2005/0031984 A1 | 2/2005 | Takata et al. | |
| 2005/0260525 A1 | 11/2005 | Takemoto et al. | |
| 2006/0160017 A1 | 7/2006 | Takemoto et al. | |
| 2007/0100096 A1 | 5/2007 | Harada et al. | |
| 2007/0122750 A1 | 5/2007 | Yamaguchi et al. | |
| 2008/0081293 A1 | 4/2008 | Harada et al. | |
| 2008/0166660 A1* | 7/2008 | Takata et al. ............. | 430/281.1 |

* cited by examiner

*Primary Examiner*—John S Chu
(74) *Attorney, Agent, or Firm*—Birch, Stewart, Kolasch & Birch, LLP

(57) ABSTRACT

The present invention provides a chemically amplified resist composition comprising:

a resin which comprises a structural unit having an acid-labile group and a structural unit represented by the formula (I):

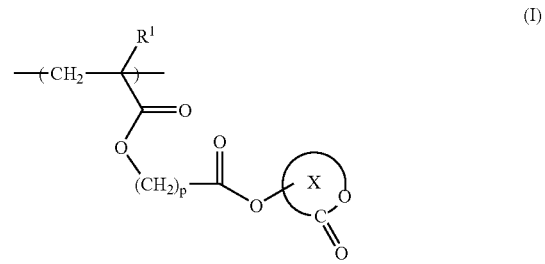

wherein $R^1$ represents a hydrogen atom or a methyl group, ring X represents a C3-C30 cyclic hydrocarbon group in which one —$CH_2$— is substituted with —COO—, and at least one hydrogen atom in the C3-C30 cyclic hydrocarbon group may be substituted, and p represents an integer of 1 to 4, and which itself is insoluble or poorly soluble in an alkali aqueous solution but becomes soluble in an alkali aqueous solution by the action of an acid, and at least two salts selected from a salt represented by the formula (II):

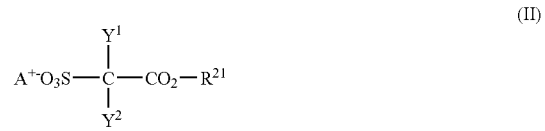

wherein $Y^1$ and $Y^2$ each independently represent a fluorine atom or a C1-C6 perfluoroalkyl group, $A^+$ represents an organic counter ion and $R^{21}$ represents a C1-C30 hydrocarbon group which may be substituted and at least one —$CH_2$— in the C1-C30 hydrocarbon group may be substituted with —CO— or —O—, and a salt represented by the formula (III):

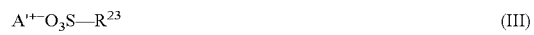

wherein $R^{23}$ represents a C1-C8 linear or branched chain perfluoroalkyl group and $A'^+$ represents an organic counter ion.

14 Claims, No Drawings

CHEMICALLY AMPLIFIED RESIST COMPOSITION

This nonprovisional application claims priority under 35 U.S.C. § 119(a) on Patent Application No. 2007-018998 filed in JAPAN on Jan. 30, 2007, the entire contents of which are hereby incorporated by reference.

FIELD OF THE INVENTION

The present invention relates to a chemically amplified resist composition.

BACKGROUND OF THE INVENTION

A chemically amplified resist composition used for semiconductor microfabrication employing a lithography process contains an acid generator comprising a compound generating an acid by irradiation.

In semiconductor microfabrication, it is desirable to form patterns having high resolution and good line edge roughness, and it is expected for a chemically amplified resist composition to give such patterns.

US 2006-0194982 A1 discloses a chemically amplified resist composition containing the salt represented by the following formula:

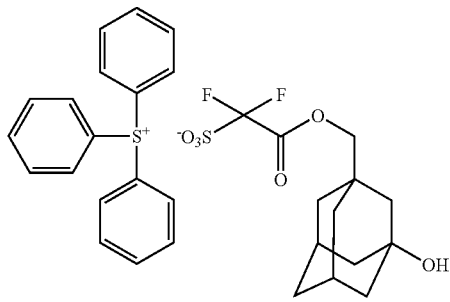

and the resin which contains the following structural units:

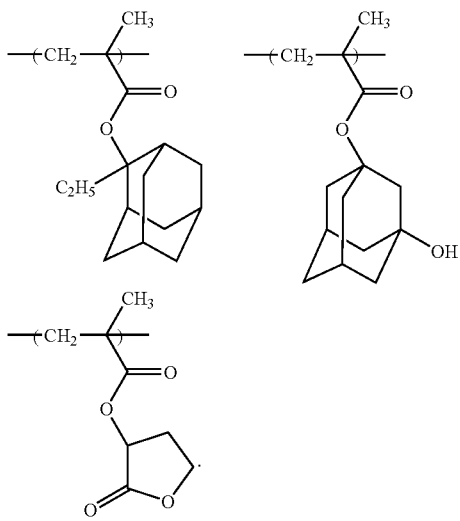

SUMMARY OF THE INVENTION

Objects of the present invention are to provide a chemically amplified resist composition giving patterns having better resolution and better line edge roughness.

This and other objects of the present invention will be apparent from the following description.

The present invention relates to the followings:

<1> A chemically amplified resist composition comprising:
a resin which comprises a structural unit having an acid-labile group and a structural unit represented by the formula (I):

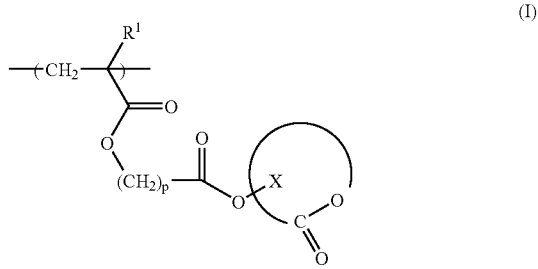

wherein $R^1$ represents a hydrogen atom or a methyl group, ring X represents a C3-C30 cyclic hydrocarbon group in which one —$CH_2$— is substituted with —COO—, and at least one hydrogen atom in the C3-C30 cyclic hydrocarbon group may be substituted, and p represents an integer of 1 to 4, and which itself is insoluble or poorly soluble in an alkali aqueous solution but becomes soluble in an alkali aqueous solution by the action of an acid, and at least two salts selected from a salt represented by the formula (II):

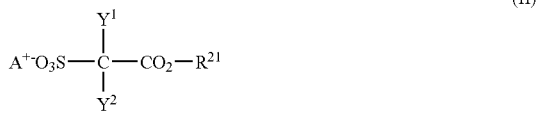

wherein $Y^1$ and $Y^2$ each independently represent a fluorine atom or a C1-C6 perfluoroalkyl group, $A^+$ represents an organic counter ion and $R^{21}$ represents a C1-C30 hydrocarbon group which may be substituted and at least one —$CH_2$— in the C1-C30 hydrocarbon group may be substituted with —CO— or —O—, and a salt represented by the formula (III):

wherein $R^{23}$ represents a C1-C8 linear or branched chain perfluoroalkyl group and $A'^+$ represents an organic counter ion;

<2> The chemically amplified resist composition according to <1>, wherein the structural unit having an acid-labile group is a structural unit represented by the formula (IVa):

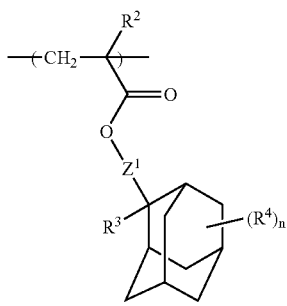

(IVa)

wherein $R^2$ represents a hydrogen atom or a methyl group, $R^3$ represents a C1-C8 hydrocarbon group, $R^4$ represents a methyl group, n represents an integer of 0 to 14, $Z^1$ represents a single bond or —$(CH_2)_r$—COO—, and r represents an integer of 1 to 4, or a structural unit represented by the formula (IVb):

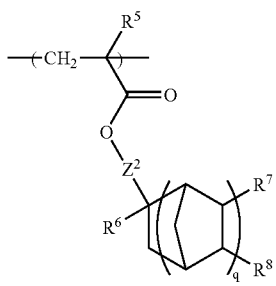

(IVb)

wherein $R^5$ represents a hydrogen atom or a methyl group, $R^6$ represents a C1-C8 hydrocarbon group, $R^7$ and $R^8$ each independently represent a hydrogen atom or a C1-C8 monovalent hydrocarbon group which may have at least one heteroatom, and $R^7$ and $R^8$ may be bonded to form a C1-C8 divalent hydrocarbon group which may have at least one heteroatom which forms a ring together with the adjacent carbon atoms to which $R^7$ and $R^8$ are bonded, and $R^7$ and $R^8$ may be bonded to form a carbon-carbon double bond between the carbon atom to which $R^7$ is bonded and the carbon atom to which $R^8$ is bonded, q represents an integer of 1 to 3, $Z^2$ represents a single bond or —$(CH_2)_s$—COO—, and s represents an integer of 1 to 4;

<3> The chemically amplified resist composition according to <1> or <2>, wherein the resin further comprises a structural unit represented by the formula (V):

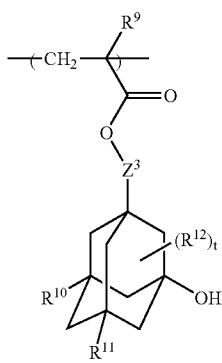

(V)

wherein $R^9$ represents a hydrogen atom or a methyl group, $R^{10}$ and $R^{11}$ each independently represent a hydrogen atom, a methyl group or a hydroxyl group, $R^{12}$ represents a methyl group, t represents an integer of 0 to 12, $Z^3$ represents a single bond or —$(CH_2)_u$—COO— and u represents an integer of 1 to 4;

<4> The chemically amplified resist composition according to <1>, <2> or <3>, wherein the structural unit represented by the formula (I) is a structural unit represented by the formula (VIa), (VIb) or (VIc):

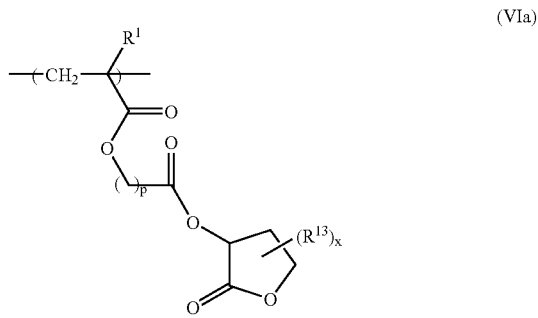

(VIa)

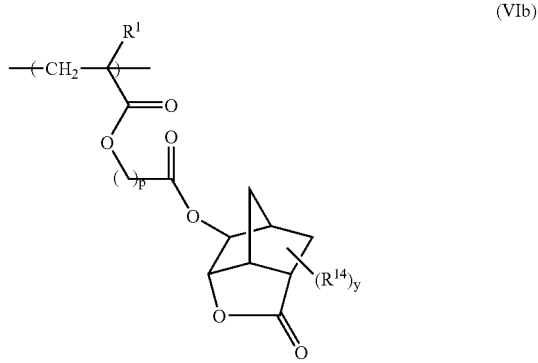

(VIb)

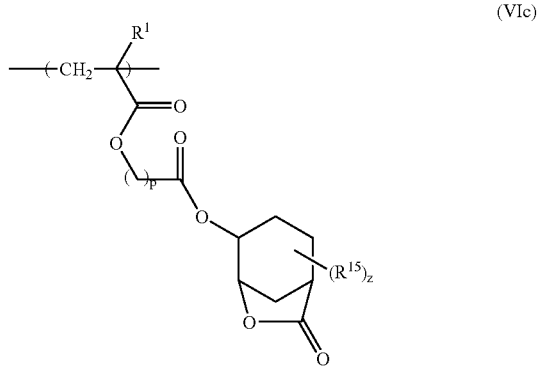

(VIc)

wherein $R^1$ represents a hydrogen atom or a methyl group, p represents an integer of 1 to 4, $R^{13}$ represents a methyl group, x represents an integer of 0 to 5, $R^{14}$ represents a C1-C4 hydrocarbon group, a carboxyl group or a cyano group, y represents an integer of 0 to 3, $R^{15}$ represents a C1-C4 hydrocarbon group, a carboxyl group or a cyano group, z represents an integer of 0 to 3, and when y is 2 or 3, $R^{14}$s may be the same or different, and when z is 2 or 3, $R^{15}$s may be the same or different;

<5> The chemically amplified resist composition according to any one of <1> to <4>, wherein the salt represented by the formula (II) is a salt represented by the formula (VII):

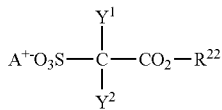

(VII)

wherein $Y^1$ and $Y^2$ each independently represent a fluorine atom or a C1-C6 perfluoroalkyl group, $A^+$ represents an organic counter ion, and $R^{22}$ represents a C1-C20 linear or branched chain hydrocarbon group which may be substituted or a C3-C30 cyclic hydrocarbon group which may be substituted, and at least one —CH$_2$— in the C1-C20 linear or branched chain hydrocarbon group or the C3-C30 cyclic hydrocarbon group may be substituted with —CO— or —O—;

<6> The chemically amplified resist composition according to any one of <1> to <4>, wherein the salt represented by the formula (II) is a salt represented by the following formula (XII):

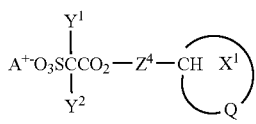

(XII)

wherein $Y^1$ and $Y^2$ each independently represent a fluorine atom or a C1-C6 perfluoroalkyl group, $A^+$ represents an organic counter ion, $Z^4$ represents a single bond or a C1-C4 alkylene group, Q represents —CH$_2$—, —CO— or —CH(OH)— and ring $X^1$ represents a C3-C30 monocyclic or polycyclic hydrocarbon group in which two hydrogen atoms are substituted with =O at Q position when Q is —CO— or in which a hydrogen atom is substituted with a hydroxyl group at Q position when Q is —CH(OH)—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group;

<7> The chemically amplified resist composition according to any one of <1> to <6>, wherein $A^+$ and $A'^+$ are the same or different, and each independently represents at least one cation selected from the group consisting of the formula (VIIIa):

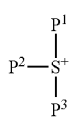

(VIIIa)

wherein $P^1$, $P^2$ and $P^3$ each independently represent a C1-C30 linear or branched chain alkyl group which may be substituted with at least one selected from a hydroxyl group, a C3-C12 cyclic alkoxy group and a C1-C12 alkoxy group, or a C3-C30 cyclic hydrocarbon group which may be substituted with at least one selected from a hydroxyl group and a C1-C12 alkoxy group, a cation represented by the formula (VIIIb):

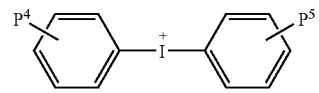

(VIIIb)

wherein $P^4$ and $P^5$ each independently represent a hydrogen atom, a hydroxyl group, a C1-C12 alkyl group or a C1-C12 alkoxy group, a cation represented by the formula (VIIIc):

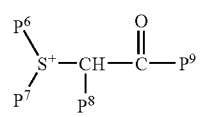

(VIIIc)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, and at least one —CH$_2$— in the divalent acyclic hydrocarbon group may be substituted with —CO—, —O— or —S—, $P^8$ represents a hydrogen atom, $P^9$ represents a C1-C12 alkyl group, a C3-C12 cycloalkyl group or an aromatic group which may be substituted, or $P^8$ and $P^9$ are bonded to form a divalent acyclic hydrocarbon group which forms a 2-oxocycloalkyl group together with the adjacent —CHCO—, and at least one —CH$_2$— in the divalent acyclic hydrocarbon group may be replaced with —CO—, —O— or —S—; and a cation represented by the formula (VIIId):

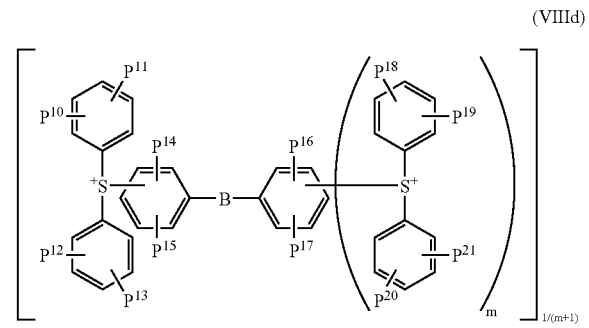

(VIIId)

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent a hydrogen atom, a hydroxyl group, a C1-C12 alkyl group or a C1-C12 alkoxy group, B represents a sulfur or oxygen atom and m represents 0 or 1;

<8> The chemically amplified resist composition according to any one of <1> to <6>, wherein $A^+$ and $A'^+$ are the same or different, and each independently represents a cation represented by the formula (VIIIe), (VIIIf), (VIIIg) or (VIIIj):

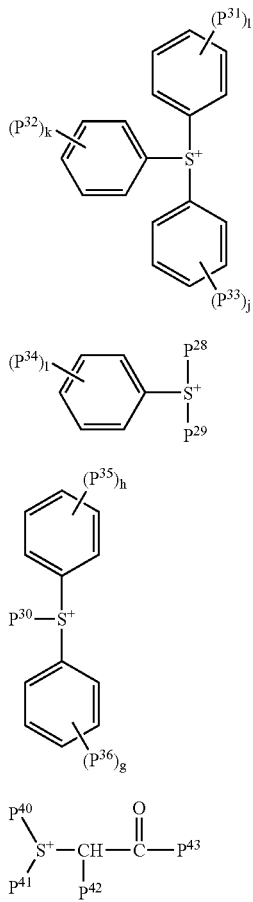

(VIIIe)

(VIIIf)

(VIIIg)

(VIIIj)

wherein $P^{28}$, $P^{29}$ and $P^{30}$ each independently represent a C1-C20 alkyl group or a C3-C30 cyclic hydrocarbon group except a phenyl group, and at least one hydrogen atom in the C1-C20 alkyl group may be substituted with a hydroxyl group, a C1-C12 alkoxy group or a C3-C12 cyclic hydrocarbon group and at least one hydrogen atom in the C3-C30 cyclic hydrocarbon group may be substituted with a hydroxyl group, a C1-C12 alkyl group or a C1-C12 alkoxy group, and $P^3$, $P^{32}$, $P^{33}$, $P^{34}$, $P^{35}$ and $P^{36}$ each independently represent a hydroxyl group, a C1-C12 alkyl group, a C1-C12 alkoxy group or a C3-C12 cyclic hydrocarbon group, and l, k, j, i, h and g each independently represent an integer of 0 to 5, $P^{40}$ and $P^{41}$ each independently represent a C1-C6 alkyl group or a C3-C6 cycloalkyl group, or $P^{40}$ and $P^{41}$ are bonded to form a C3-C7 divalent acyclic hydrocarbon group which forms the ring together with the adjacent $S^+$, $P^{42}$ represents a hydrogen atom, $P^{43}$ represents a C1-C6 alkyl group or a C6-C12 aromatic group which may be substituted with at least one selected from the C1-C6 alkoxy group, the C2-C12 acyl group and the nitro group, or $P^{42}$ and $P^{43}$ are bonded to form a C3-C7 divalent acyclic hydrocarbon group which forms a 2-oxocycloalkyl group together with the adjacent —CHCO—, and at least one —CH$_2$— in the C3-C7 divalent acyclic hydrocarbon group may be replaced with —CO—, —O— or —S—;

<9> The chemically amplified resist composition according to any one of <1> to <6>, wherein $A^+$ and $A'^+$ are the same or different, and each independently represents a cation represented by the formula (VIIIh) or (VIIIk):

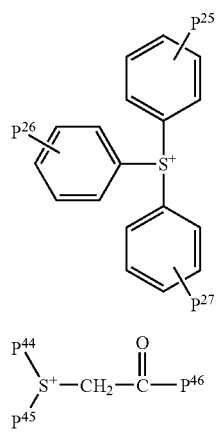

(VIIIh)

(VIIIk)

wherein $P^{25}$, $P^{26}$ and $P^{27}$ each independently represent a hydrogen atom, a hydroxyl group, a C1-C12 alkyl group or a C1-C12 alkoxy group, $P^{44}$ and $P^{45}$ are bonded to form a C3-C7 divalent acyclic hydrocarbon group which forms the ring together with the adjacent $S^+$, $P^{46}$ represents a phenyl or naphthyl group;

<10> The chemically amplified resist composition according to any one of <1> to <6>, wherein $A^+$ and $A'^+$ are the same or different, and each independently represents a cation represented by the formula (VIIIi) or (VIIIl):

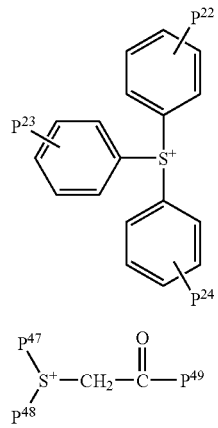

(VIIIi)

(VIIIl)

wherein $P^{22}$, $P^{23}$ and $P^{24}$ each independently represent a hydrogen atom or a C1-C4 alkyl group, $P^{47}$ and $P^{48}$ are bonded to form a C4-C5 divalent acyclic hydrocarbon group which forms the ring together with the adjacent $S^+$, $P^{49}$ represents a phenyl group;

<11> The chemically amplified resist composition according to any one of <1> to <10>, wherein the chemically amplified resist composition comprises the salt represented by the formula (II) and at least one salt selected from the salt represented by the formula (II) and the salt represented by the formula (III);

<12> The chemically amplified resist composition according to any one of <1> to <10>, wherein the chemically amplified resist composition comprises at least two salts selected from the salt represented by the formula (II);

<13> The chemically amplified resist composition according to any one of <1> to <6>, wherein at least two salts selected from a salt represented by the formula (II) and a salt represented by the formula (III) are at least two salts selected from the salt represented by the formula (II) in which $A^+$ is the cation (VIIIa) or (VIIIc) and the salt represented by the formula (III) in which $A'^+$ is the cation (VIIIa) or (VIIIc);

<14> The chemically amplified resist composition according to any one of <1> to <13>, wherein the chemically amplified resist composition further comprises a basic compound.

DESCRIPTION OF PREFERRED EMBODIMENTS

The present chemically amplified resist composition comprises a resin which comprises a structural unit having an acid-labile group and a structural unit represented by the formula (I), and which itself is insoluble or poorly soluble in an alkali aqueous solution but becomes soluble in an alkali aqueous solution by the action of an acid (hereinafter, simply referred to as RESIN), and at least two salts selected from a salt represented by the formula (II) (hereinafter, simply referred to as the Salt (II)) and a salt represented by the formula (III) (hereinafter, simply referred to as the Salt (III)).

First, the structural unit having an acid-labile group will be illustrated.

In the present specification, "—COOR" may be described as "a structure having ester of carboxylic acid", and may also be abbreviated as "ester group". Specifically, "—COOC (CH$_3$)$_3$" may be described as "a structure having tert-butyl ester of carboxylic acid", or be abbreviated as "tert-butyl ester group".

In this specification, "an acid-labile group" means a group capable to eliminate by the action of an acid.

Examples of the acid-labile group include a structure having ester of carboxylic acid such as alkyl ester group in which a carbon atom adjacent to the oxygen atom is quaternary carbon atom, alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom". As the acid-labile group, a group having a quaternary carbon atom joined to three carbon atoms and an —OR', wherein R' represents an alkyl group, is exemplified.

Examples of the acid-labile group include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethyl ester, 1-isopropoxyethyl ester, 1-ethoxypropoxy ester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom, such as an isobornyl ester, 1-alkylcycloalkyl ester, 2-alkyl-2-adamantyl ester and 1-(1-adamantyl)-1-alkylalkyl ester group. At least one hydrogen atom in the adamantyl group may be substituted with a hydroxyl group.

Examples of the structural unit include a structure unit derived from an ester of acrylic acid, a structural unit derived from an ester of methacrylic acid, a structural unit derived from an ester of norbornenecarboxylic acid, a structural unit derived from an ester of tricyclodecenecarboxylic acid and a structural unit derived from an ester of tetracyclodecenecarboxylic acid. The structure units derived from the ester of acrylic acid and from the ester of methacrylic acid are preferable.

As the structural unit having an acid-labile group, the structural unit represented by the formula (IVa) or (IVb) is preferable.

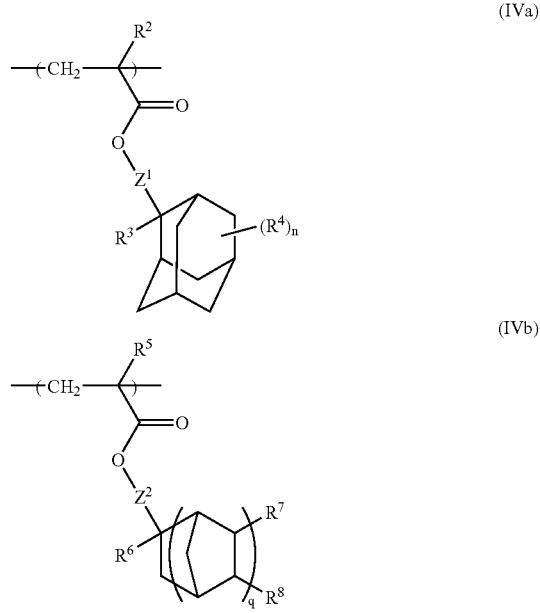

In the formula (IVa), $R^2$ represents a hydrogen atom or a methyl group, and $R^3$ represents a C1-C8 hydrocarbon group. It is preferred that $R^3$ represents the C1-C8 linear or branched chain alkyl group.

Examples of the C1-C8 hydrocarbon group include a methyl, ethyl, n-propyl, isopropyl, n-butyl, isobutyl, sec-butyl, n-pentyl, n-hexyl, n-heptyl, n-octyl, cyclopentyl, cyclohexyl, cyclooctyl, 2-methylcyclopentyl, 3-methylcyclohexyl, 4-methylcyclohexyl, 2,3-dimethylcyclohexyl, 4,4-dimethylcyclohexyl, 2-norbornyl and 5-methyl-2-norbornyl group, and a C1-C4 alkyl group such as a methyl, ethyl, n-propyl, isopropyl, n-butyl, isobutyl and sec-butyl group is preferable, and the methyl, ethyl, n-propyl and isopropyl group are more preferable.

In the formula (IVa), $R^4$ represents a methyl group, n represents an integer of 0 to 14, $Z^1$ represents a single bond or —(CH$_2$)$_r$—COO—, and r represents an integer of 1 to 4. It is preferred that n represents 0 or 1. $Z^1$ preferably represents the single bond or —CH$_2$—COO—, and more preferably represents the single bond.

In the formula (IVb), $R^5$ represents a hydrogen atom or a methyl group, and $R^6$ represents a C1-C8 hydrocarbon group. Examples of the C1-C8 hydrocarbon group include the same groups as mentioned above. Preferable examples thereof include a C1-C4 alkyl group such as a methyl, ethyl, n-propyl, isopropyl, n-butyl, isobutyl and sec-butyl group, and more preferable examples thereof include the methyl, ethyl, n-propyl and isopropyl group.

In the formula (IVb), $R^7$ and $R^8$ each independently represent a hydrogen atom or a C1-C8 monovalent hydrocarbon group which may have at least one heteroatom.

Examples of the C1-C8 monovalent hydrocarbon group include a methyl, ethyl, n-propyl, isopropyl, n-butyl, isobutyl, sec-butyl, n-pentyl, n-hexyl, n-heptyl and n-octyl group.

$R^7$ and $R^8$ may be bonded to form a C1-C8 divalent hydrocarbon group which may have at least one heteroatom which forms a ring together with the adjacent carbon atoms to which $R^7$ and $R^8$ are bonded. Specific examples of the C1-C8 divalent hydrocarbon group include an ethylene and trimethylene group.

$R^7$ and $R^8$ may be also bonded to form a carbon-carbon double bond between the carbon atom to which $R^7$ is bonded and the carbon atom to which $R^8$ is bonded.

In the formula (IVb), q represents an integer of 1 to 3, $Z^2$ represents a single bond or —$(CH_2)_s$—COO—, and s represents an integer of 1 to 4. It is preferred that s represents 0 or 1. $Z^2$ preferably represents the single bond or —$CH_2$—COO—, and more preferably represents the single bond.

The structural unit represented by the formula (IVa) is derived from the monomer represented by the formula (IVa-1):

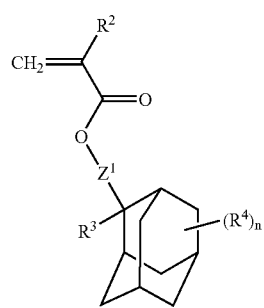
(IVa-1)

wherein $R^2$, $R^3$, $R^4$, $Z^1$ and n are the same as defined above.

Specific examples of the monomer represented by the formula (IVa-1) include the followings.

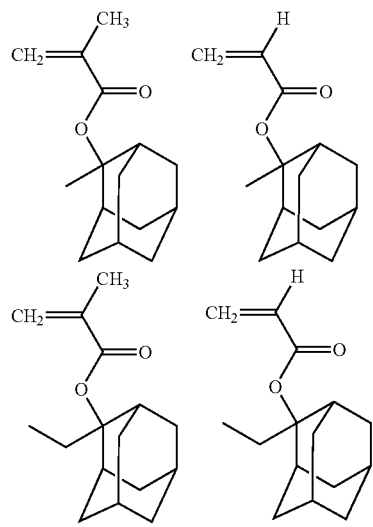

-continued

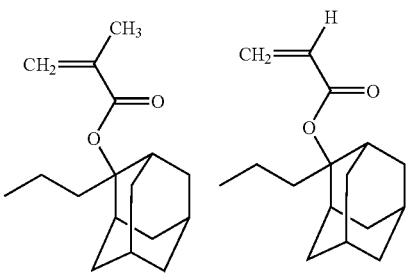

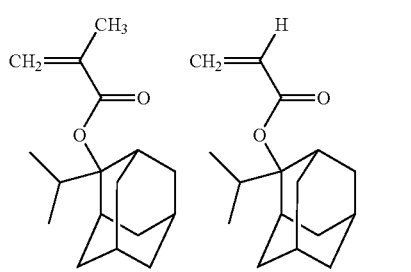

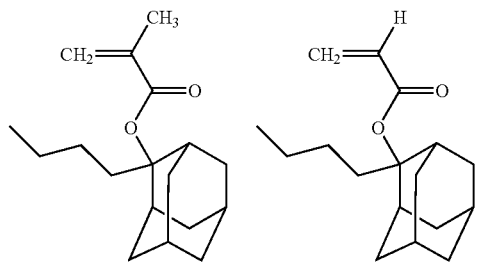

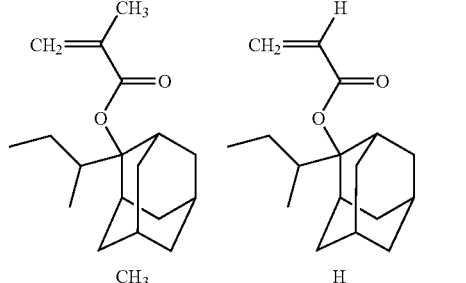

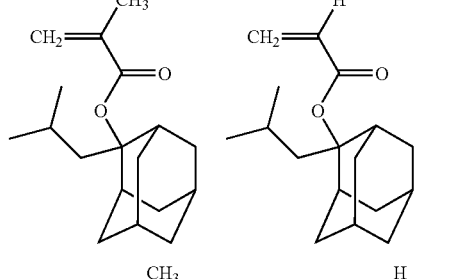

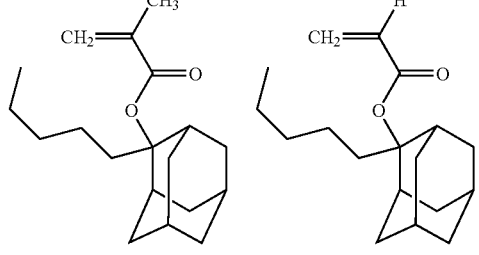

-continued
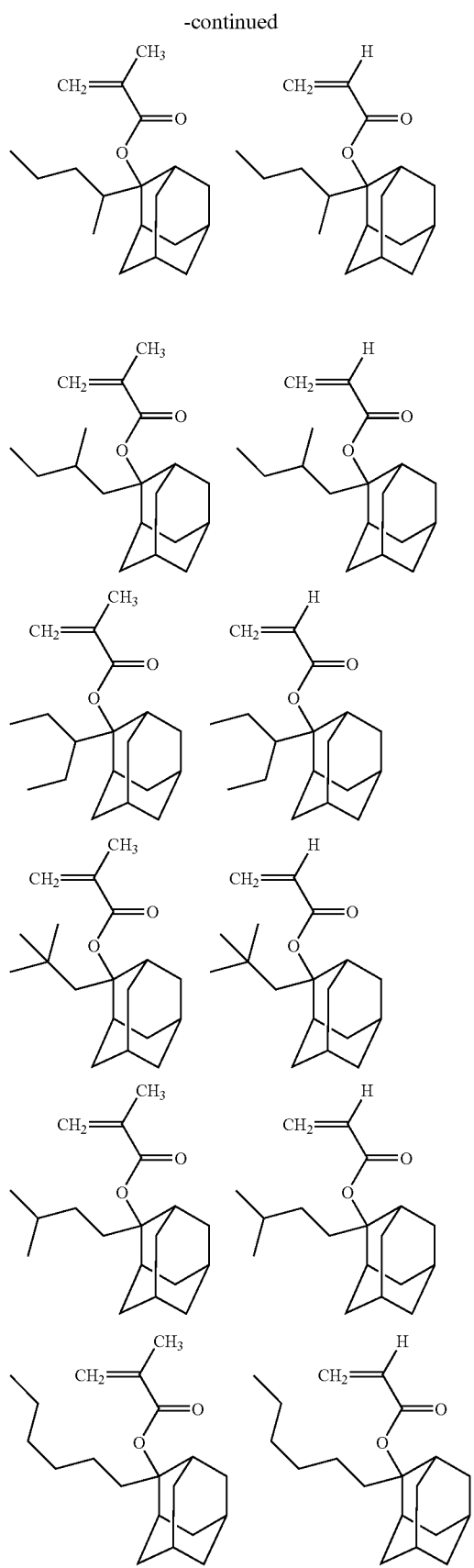
-continued
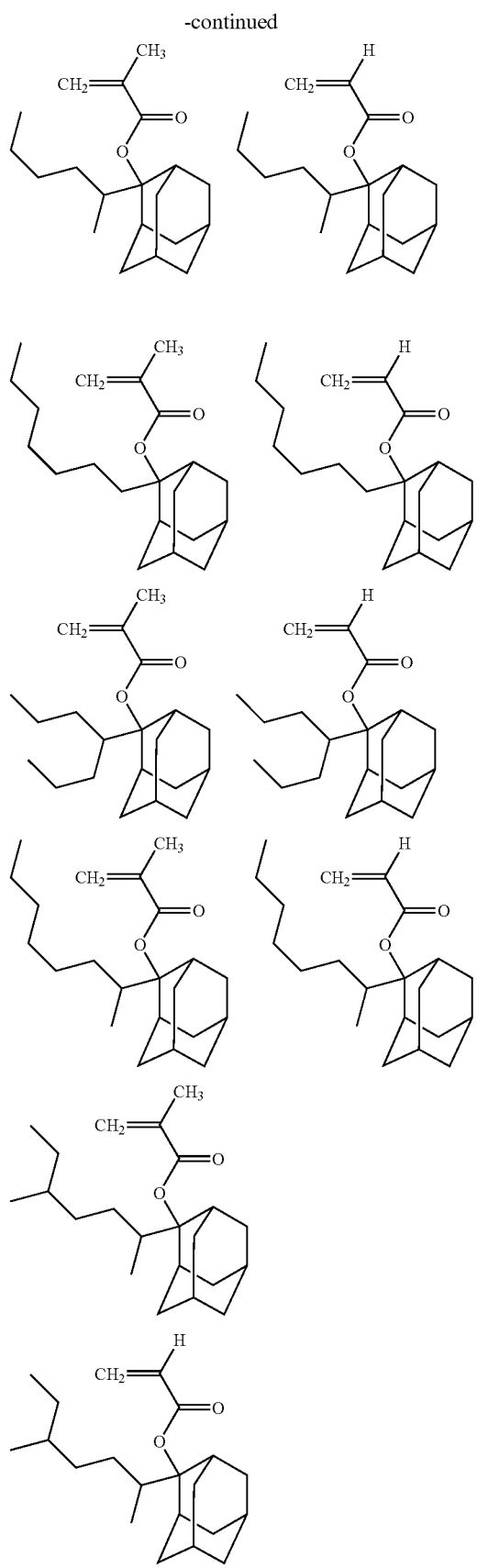

-continued
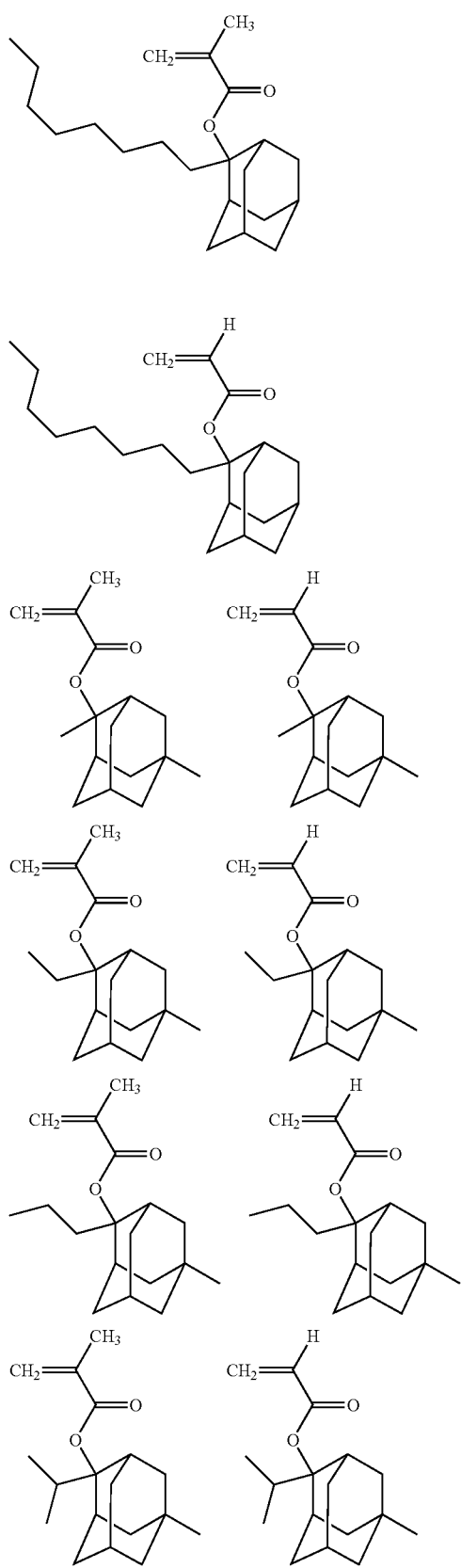
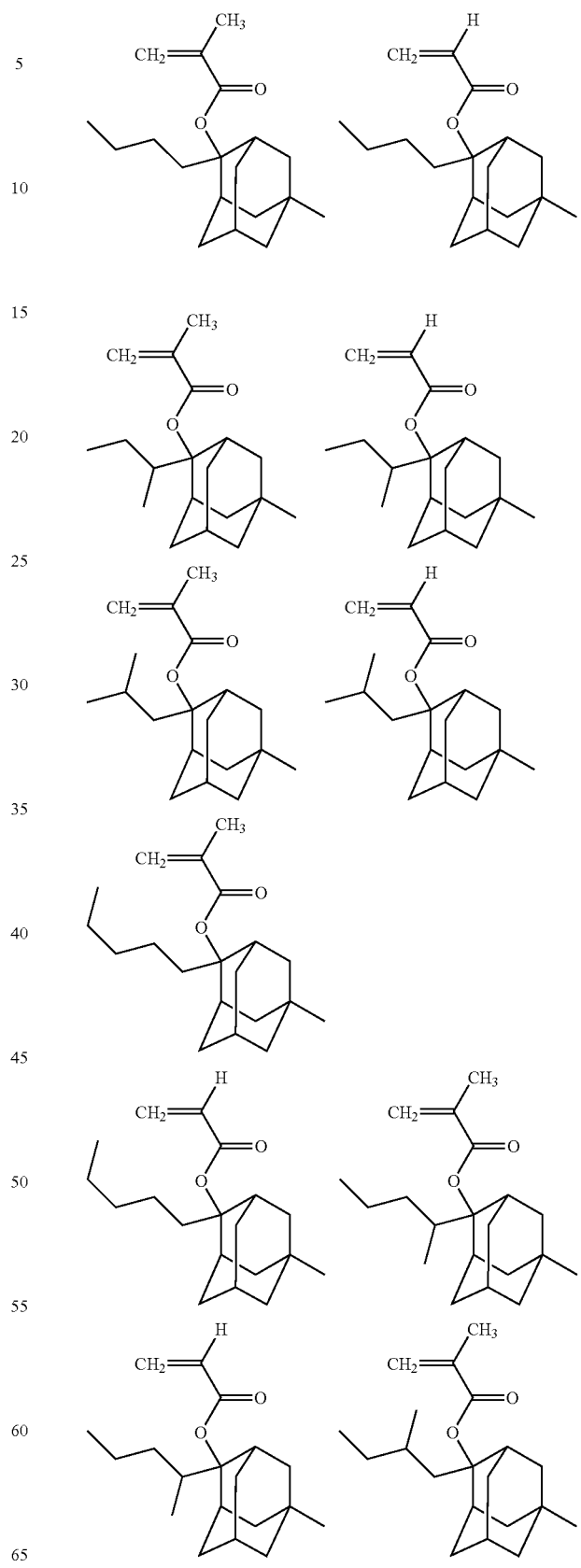

-continued
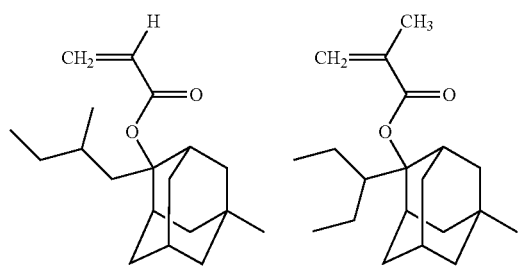
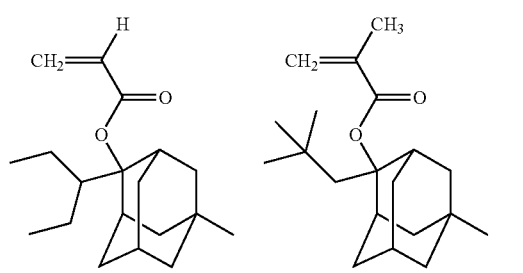
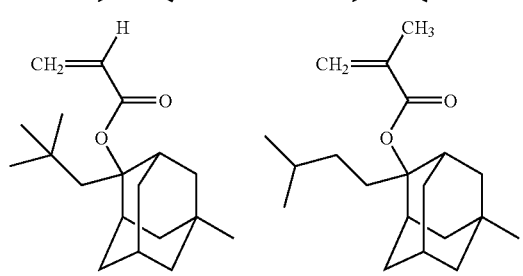
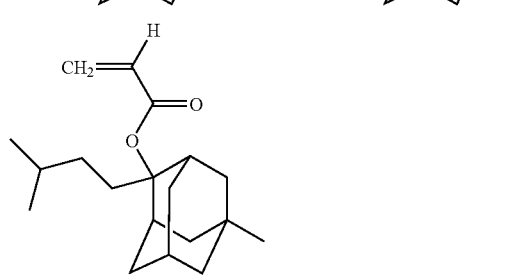
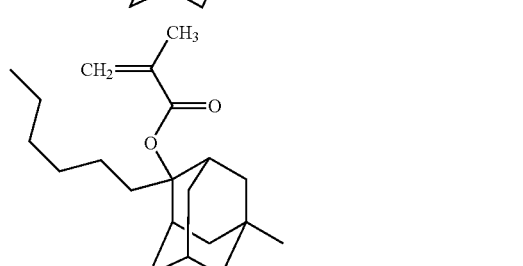
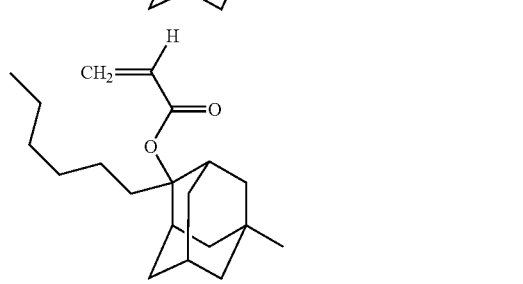
-continued
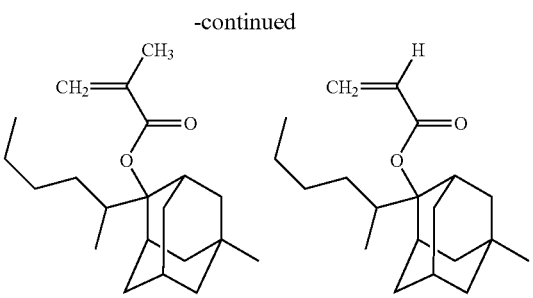
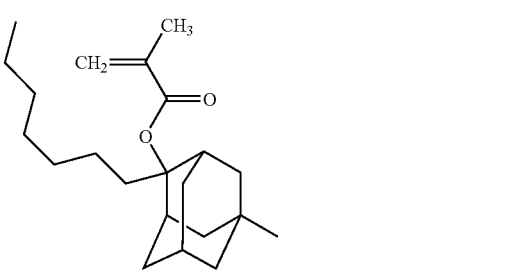
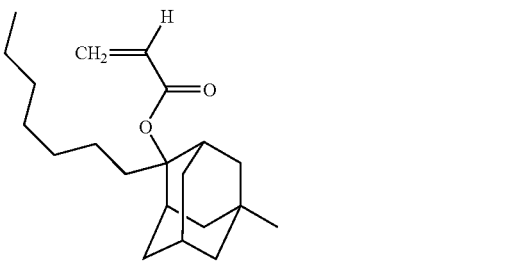
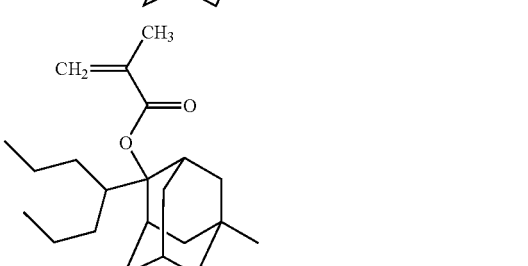
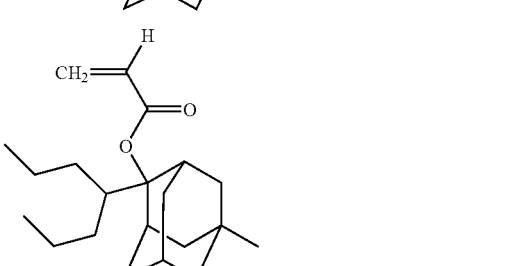
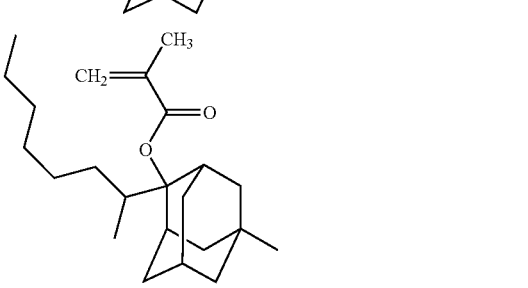

-continued
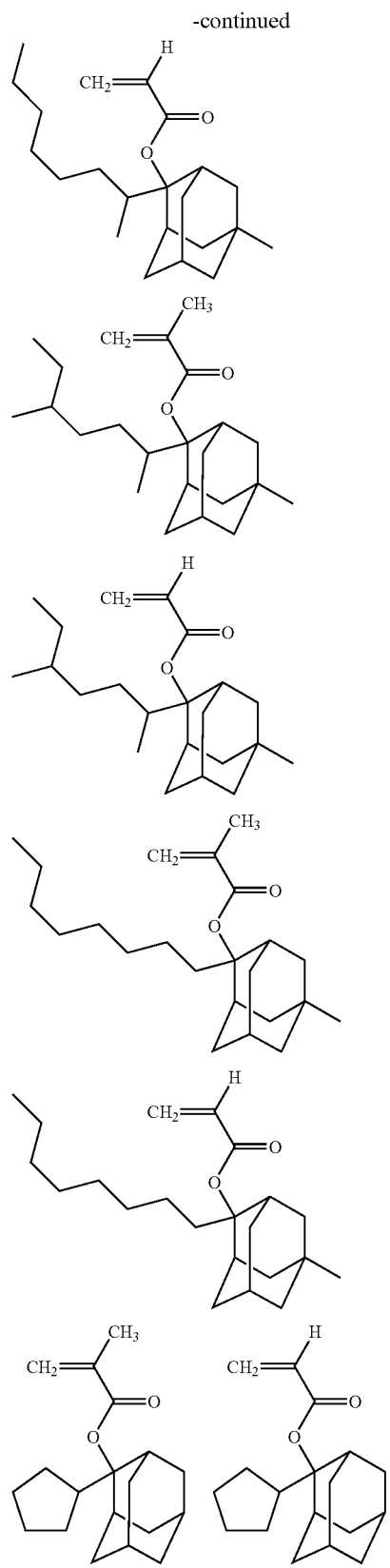
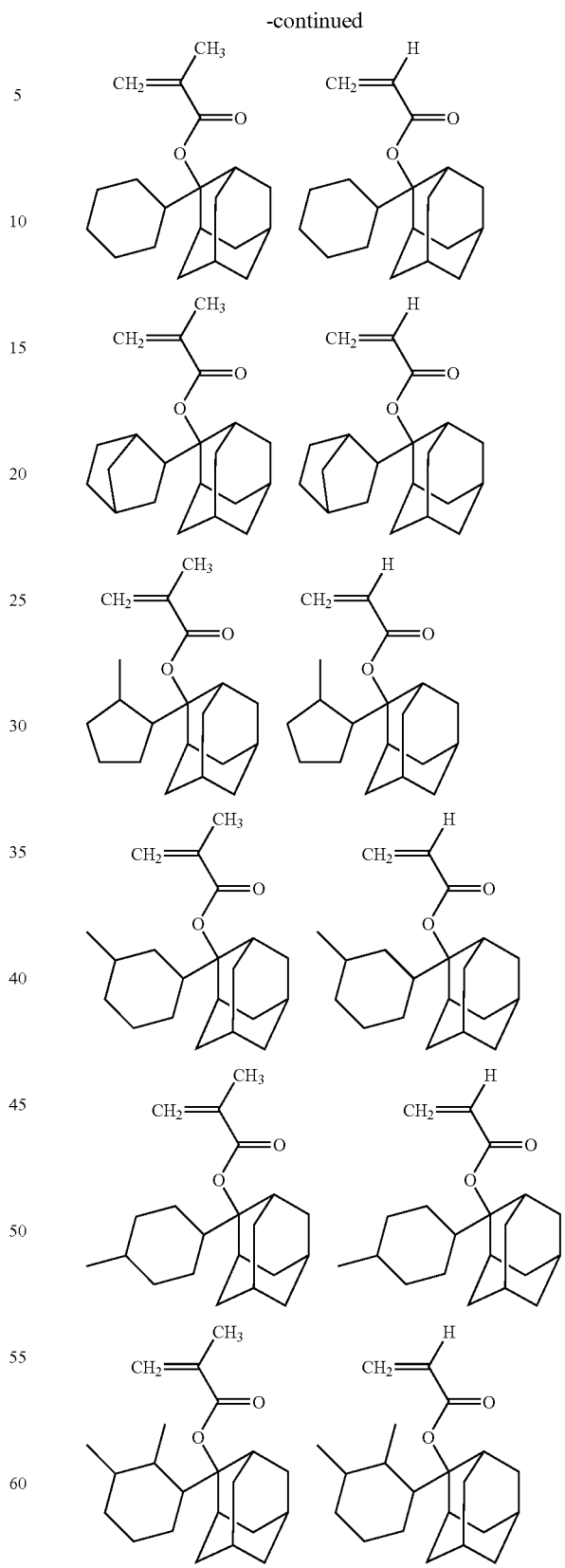

-continued
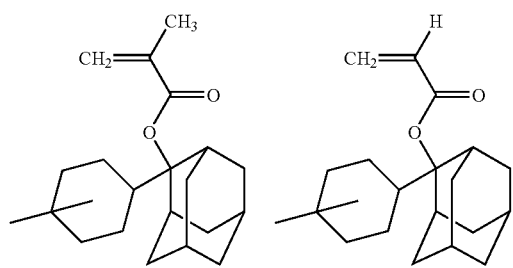
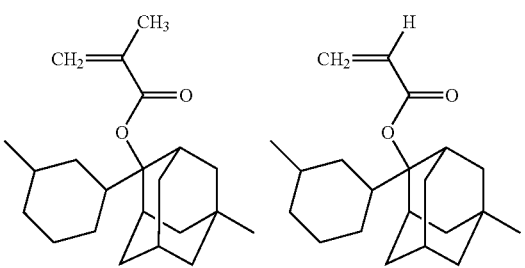
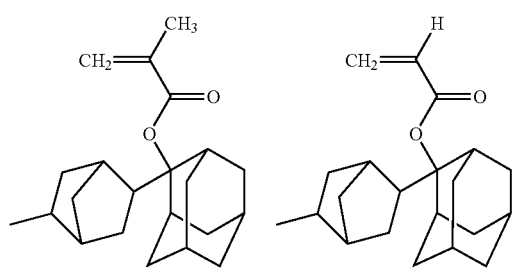
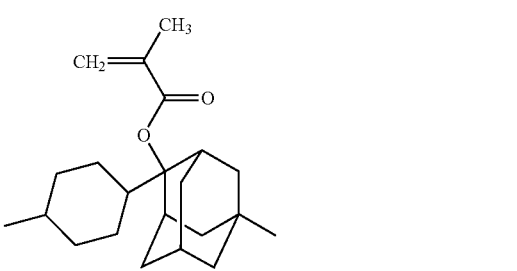
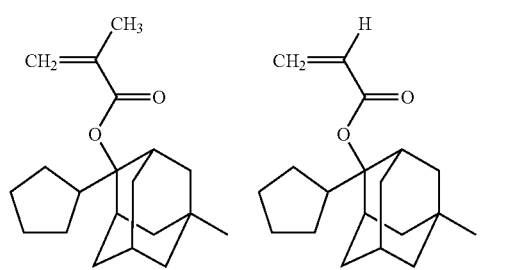
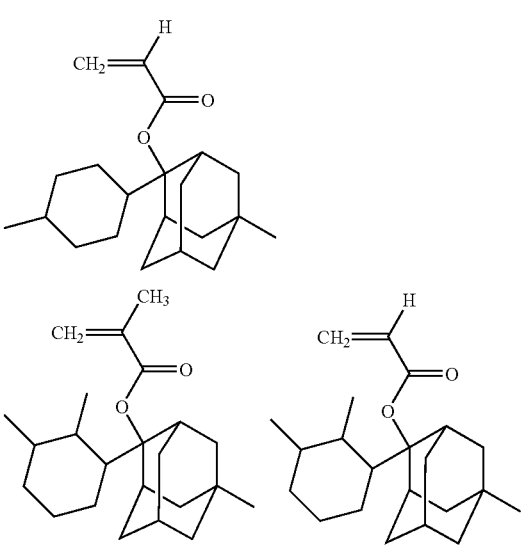
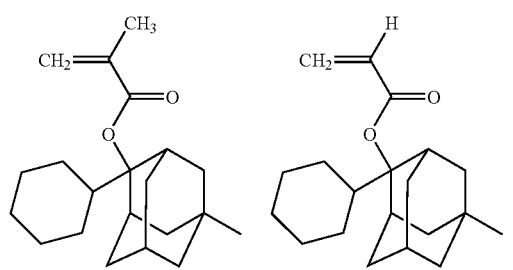
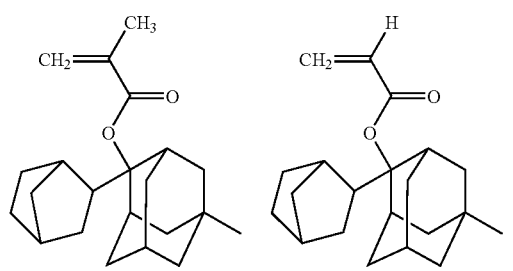
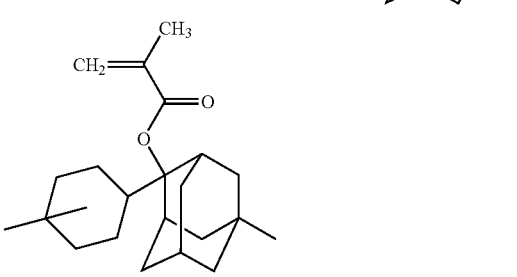
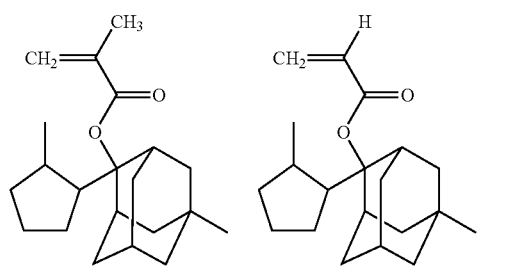
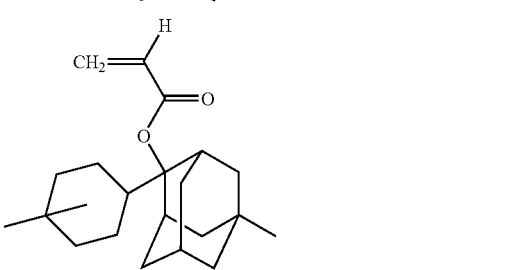

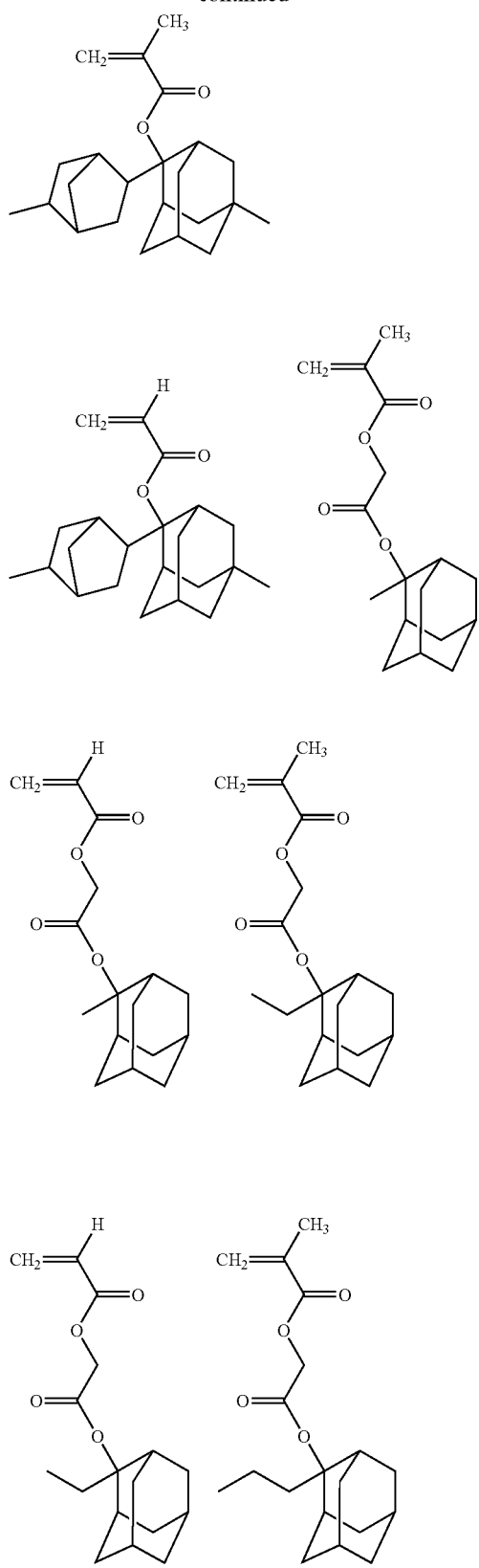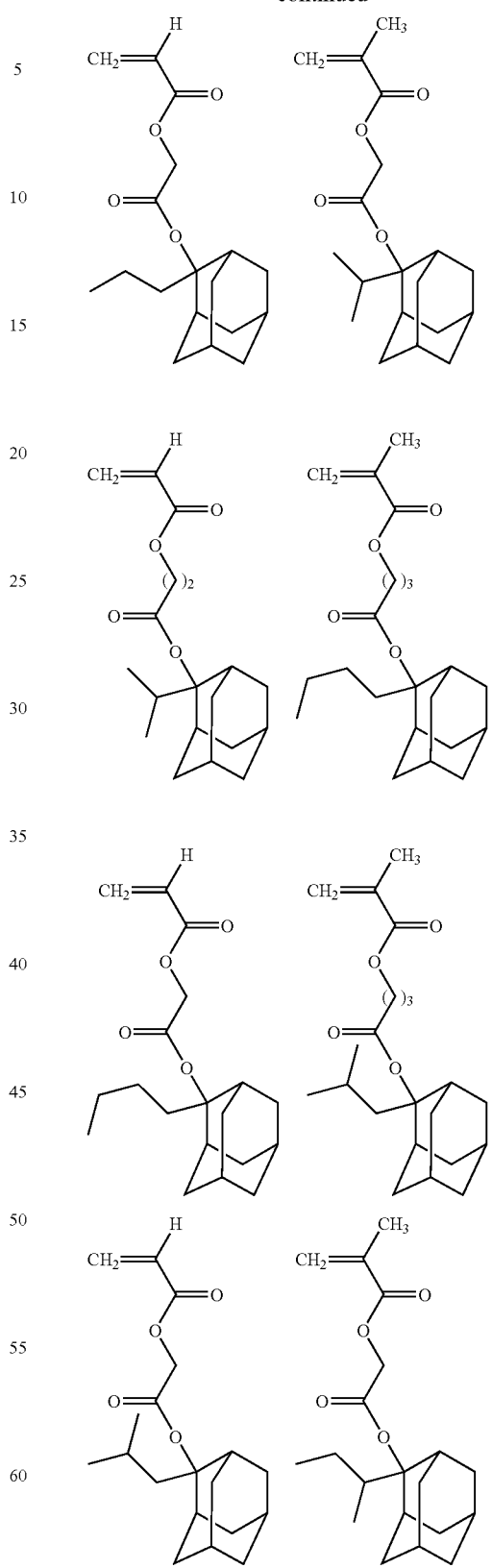

-continued
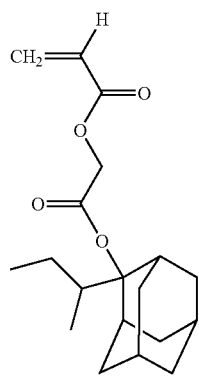 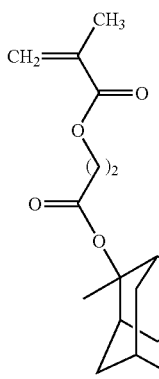 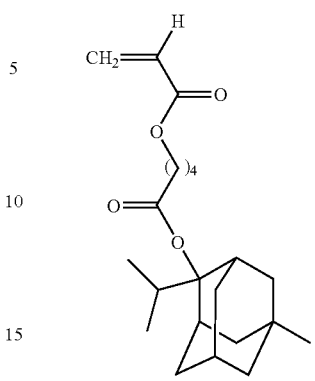 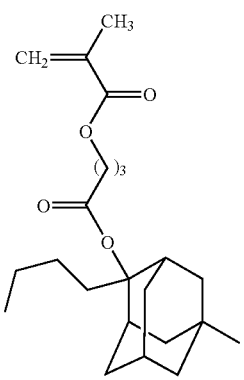
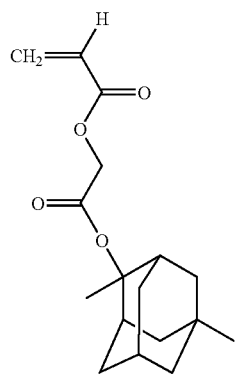 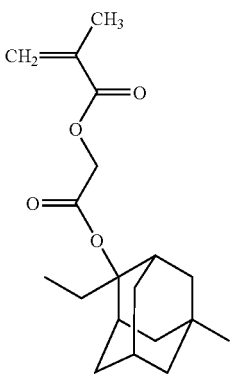 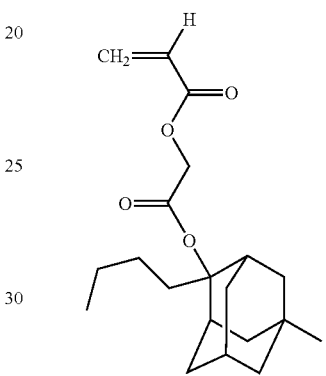 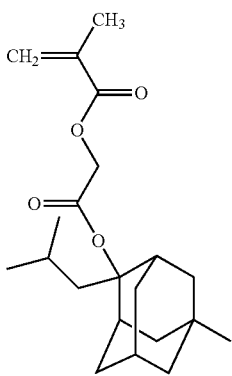
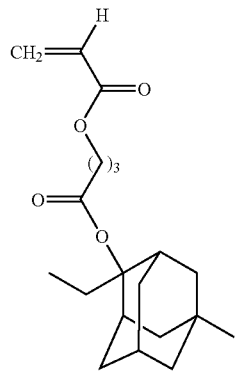 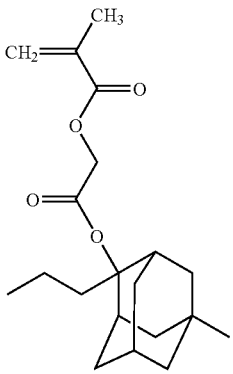 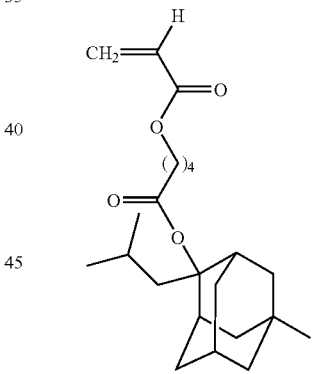 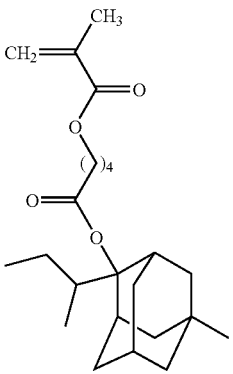
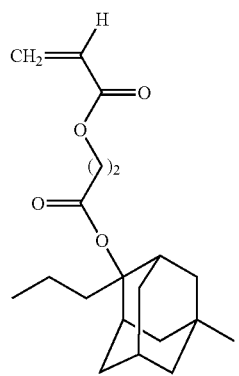 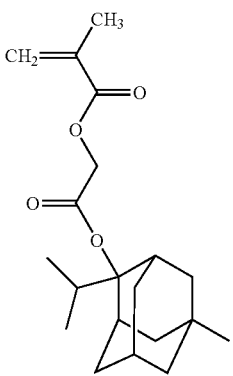 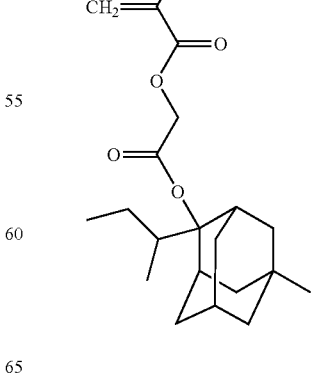 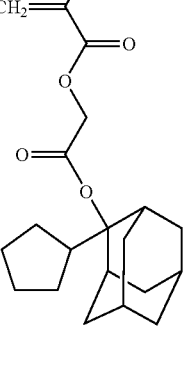

-continued
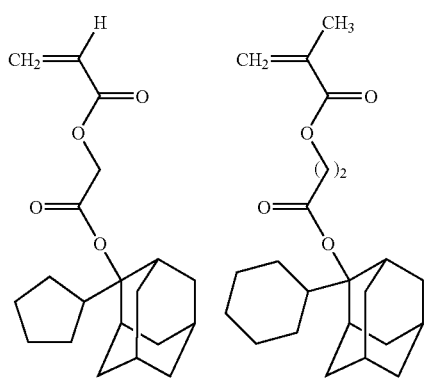
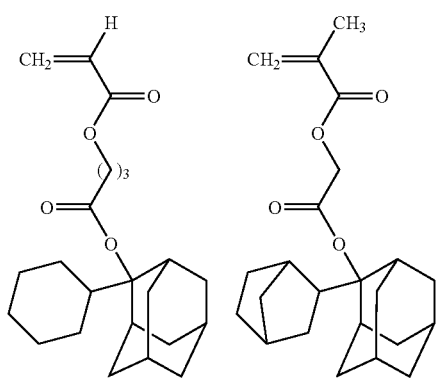
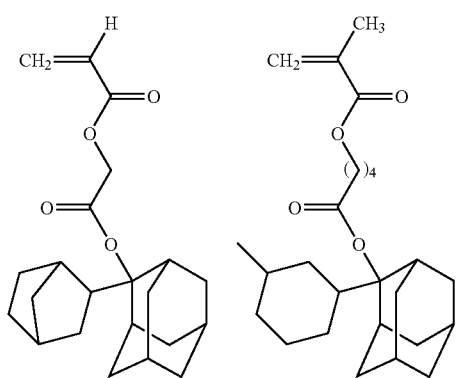
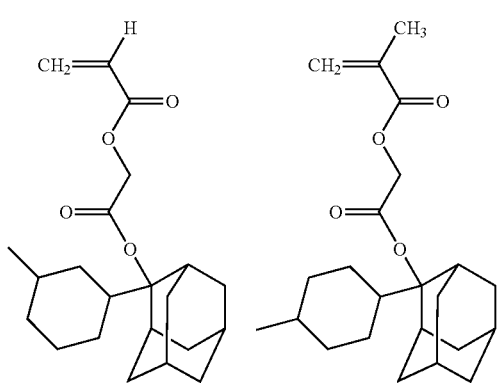
-continued
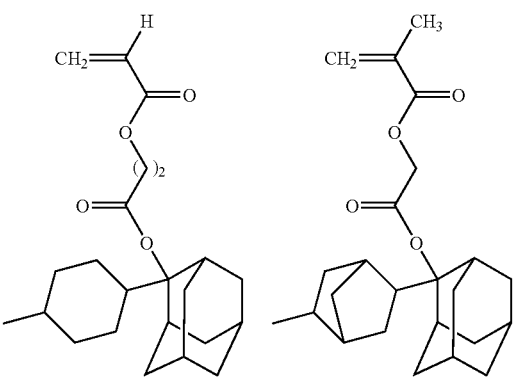
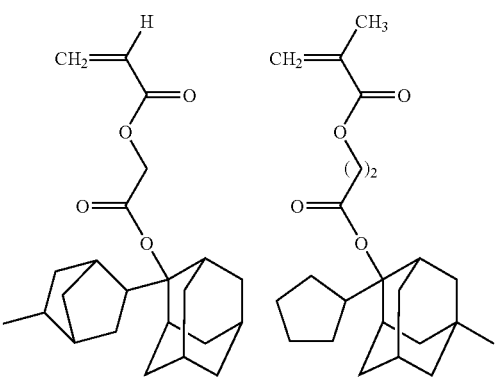
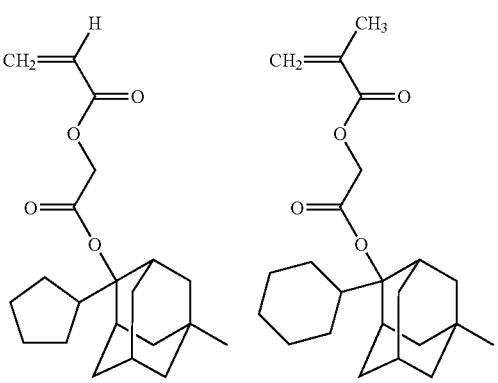
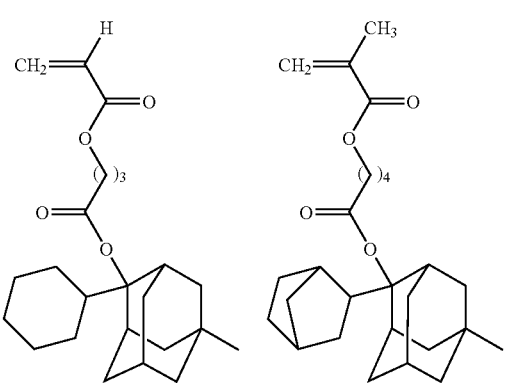

-continued
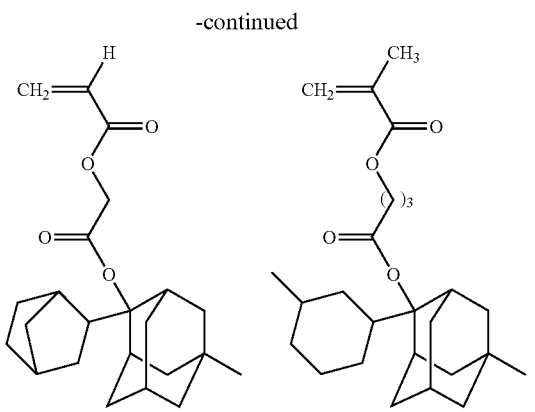
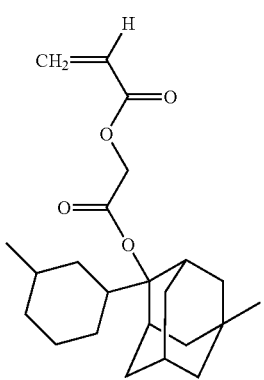
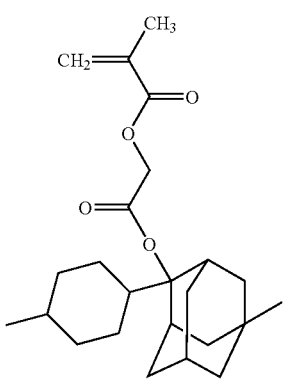
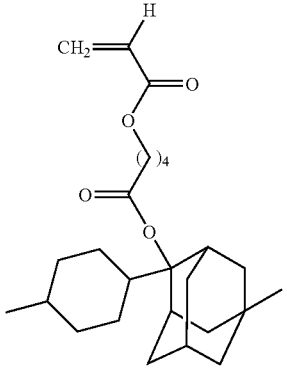
-continued
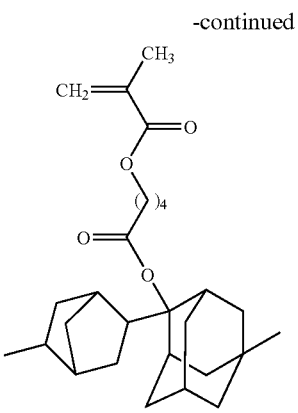
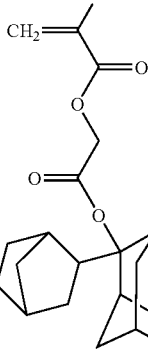
The structural unit represented by the formula (IVb) is derived from the monomer represented by the formula (IVb-1):
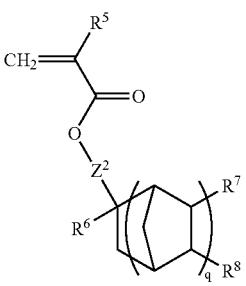
(IVb-1)
wherein $R^5$, $R^6$, $R^7$, $R^8$, $Z^2$ and q are the same as defined above.
Specific examples of the monomer represented by the formula (IVb-1) include the followings.
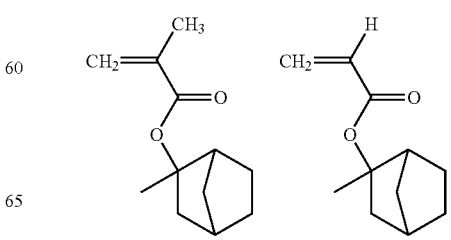

-continued
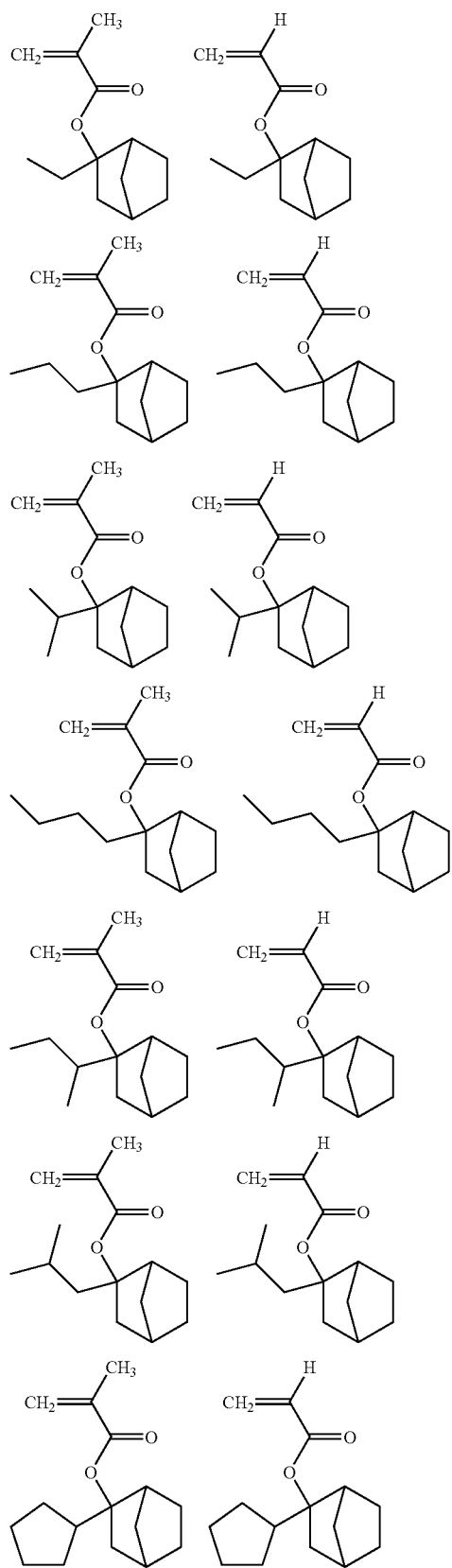
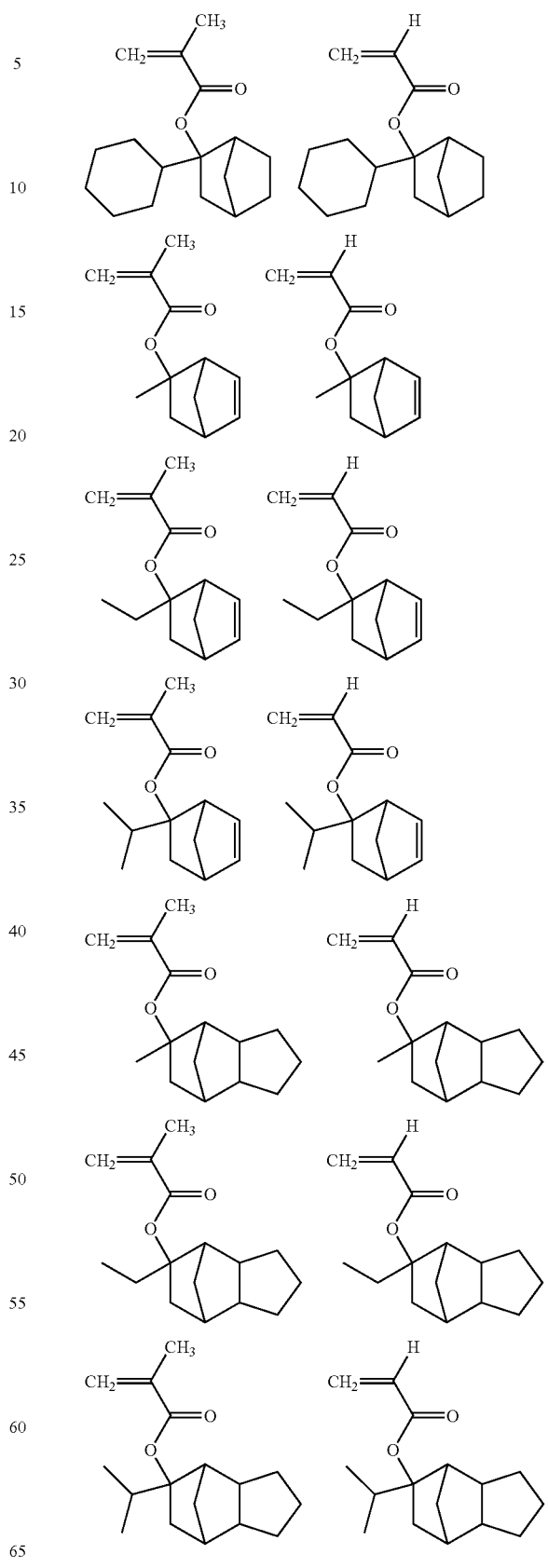

-continued
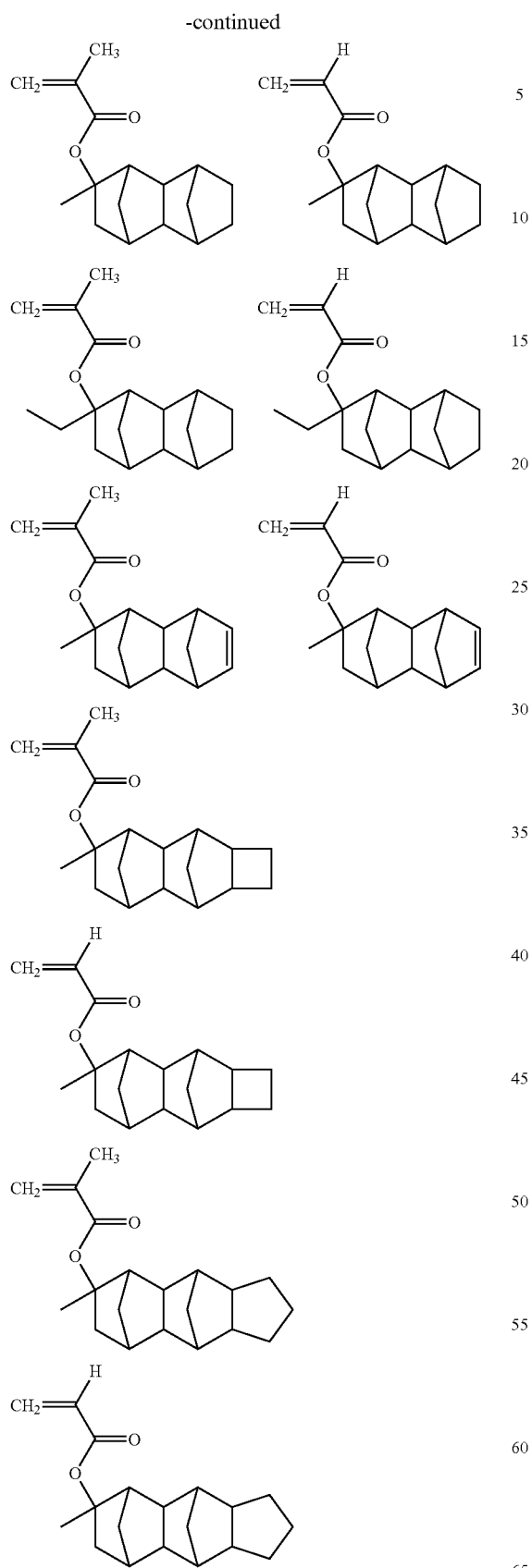
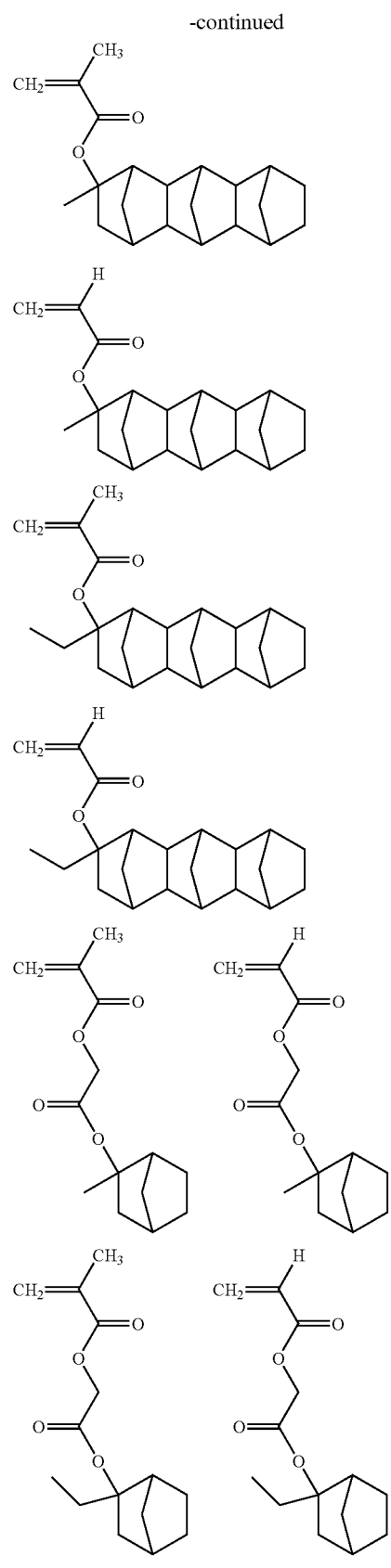

-continued
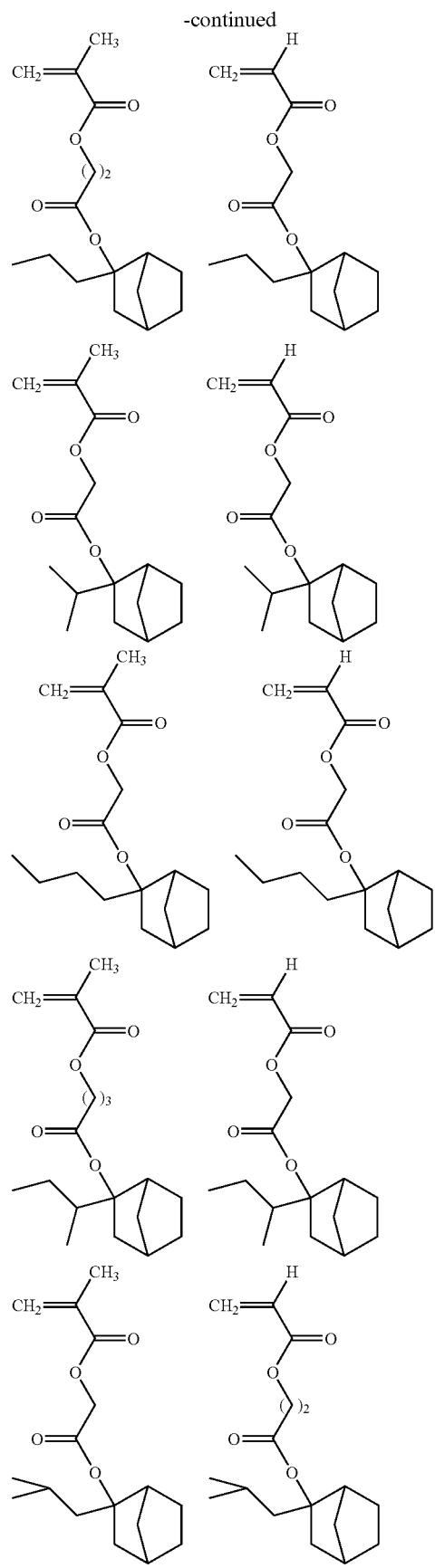
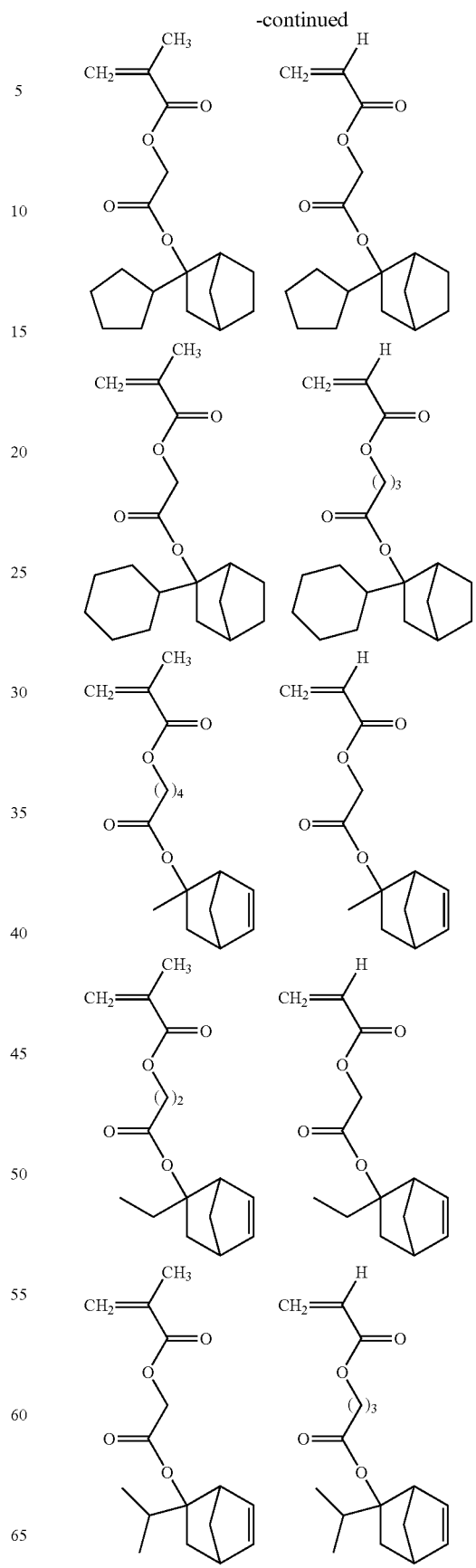

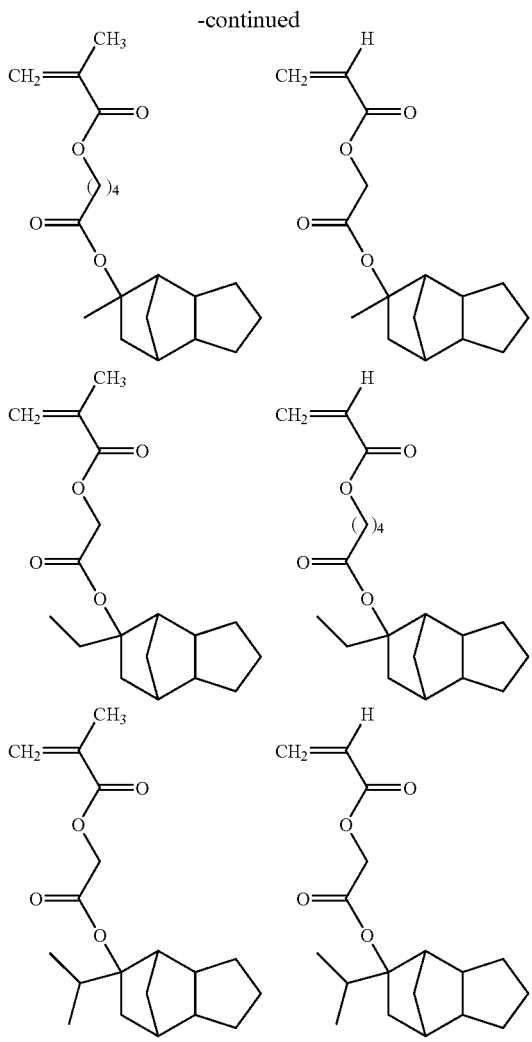

As the structural unit having an acid-labile group, the structural unit represented by the formula (IXa) or (IXb):

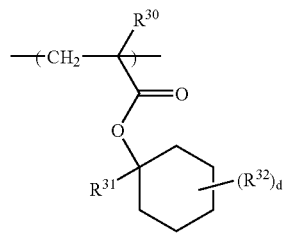

(IXa)

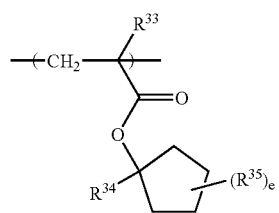

(IXb)

wherein $R^{30}$ represents a hydrogen atom or a methyl group, $R^{31}$ represents a C1-C8 alkyl group, $R^{32}$ represents a C1-C8 alkyl group or a C1-C8 alkoxy group, d represents an integer of 0 to 3, and when d is 2 or 3, $R^{32}$s may be the same or different, $R^{33}$ represents a hydrogen atom or a methyl group, $R^{34}$ represents a C1-C8 alkyl group, $R^{35}$ represents a C1-C8 alkyl group or a C1-C8 alkoxy group, e represents an integer of 0 to 3, and when e is 2 or 3, $R^{35}$s may be the same or different, is also preferable.

Examples of the C1-C8 alkyl group include a methyl, ethyl, n-propyl, isopropyl, n-butyl, isobutyl, sec-butyl, tert-butyl, n-pentyl and n-hexyl group, and the C1-C4 alkyl group is preferable. Examples of the C1-C8 alkoxy group include a methoxy, ethoxy, n-propoxy, isopropoxy, n-butoxy, isobutoxy, sec-butoxy, tert-butoxy, n-pentyloxy and n-hexyloxy group, and the C1-C4 alkoxy group is preferable.

The structural unit represented by the formulae (IXa) is derived from the monomer represented by the formula (IXa-1):

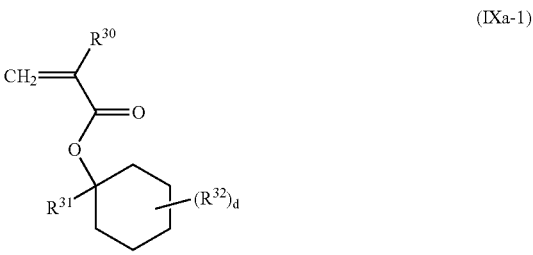

(IXa-1)

wherein $R^{30}$, $R^{31}$, $R^{32}$ and d are the same as defined above, and the structural unit represented by the formula (IXb) is derived from the monomer represented by the formula (IXb-1).

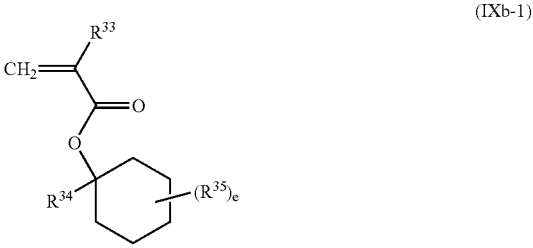

(IXb-1)

wherein $R^{33}$, $R^{34}$, $R^{35}$ and e are the same as defined above.

Examples of the monomers represented by the formulae (IXa-1) and (IXb-1) include the followings.

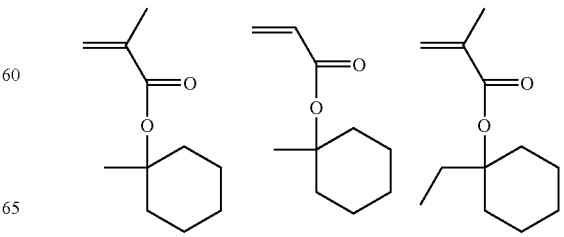

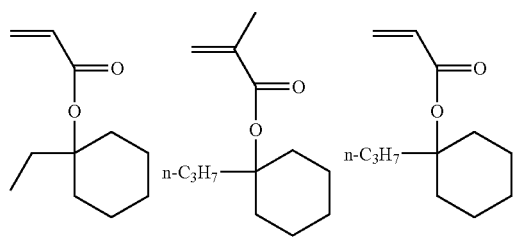
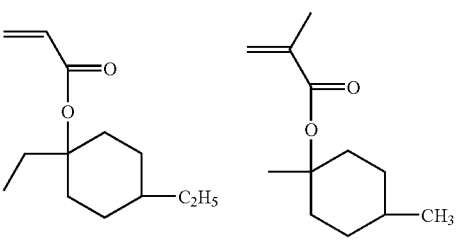
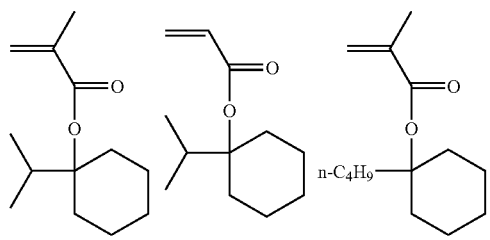
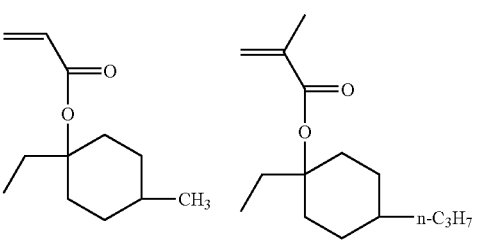
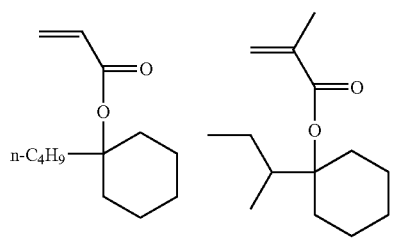
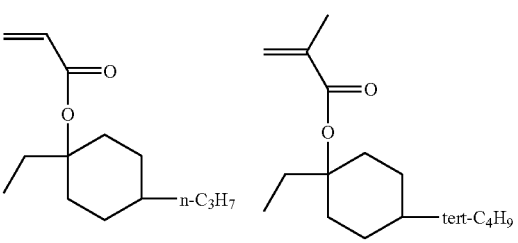
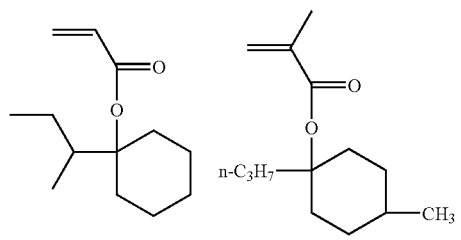
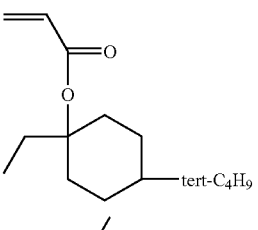
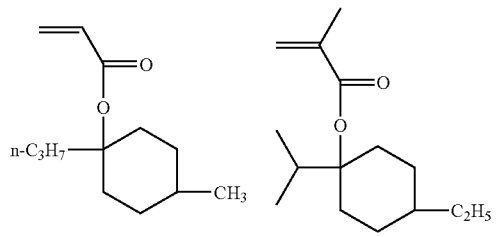
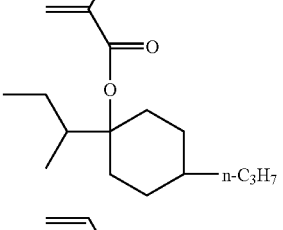
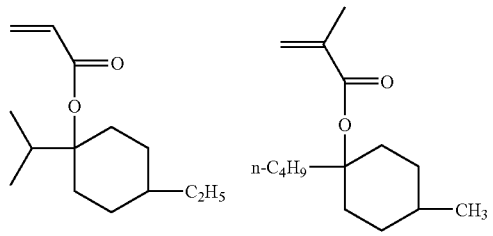
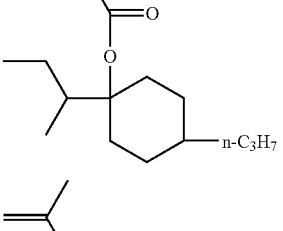
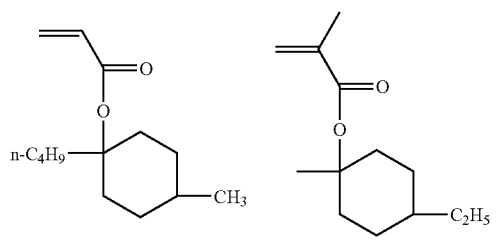
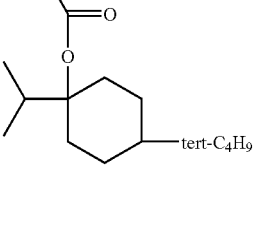

-continued
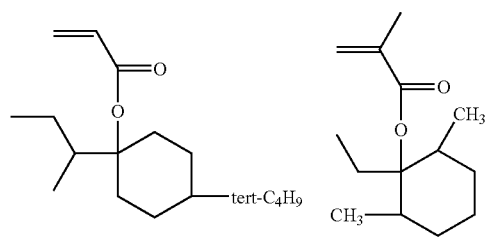
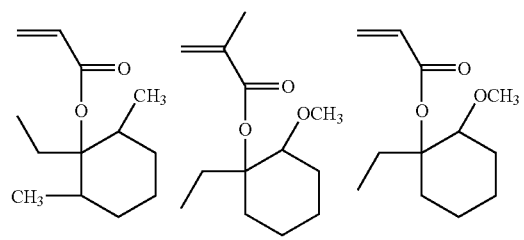
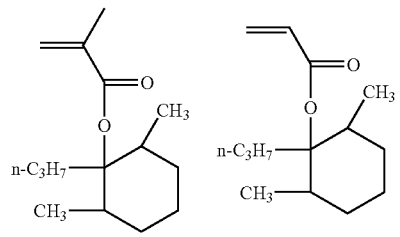
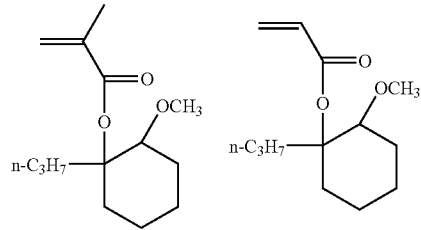
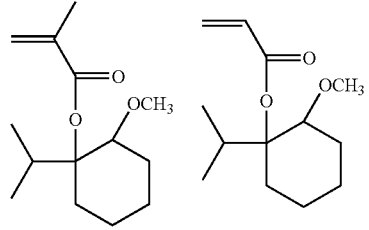
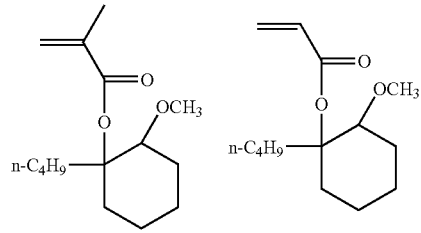
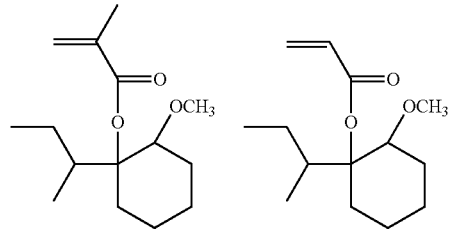
-continued
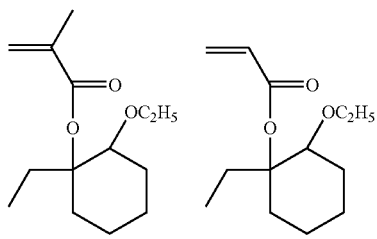
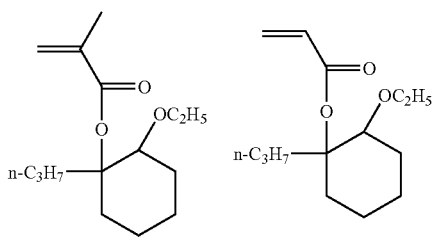
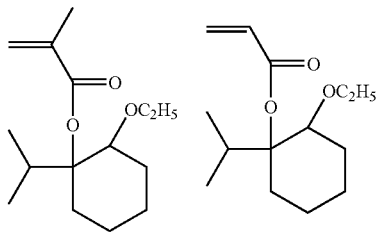
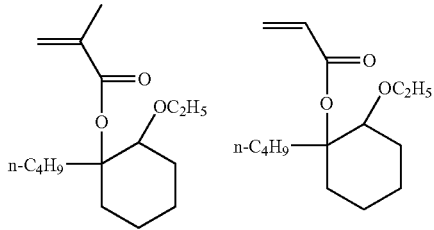
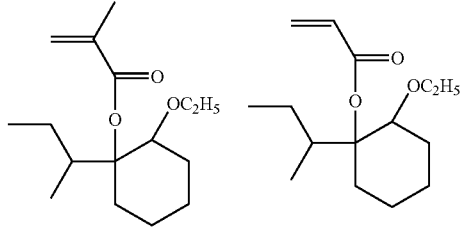
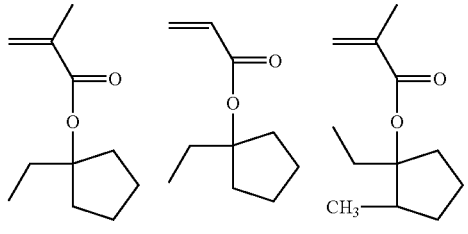
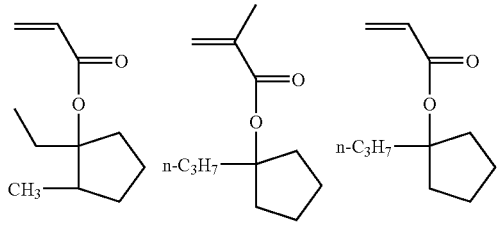

-continued
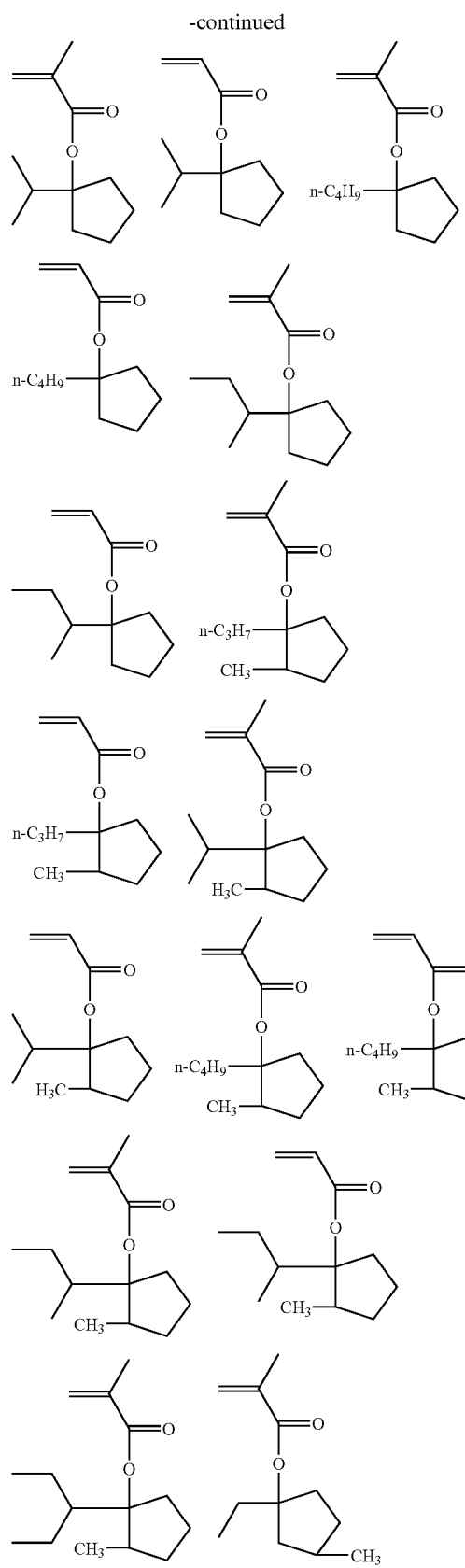
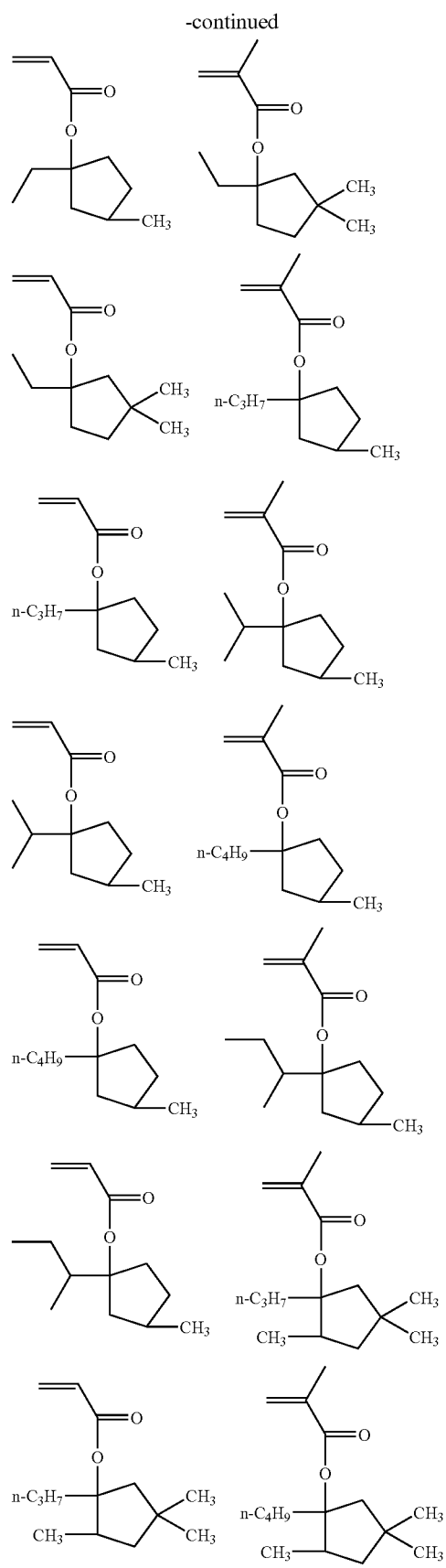

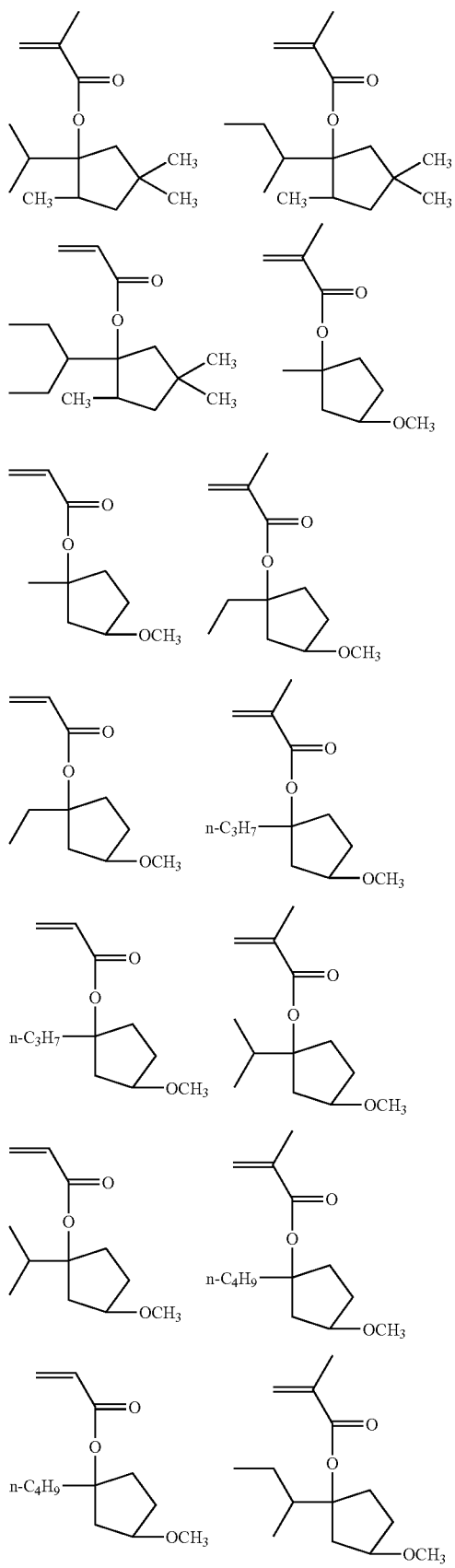
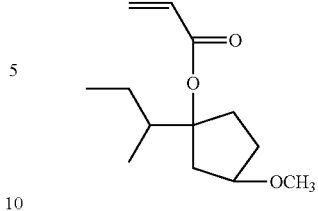

RESIN may contain one structural unit having an acid-labile group and may contain two or more kinds of structural units having an acid-labile group.

It is preferred that RESIN has the structural unit selected from the structural unit represented by the formula (IVa) as the structural unit having an acid-labile group in viewpoint of the dry etching resistance of RESIN. When the structural unit represented by the formula (IVa) is particularly the structural unit derived from 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate or 2-isopropyl-2-adamantyl methacrylate, composition having excellent sensitivity and heat resistance tends to be obtained.

It is also preferred that RESIN has the structural units represented by the formulae (IVa) and (IXa) as the structural unit having an acid-labile group in viewpoint of the line edge roughness.

The monomer represented by the formula (IVa-1) can usually be produced by a reaction of the corresponding adamantanol or metal salt thereof with an acrylic halide or methacrylic halide. The monomer represented by the formula (IVb-1) can usually be produced by a reaction of the corresponding alcohol compound or metal salt thereof with an acrylic halide or methacrylic halide. The monomer represented by the formula (IXa-1) can usually be produced by a reaction of the corresponding cyclohexanol or metal salt thereof with an acrylic halide or methacrylic halide. The monomer represented by the formula (IXb-1) can usually be produced by a reaction of the corresponding cyclopentanol or metal salt thereof with an acrylic halide or methacrylic halide.

Next, the structural unit represented by the formula (I) will be illustrated.

In the formula (I), $R^1$ represents a hydrogen atom or a methyl group, ring X represents a C3-C30 cyclic hydrocarbon group in which one —$CH_2$— is substituted with —COO—. At least one hydrogen atom in the C3-C30 cyclic hydrocarbon group may be substituted, and examples of the substituent include a C1-C6 alkyl group, a carboxyl group and a cyano group.

The ring X may be a monocyclic hydrocarbon group and may be a polycyclic hydrocarbon group.

As the structural unit represented by the formula (I), the following formula (VIa), (VIb) or (VIc):

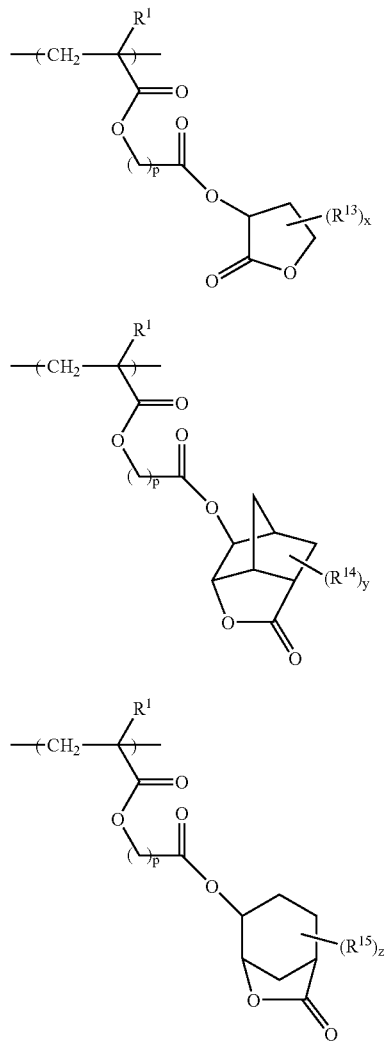

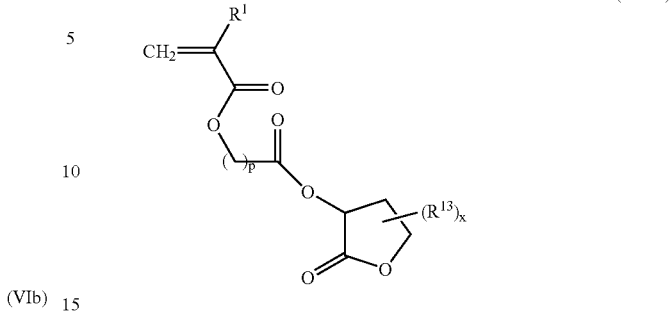

wherein $R^1$, $R^{13}$, x and p are the same as defined above.

Examples of the monomer represented by the formula (VIa-1) include the followings.

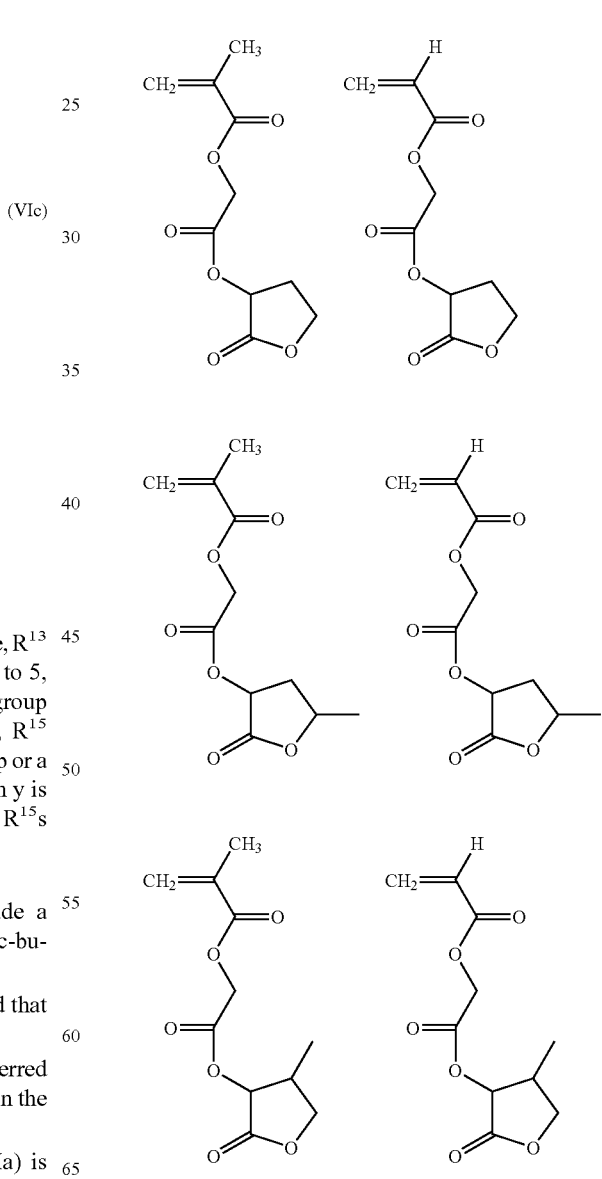

wherein $R^1$ and p are the same meanings as defined above, $R^{13}$ represents a methyl group, x represents an integer of 0 to 5, $R^{14}$ represents a C1-C4 hydrocarbon group, a carboxyl group or a cyano group, y represents an integer of 0 to 3, $R^{15}$ represents a C1-C4 hydrocarbon group, a carboxyl group or a cyano group, z represents an integer of 0 to 3, and when y is 2 or 3, $R^{14}$s may be the same or different, when z is 2 or 3, $R^{15}$s may be the same or different, is preferable.

Examples of the C1-C4 hydrocarbon group include a methyl, ethyl, n-propyl, isopropyl, n-butyl, isobutyl, sec-butyl and tert-butyl group.

It is preferred that p is 1 or 2, and it is more preferred that p is 1.

It is preferred that x is 0 in the formula (VIa). It is preferred that y is 0 in the formula (VIb). It is preferred that z is 0 in the formula (VIc).

The structural unit represented by the formula (VIa) is derived from the monomer represented by the formula (VIa-1):

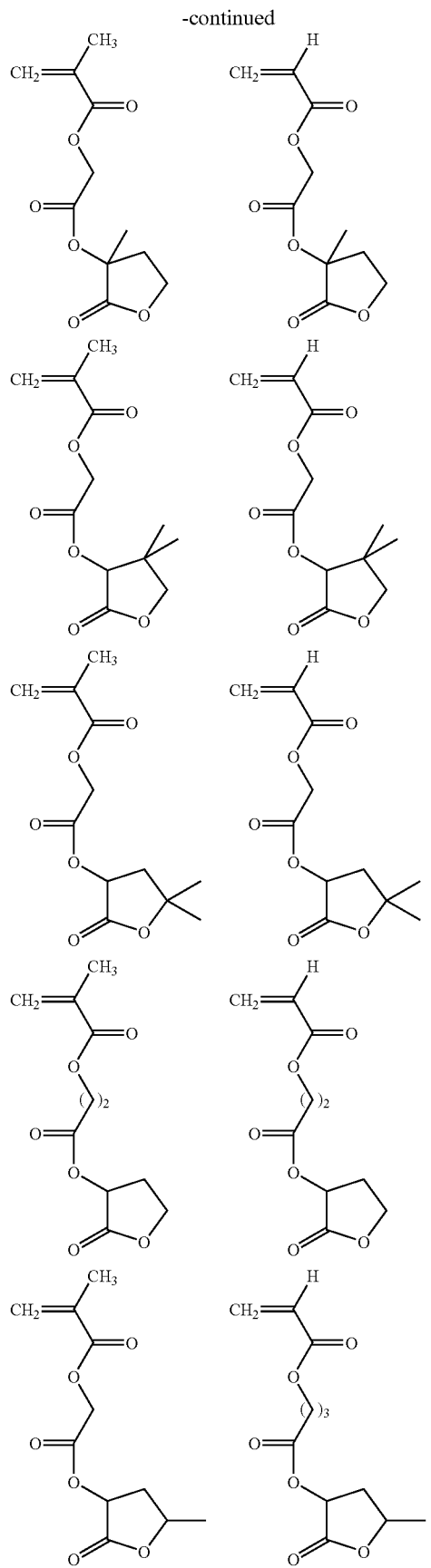
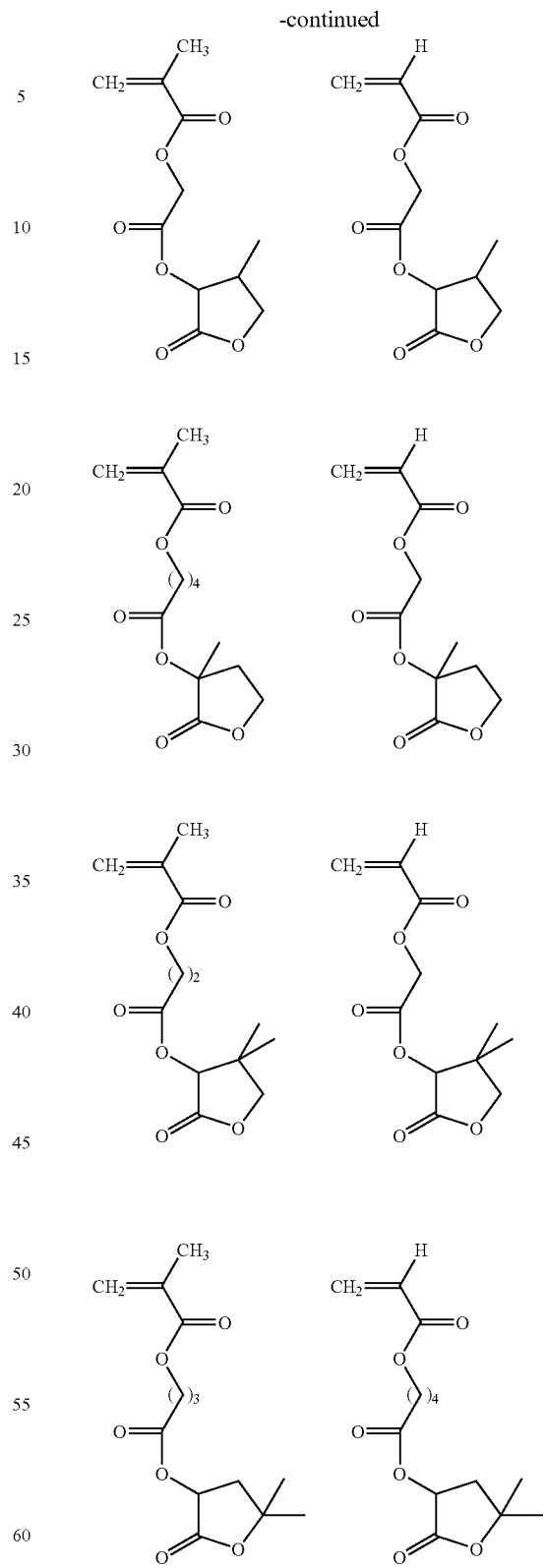
The structural unit represented by the formula (VIb) is derived from the monomer represented by the formula (VIb-1):

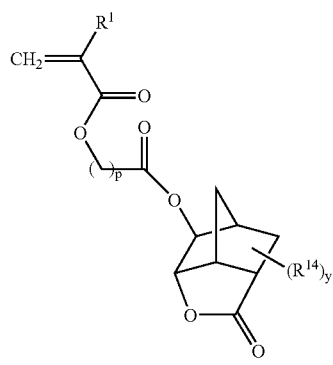
(VIb-1)
wherein $R^1$, $R^{14}$, y and p are the same as defined above.
Examples of the monomer represented by the formula (VIb-1) include the followings.
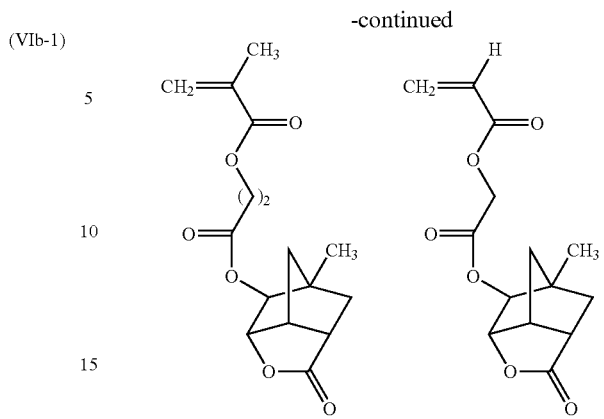
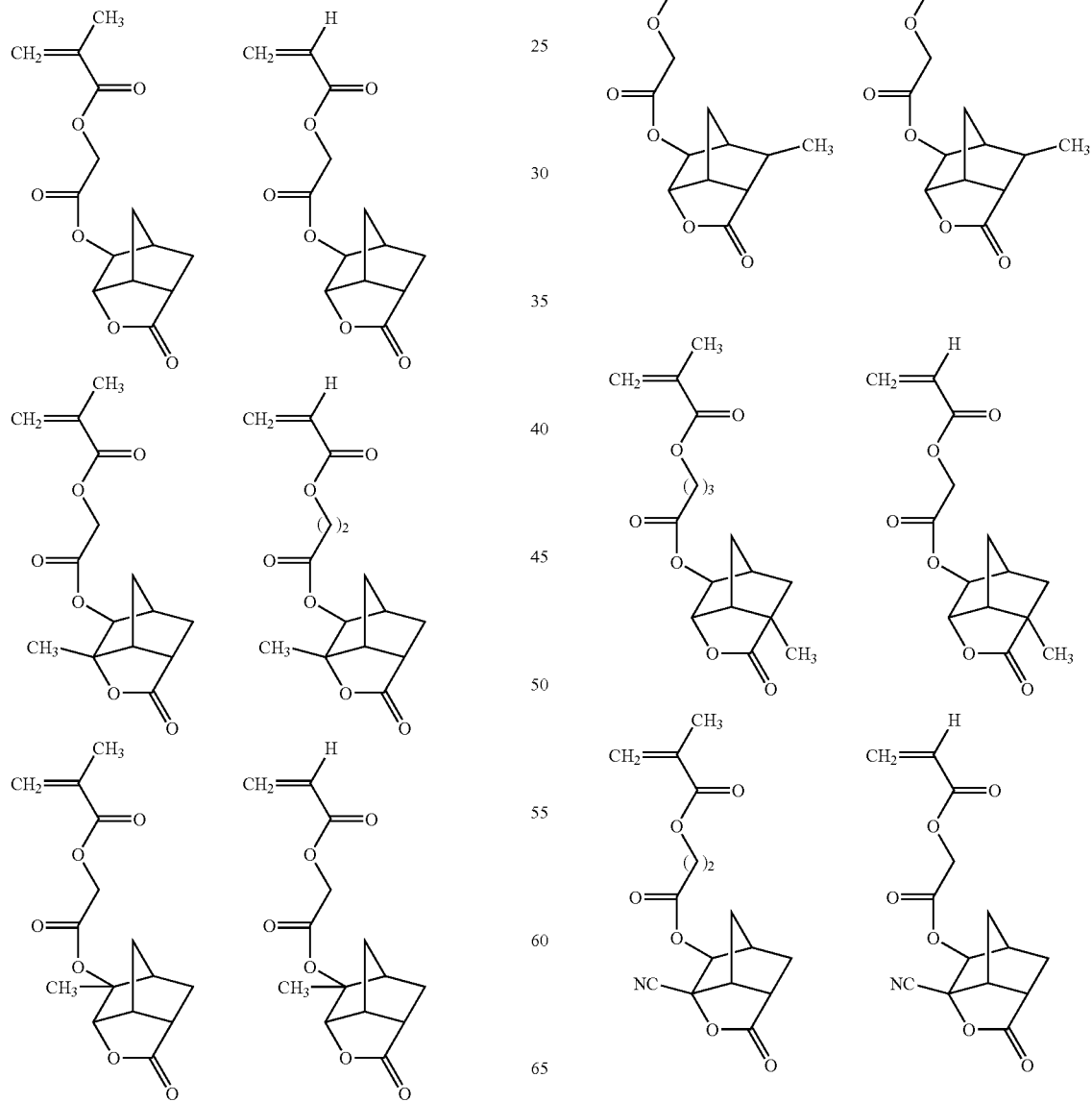

-continued
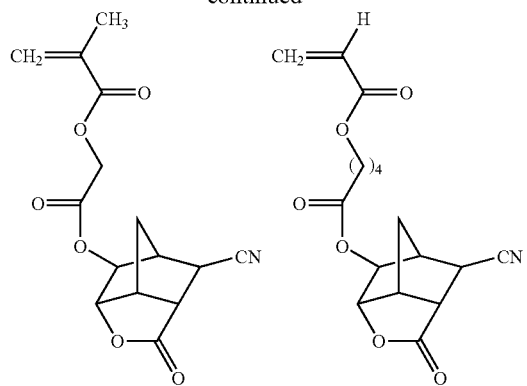
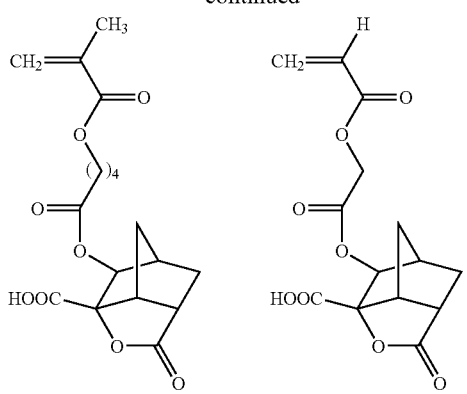
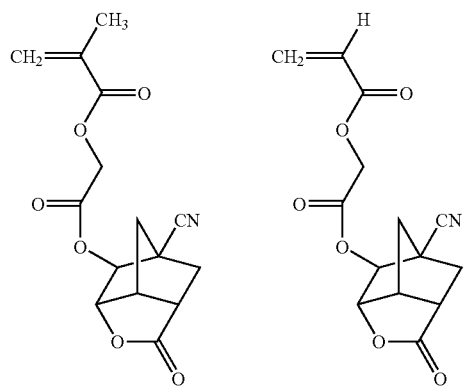
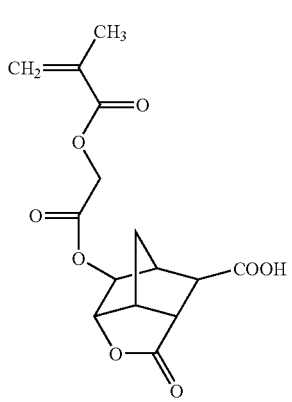
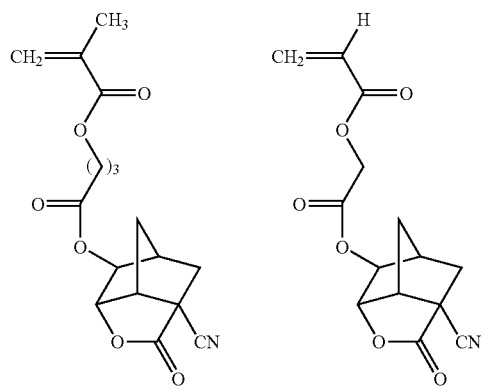
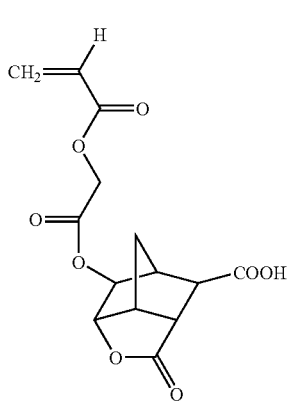
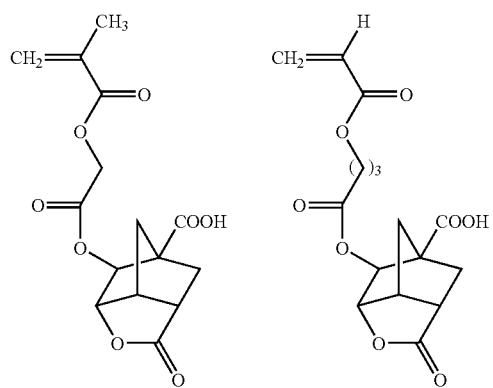
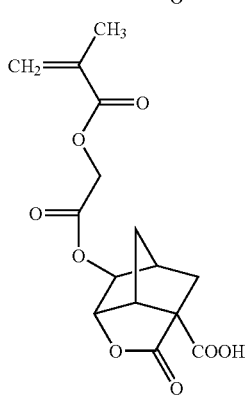

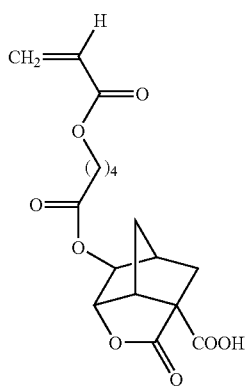
The structural unit represented by the formula (VIc) is derived from the monomer represented by the formula (VIc-1):
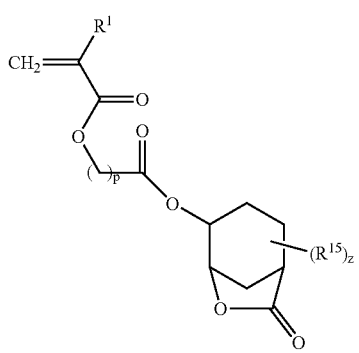
wherein $R^1$, $R^{15}$, z and p are the same as defined above.
Examples of the monomer represented by the formula (VIc-1) include the followings.
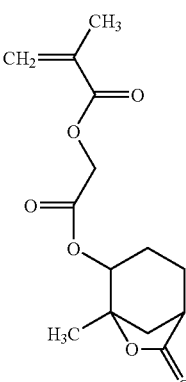 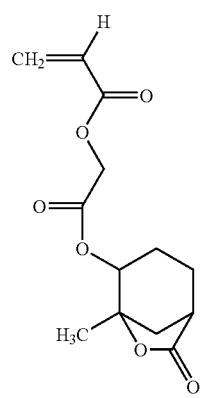
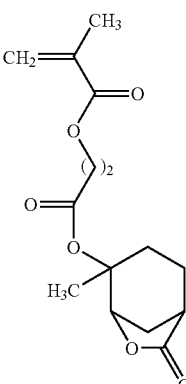 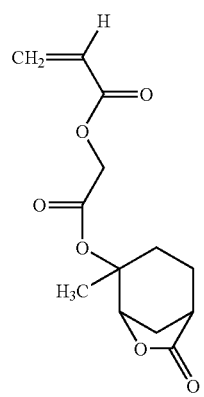
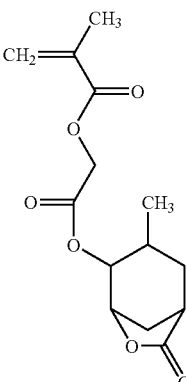 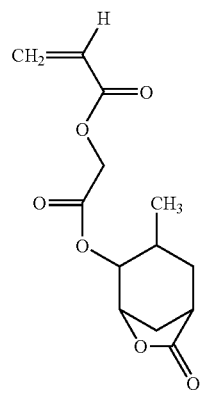
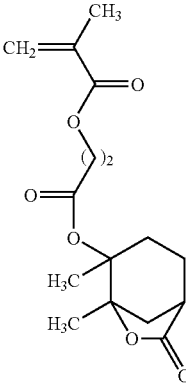 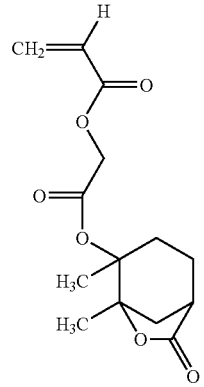

-continued

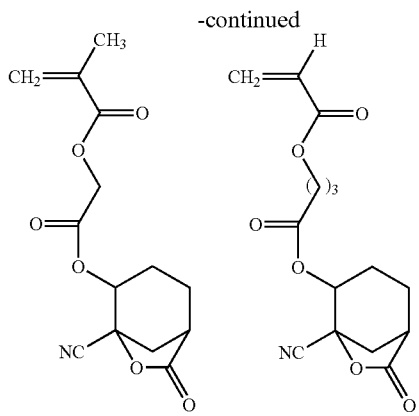

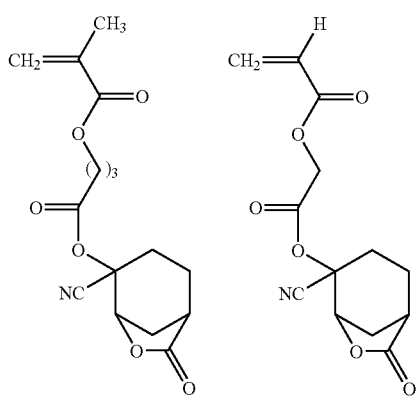

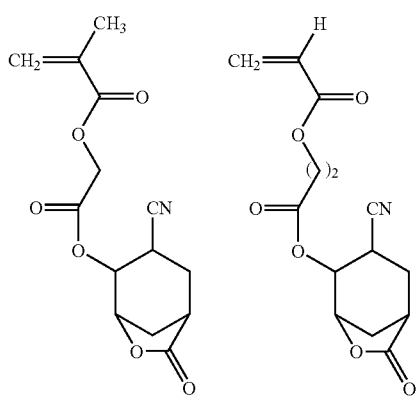

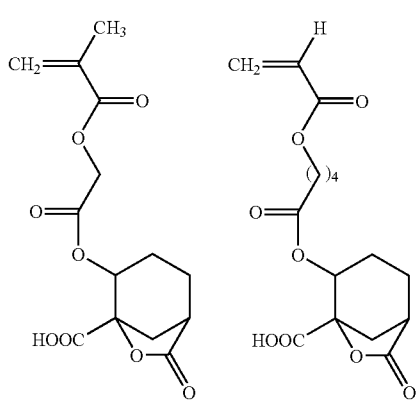

-continued

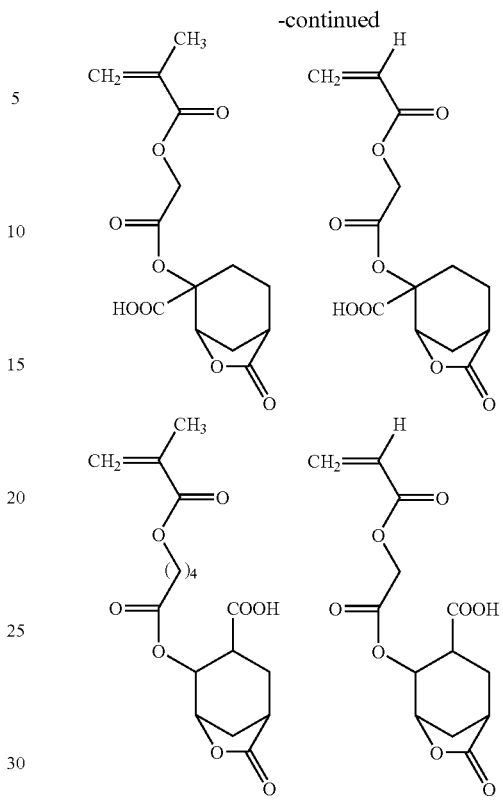

As the structural unit represented by the formula (I), the structural unit represented by the formula (VIb) is preferable, and the following structural units:

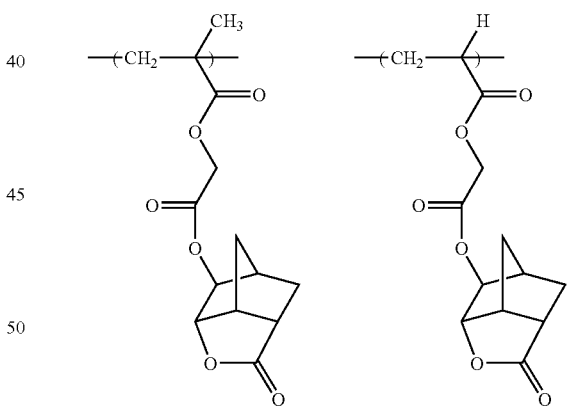

are more preferable in viewpoint of the resist pattern obtained after lithography process.

The molar ratio of the structural unit having an acid-labile group in RESIN is usually 20 to 95% based on sum molar of the structural unit having an acid-labile group and the structural unit represented by the formula (I) in RESIN and the molar ratio of the structural unit represented by the formula (I) in RESIN is usually 5 to 80% based on sum molar of the structural unit having an acid-labile group and the structural unit represented by the formula (I) in RESIN though the ratio varies depending on the kind of radiation for patterning exposure, the kind of an acid-labile group, and the like.

RESIN comprises the structural unit having an acid-labile group and the structural unit represented by the formula (I), and itself is insoluble or poorly soluble in an alkali aqueous solution but becomes soluble in an alkali aqueous solution by the action of an acid.

RESIN may contain the other structural unit or units in addition to the structural unit having an acid-labile group and the structural unit represented by the formula (I).

Examples of the other structural unit include a structural unit represented by the formula (V):

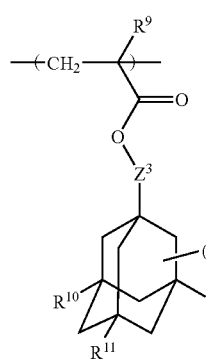

(V)

wherein $R^9$ represents a hydrogen atom or a methyl group, $R^{10}$ and $R^{11}$ each independently represent a hydrogen atom, a methyl group or a hydroxyl group, $R^{12}$ represents a methyl group, t represents an integer of 0 to 12, and $Z^3$ represents a single bond or —$(CH_2)_u$—COO— and u represents an integer of 1 to 4, a structural unit represented by the formula (X):

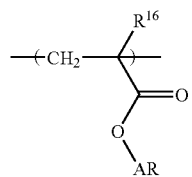

(X)

wherein $R^{16}$ represents a hydrogen atom or a methyl group, and AR represents a C1-C30 fluorine-containing alkyl group which may contain 1 to 5 hydroxyl groups and at least one heteroatom selected from a oxygen, nitrogen and sulfur atom, and a structural unit represented by the formula (XI):

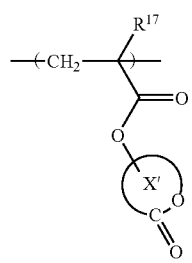

(XI)

wherein $R^{17}$ represents a hydrogen atom or a methyl group, a ring X' represents a C3-C30 cyclic hydrocarbon group in which one —$CH_2$— group is substituted with —COO— group and at least one hydrogen atom in the C3-C30 cyclic hydrocarbon group may be substituted.

RESIN preferably comprises the structural unit represented by the formula (V). RESIN also preferably comprises the structural units represented by the formulae (V) and (XI).

In the formula (V), it is preferred that $R^{10}$ and $R^{11}$ each independently represent a hydrogen atom or a hydroxyl group. Preferably, t is 0 or 1, and more preferably, t is 0. $Z^3$ represents preferably the single bonds or —$CH_2$—COO—.

The structural unit represented by the formula (V) is derived from the monomer represented by the formula (V-1):

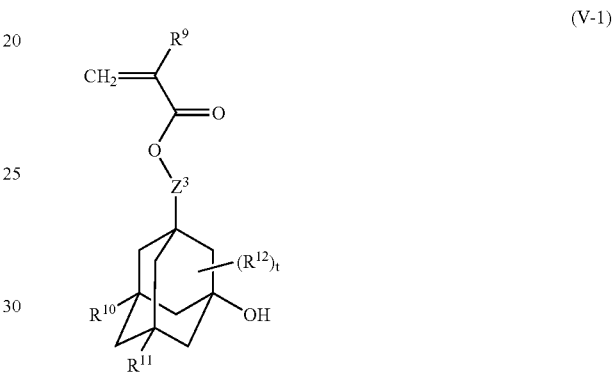

(V-1)

wherein $R^9$, $R^{10}$, $R^{11}$, $R^{12}$, $Z^3$ and t are the same as defined above.

Specific examples of the monomer represented by the formula (V-1) include the followings.

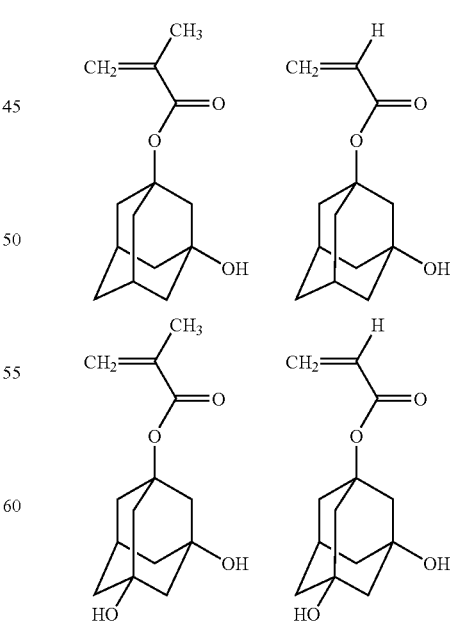

-continued
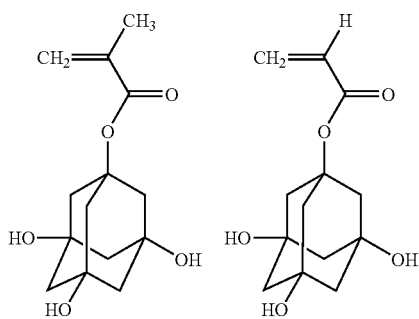
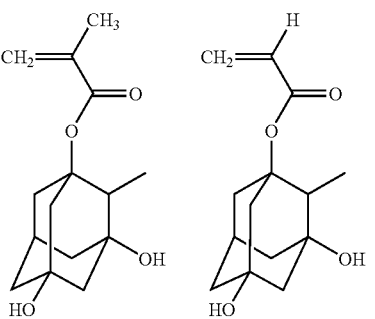
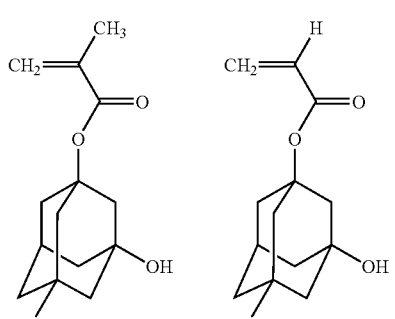
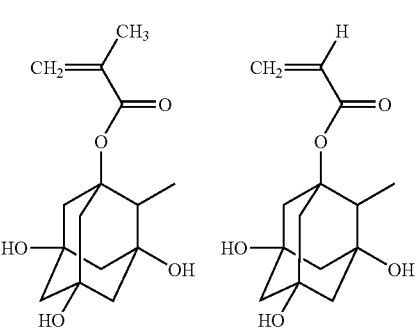
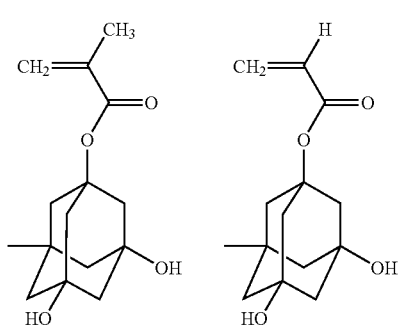
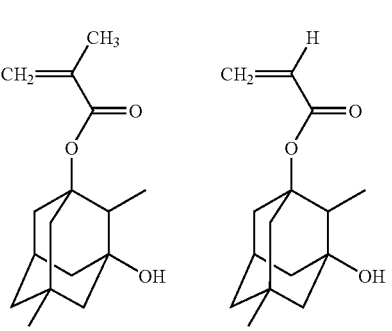
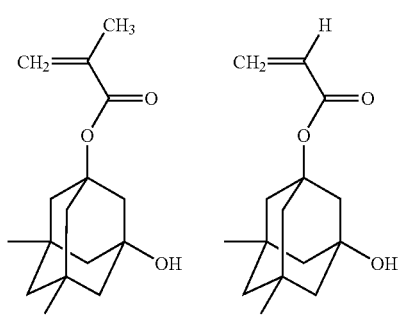
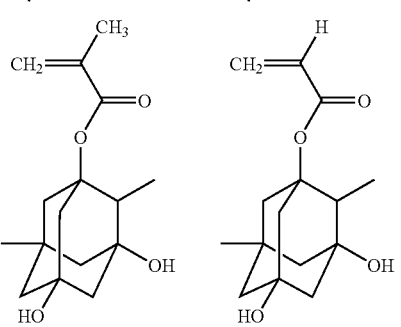
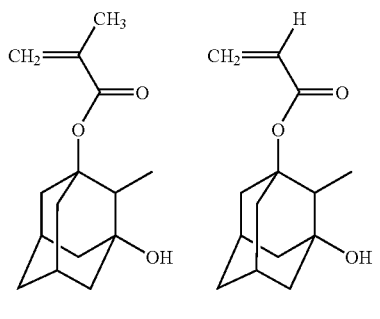
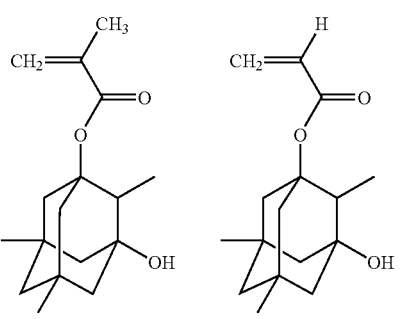

-continued
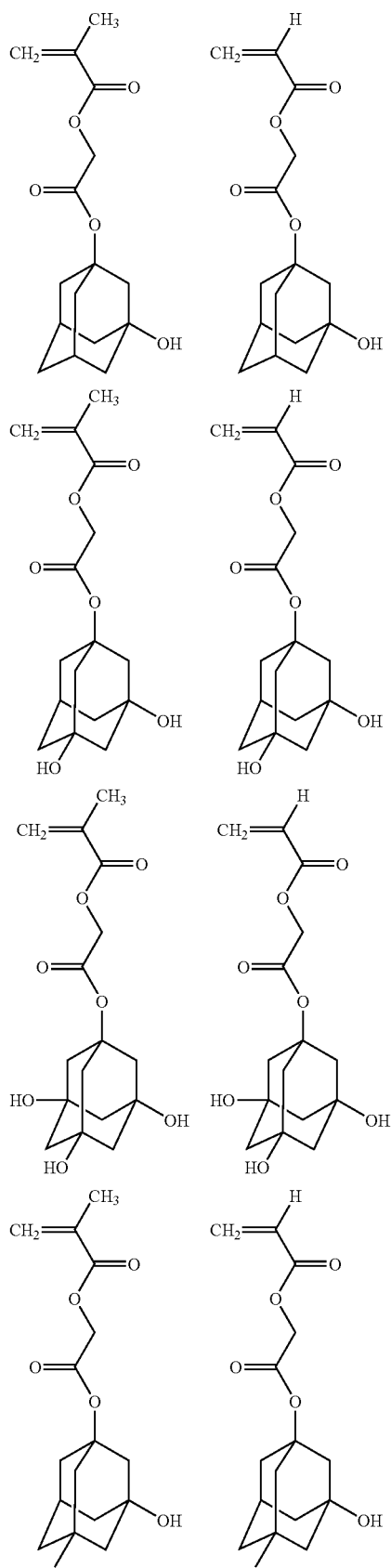
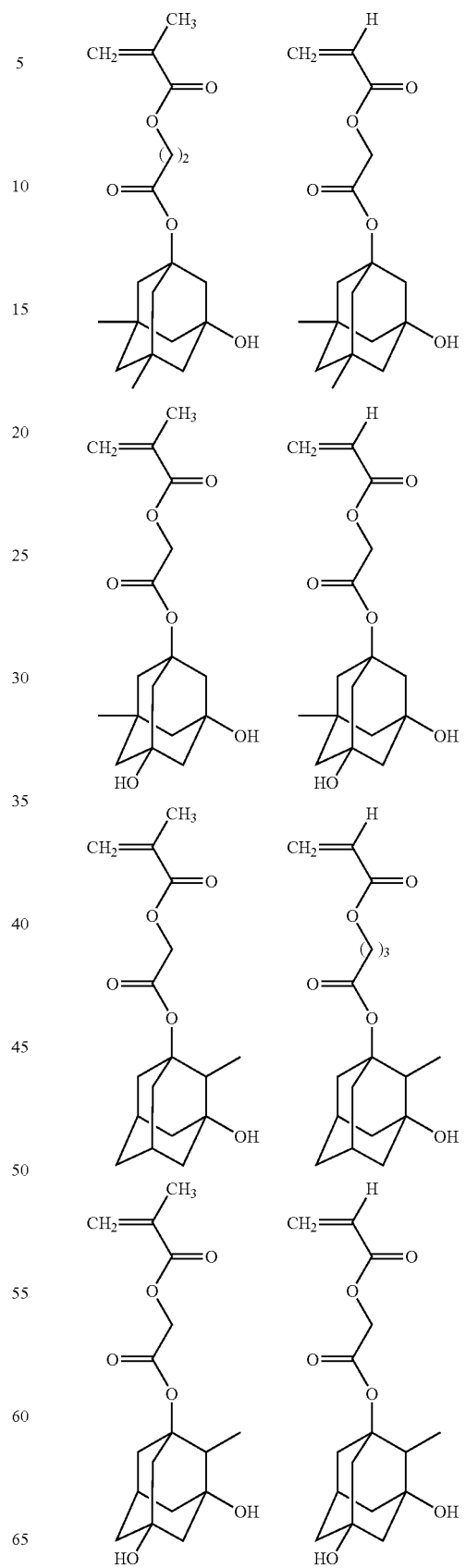

-continued

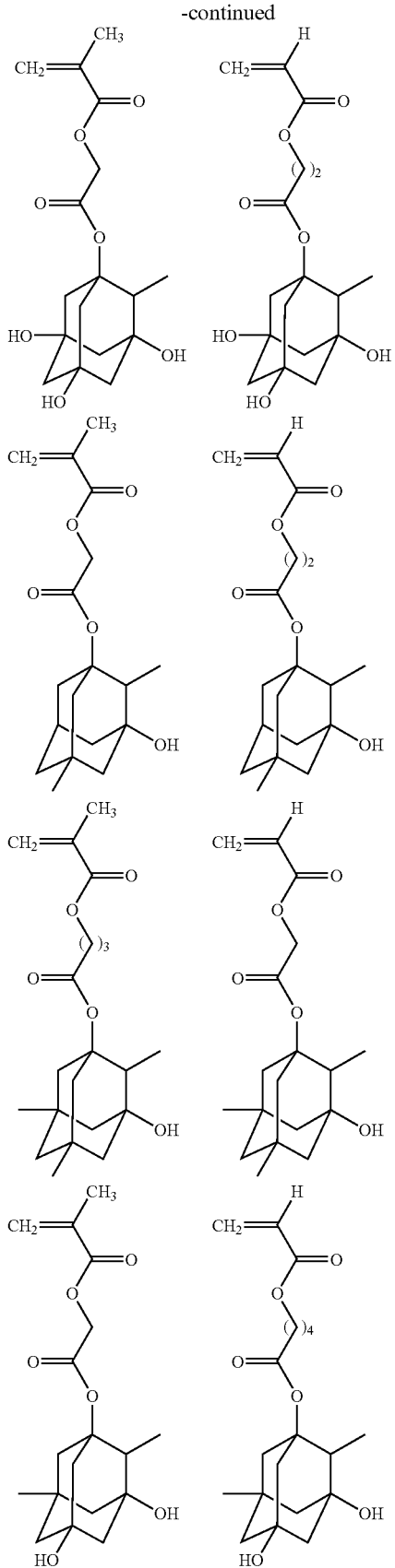

As the structural unit represented by the formula (V), the structural units derived from the following monomers:

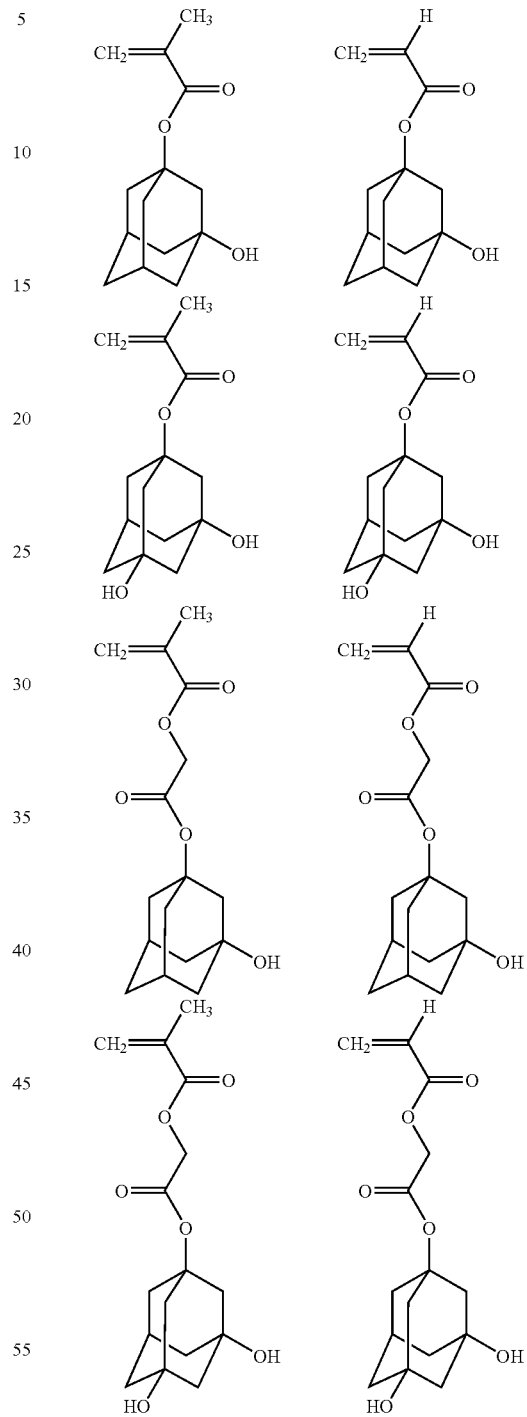

are preferable in viewpoint of the resolution.

The monomer represented by the formula (V-1) can usually be produced by a reaction of the corresponding hydroxyl-containing adamantane compound with an acrylic halide or a methacrylic halide.

In the formula (X), examples of the C1-C30 fluorine-containing alkyl group include a C1-C30 perfluoroalkyl group such as a trifluoromethyl, pentafluoroethyl, heptafluoropropyl and nonafluorobutyl group; a C1-C30 perfluoroalkoxyalkyl group such as a 1-trifluoromethoxyethyl and 1-pentafluoroethoxyethyl group; a C1-C30 perfluoroalkoxyperfuloroalkyl group such as a 1-trifluoromethoxydifluoroethyl and 1-pentafluoroethoxydifluoroethyl group; and the following groups (In the following formulae, straight line with an open end shows a bond extended from the adjacent oxygen group).

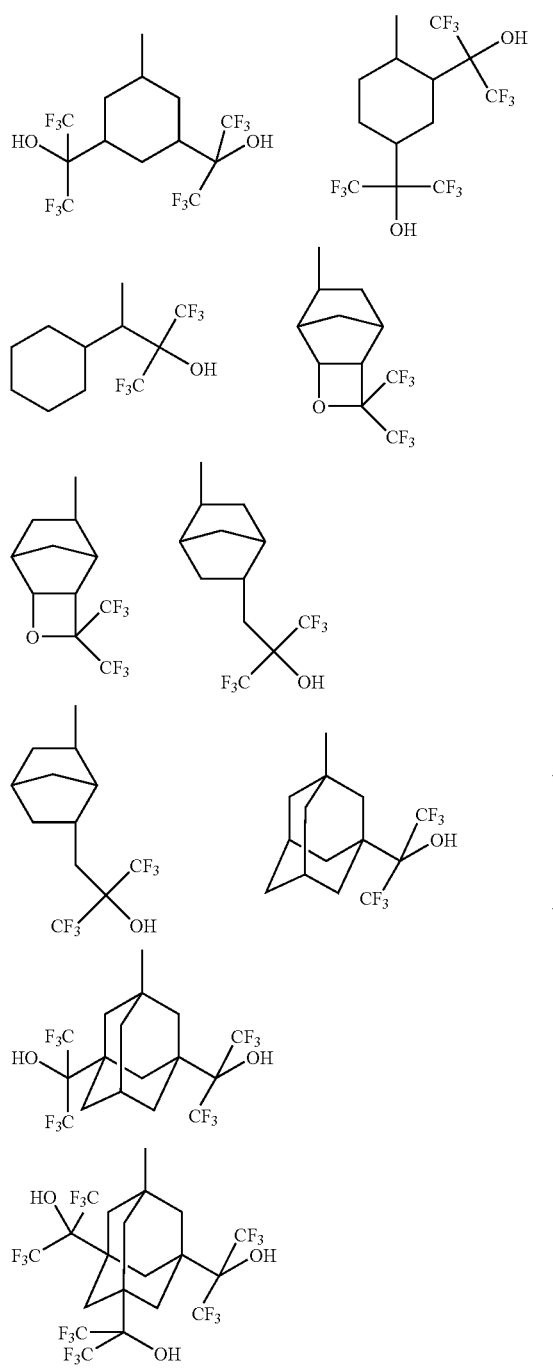

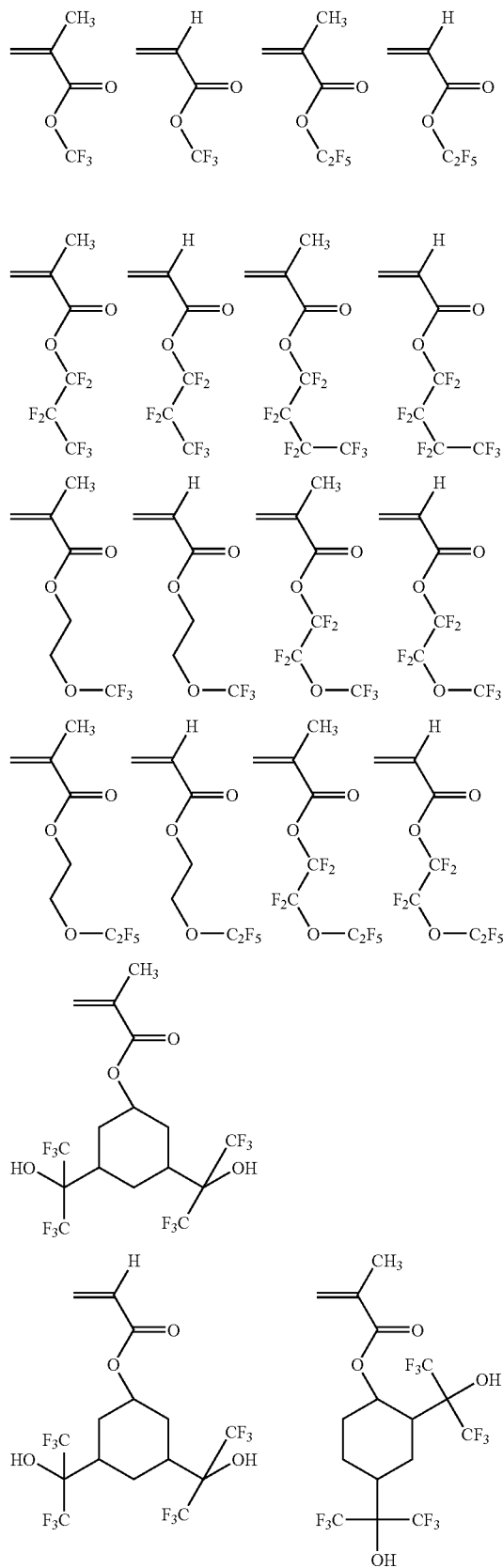

As the structural unit represented by the formula (X), the structural units derived from the following monomers are exemplified.

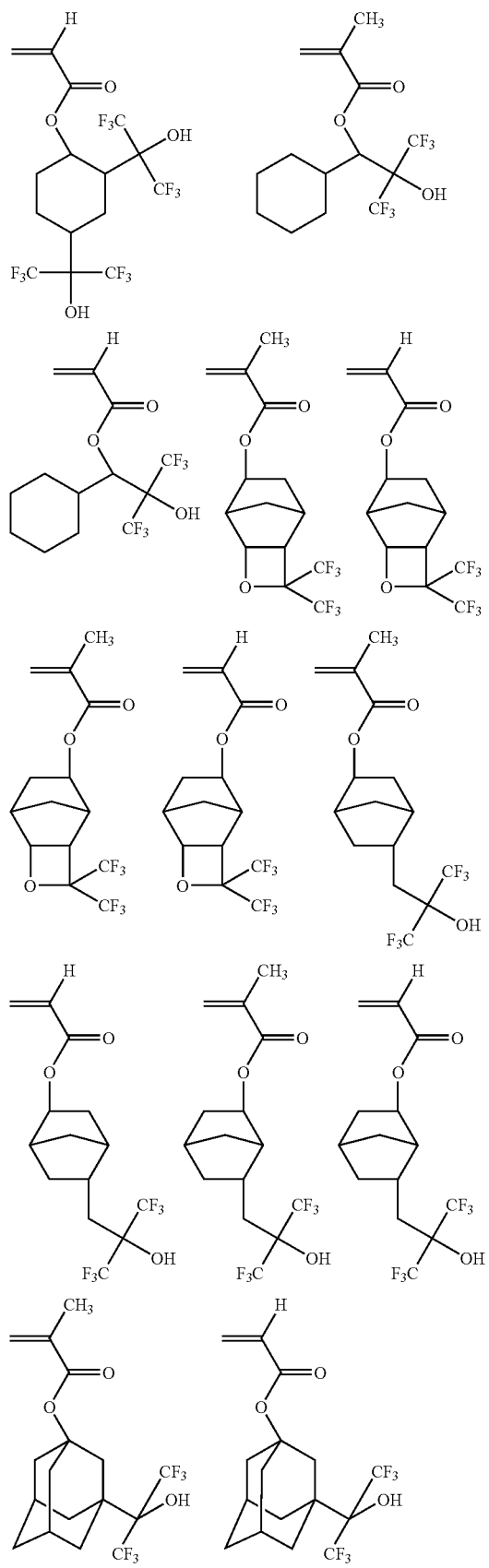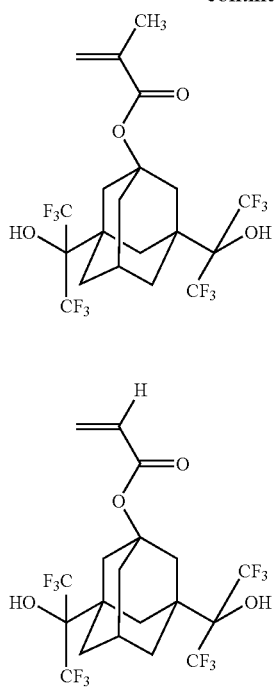
As the structural unit represented by the formula (X), the structural units derived from the following monomers:

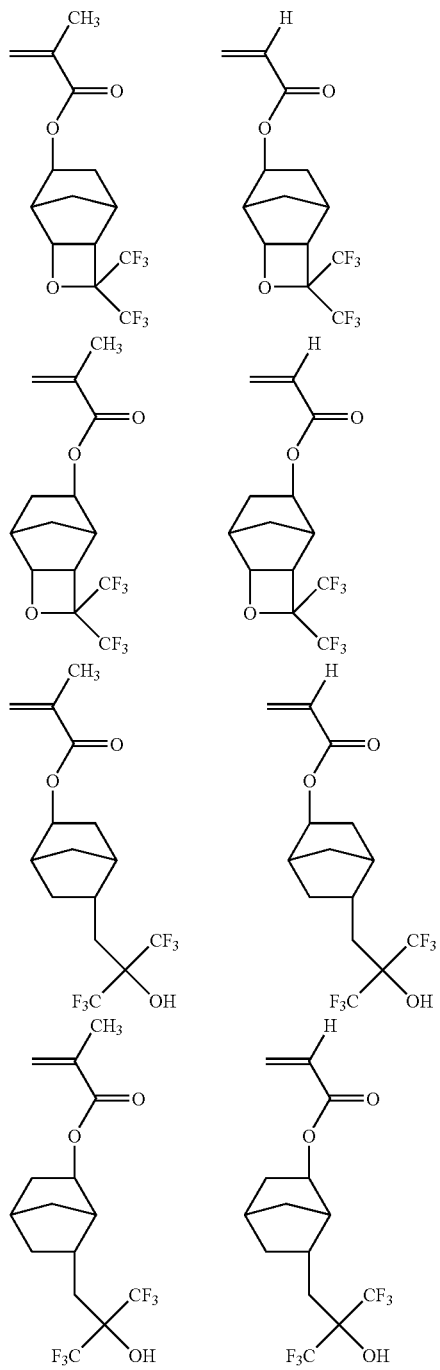

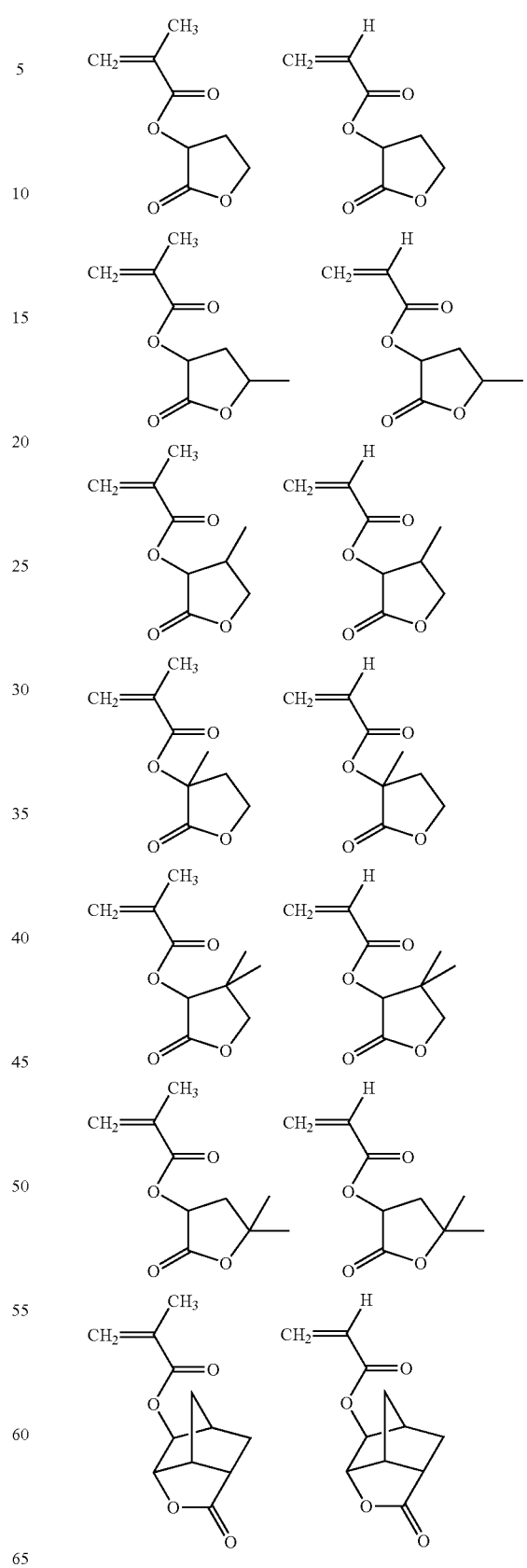

are preferable since excellent resolution is obtained when the resin containing the structural unit derived from such monomer is used in the present resist composition.

The monomer to give the structural unit represented by the formula (X) can usually be produced by reacting the corresponding fluorine-containing alcohol compound with an acrylic halide or a methacrylic halide.

In the formula (XI), examples of the ring X' include the same groups as mentioned in the ring X.

As the structural unit represented by the formula (XI), the structural units derived from the following monomers:

-continued
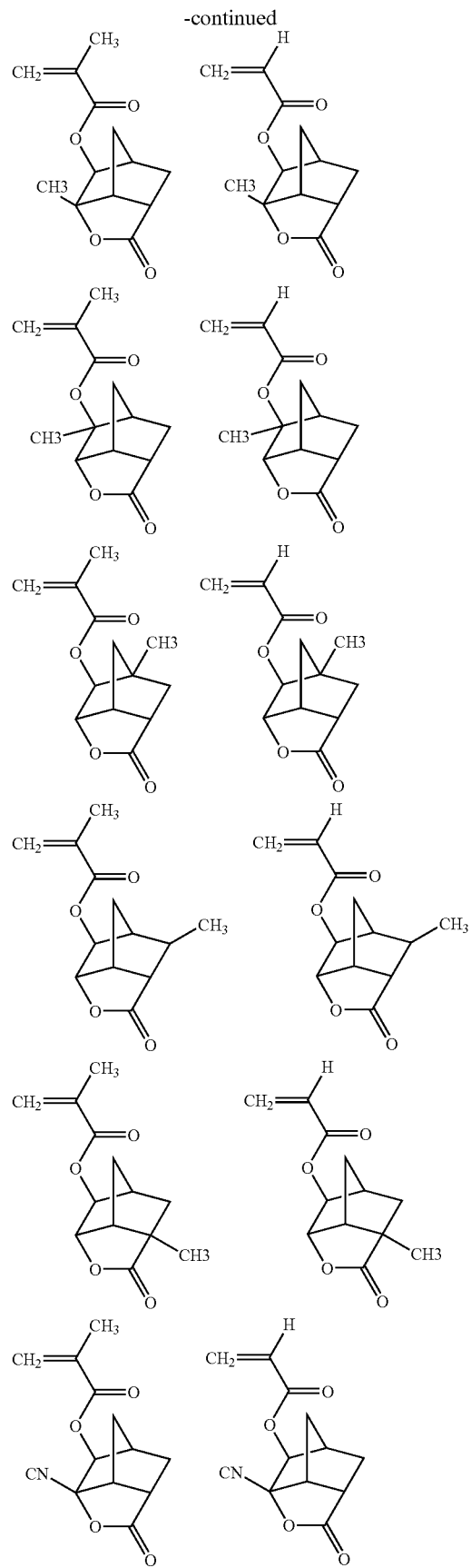
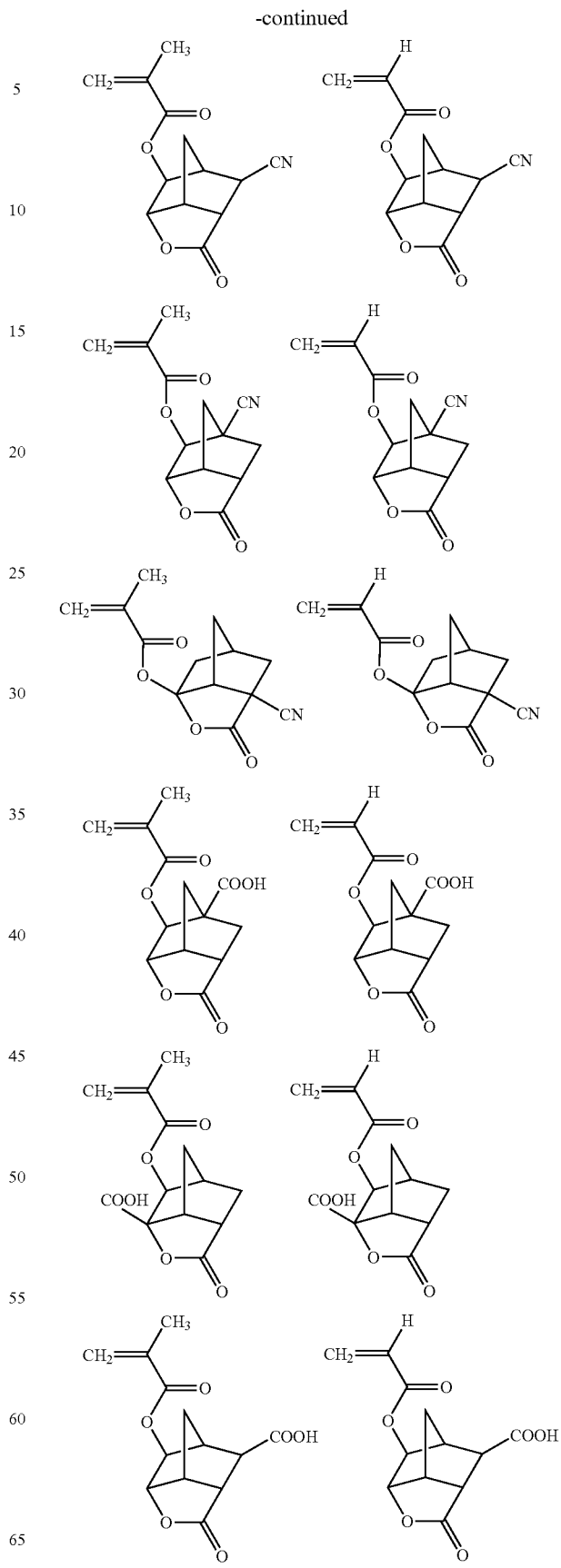

-continued
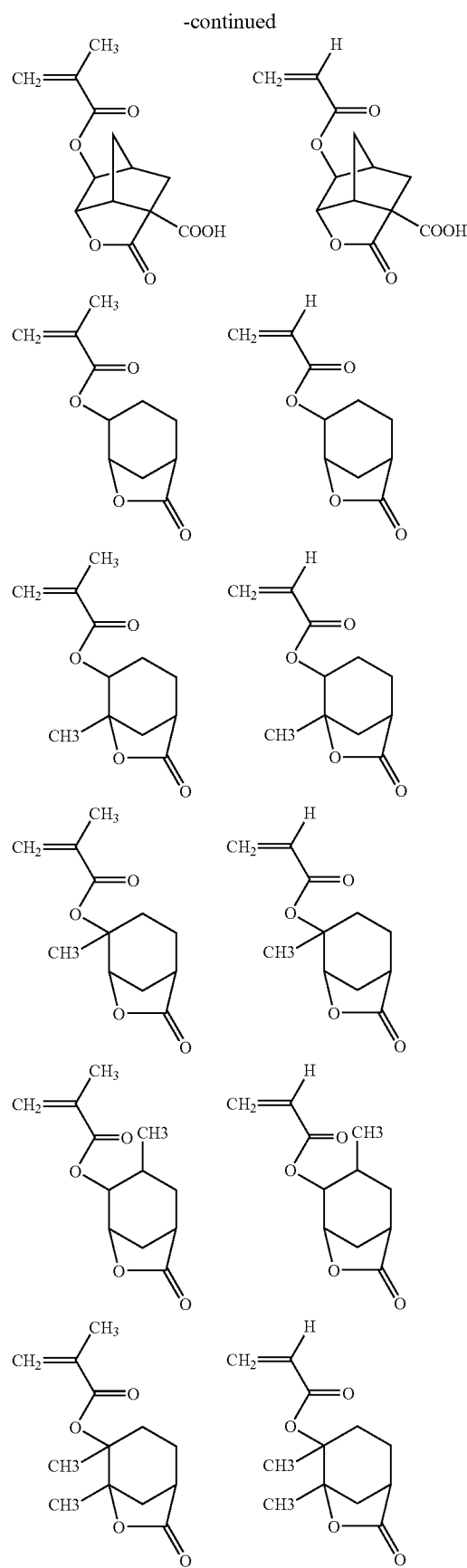
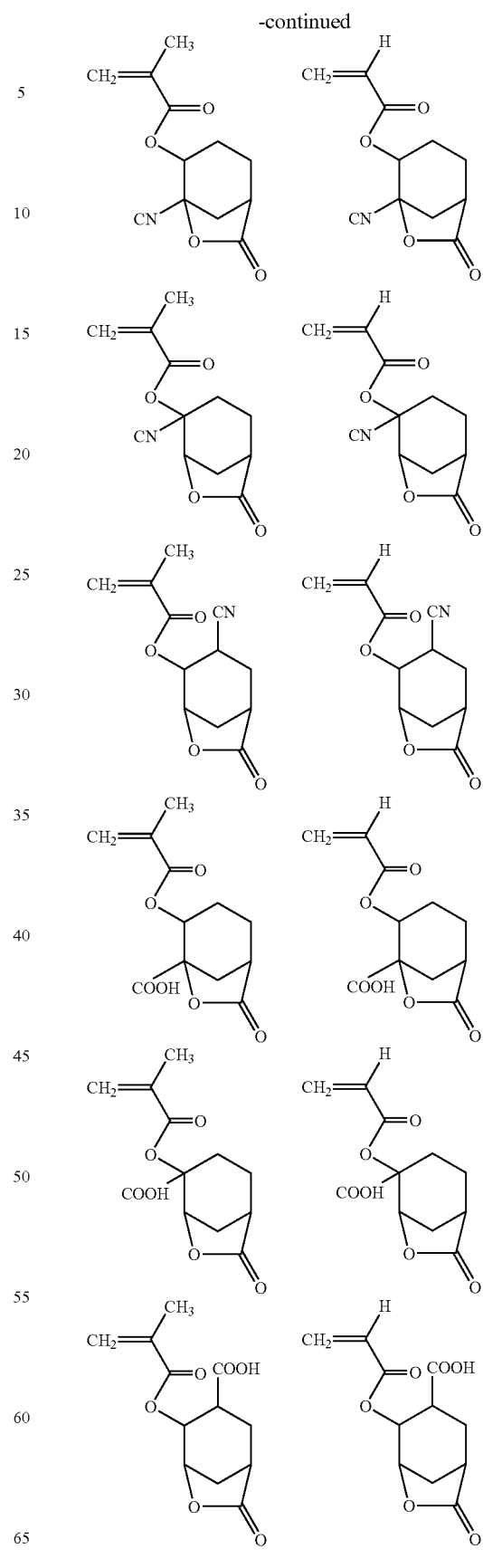

are exemplified.

As the structural unit represented by the formula (XI), the structural units derived from the following monomers:

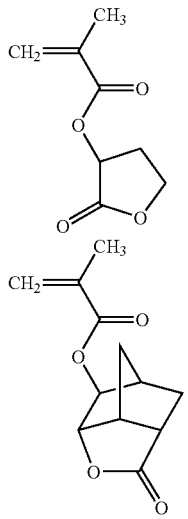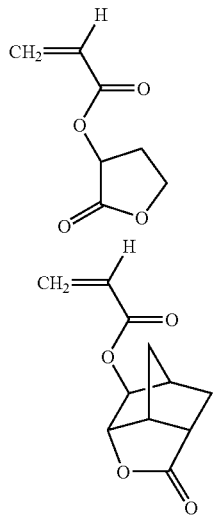

are preferable in viewpoint of the adhesiveness of resist to a substrate.

The monomer to give the structural unit represented by the formula (XI) can be produced by reacting the corresponding alicyclic lactone having a hydroxyl group with acrylic acid or methacrylic acid, and the method for production thereof is described in, for example, JP2000-26446-A.

As the other structural unit other than the structural units represented by the formulae (V), (X) and (XI), a structural unit derived from an alicyclic compound having an olefinic double bond such as a structural unit represented by the formula (1):

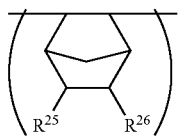

wherein $R^{25}$ and $R^{26}$ each independently represents a hydrogen atom, a C1-C3 alkyl group, a C1-C3 hydroxyalkyl group, a carboxyl group, a cyano group, a hydroxyl group or a —COOU group in which U represents an alcohol residue, or $R^{25}$ and $R^{26}$ can be bonded together to form a carboxylic anhydride residue represented by —C(=O)OC(=O)—;

a structural unit derived from an aliphatic unsaturated dicarboxylic anhydride such as a structural unit represented by the formula (2):

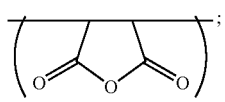

and a structural unit represented by the formula (3):

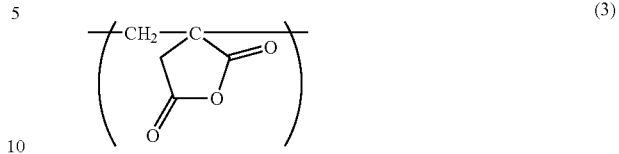

is exemplified.

The resin containing a structural unit derived from 2-norbornene shows strong structure because the alicyclic group is directly present on its main chain and shows a property that dry etching resistance is excellent. The structural unit derived from 2-norbornene can be introduced into the main chain by radical polymerization using, for example, an aliphatic unsaturated dicarboxylic anhydride such as maleic anhydride and itaconic anhydride together in addition to corresponding 2-norbornene. The structural unit derived from 2-norbornene is formed by opening of its double bond, and can be represented by the above-mentioned formula (1). The structural unit derived from maleic anhydride and from itaconic anhydride which are the structural unit derived from aliphatic unsaturated dicarboxylic anhydrides are formed by opening of their double bonds, and can be represented by the above-mentioned formula (2) and the formula (3), respectively.

In $R^{25}$ and $R^{26}$, examples of the C1-C3 alkyl group include a methyl, ethyl, and n-propyl group, and examples of the C1-C3 hydroxyalkyl group include a hydroxymethyl and 2-hydroxyethyl group.

In $R^{25}$ and $R^{26}$, the —COOU group is an ester formed from the carboxyl group, and as the alcohol residue corresponding to U, for example, an optionally substituted C1-C8 alkyl group, 2-oxooxolan-3-yl group, 2-oxooxolan-4-yl and the like are listed, and as the substituent on the C1-C8 alkyl group, a hydroxyl group, an alicyclic hydrocarbon residue and the like are listed.

Specific examples of the monomer used to give the structural unit represented by the above-mentioned formula (1) may include 2-norbornene, 2-hydroxy-5-norbornene, 5-norbornene-2-carboxylicacid, methyl 5-norbornene-2-carboxylate, 2-hydroxyethyl 5-norbornene-2-carboxylate, 5-norbornene-2-methanol and 5-norbornene-2,3-dicarboxylic anhydride.

When U in the —COOU group is the acid-labile group, the structural unit represented by the formula (1) is a structural unit having the acid-labile group even if it has the norbornane structure. Examples of monomers giving structural unit having the acid-labile group include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, 1-(1-adamantyl)-1-methylethyl 5-norbornene-2-carboxylate, and the like.

The ratio of the other structural unit or units is usually 0 to 60% by mole based on all structural units of RESIN.

RESIN can be produced by conducting the polymerization reaction of the corresponding monomer or monomers. RESIN can be also produced by conducting the oligomerization reaction of the corresponding monomer or monomers followed by polymerizing the oligomer obtained.

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile) and di-methyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited.

The amount of the radical initiator is preferably 1 to 20% by mole based on all monomer or oligomer molar amount.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran; a ketone solvent such as methyl isobutyl ketone; an alcohol solvent such as isopropyl alcohol; a cyclic ester solvent such as γ-butyrolactone; a glycol ether ester ester solvent such as propylene glycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

When an alicyclic compound having an olefinic double bond and an aliphatic unsaturated dicarboxylic anhydride are used as monomers, it is preferable to use them in excess amount in view of a tendency that these are not easily polymerized.

After competition of the polymerization reaction, RESIN produced can be isolated, for example, by adding a solvent in which the present resin is insoluble or poorly soluble to the reaction mixture obtained and filtering the precipitated RESIN. If necessary, the isolated RESIN may be purified, for example, by washing with a suitable solvent.

RESIN itself is insoluble or poorly soluble in an alkali aqueous solution but becomes soluble in an alkali aqueous solution by the action of an acid.

The present chemically amplified resist composition comprises at least two salts selected from the Salt (II) and the Salt (III).

In the Salt (II), $Y^1$ and $Y^2$ each independently represent a fluorine atom or a C1-C6 perfluoroalkyl group. Examples of the C1-C6 perfluoroalkyl group include a trifluoromethyl, pentafluoroethyl, heptafluoropropyl, nonafluorobutyl undecafluoropentyl and tridecafluorohexyl group, and the trifluoromethyl group is preferable.

It is preferable that $Y^1$ and $Y^2$ each independently represent the fluorine atom or the trifluoromethyl group, and it is more preferable that $Y^1$ and $Y^2$ represent the fluorine atoms.

$R^{21}$ represents a C1-C30 hydrocarbon group in which at least one $—CH_2—$ may be substituted with $—CO—$ or $—O—$. The C1-C30 hydrocarbon group may be a linear or branched chain hydrocarbon group. The C1-C30 hydrocarbon group may have a monocyclic or polycyclic structure, and may have an aromatic group or groups. The C1-C30 hydrocarbon group may have a carbon-carbon double bond or bonds. The C1-C30 hydrocarbon group may be substituted.

Examples of the substituent include a C1-C6 alkyl group, a C1-C6 alkoxy group, a C1-C4 perfluoroalkyl group, a C1-C6 hydroxyalkyl group, a hydroxyl group and a cyano group, and the hydroxyl group is preferable as the substituent.

Examples of the C1-C6 alkyl group include a methyl, ethyl, n-propyl, isopropyl, n-butyl, isobutyl, sec-butyl, tert-butyl, n-pentyl and n-hezyl group. Examples of the C1-C6 alkoxy group include a methoxy, ethoxy, n-propoxy, isopropoxy, n-butoxy, isobutoxy, sec-butoxy, tert-butoxy, n-pentyloxy and n-hexyloxy group. Examples of the C1-C4 perfluoroalkyl group include a trifluoromethyl, pentafluoroethyl, heptafluoropropyl and nonafluorobutyl group. Examples of the C1-C6 hydroxyalkyl group include a hydroxymethyl, 2-hydroxyethyl, 3-hydroxypropyl, 4-hydroxybutyl and 6-hydroxyhexyl group.

Specific examples of the anion part of the Salt (II) include the followings.

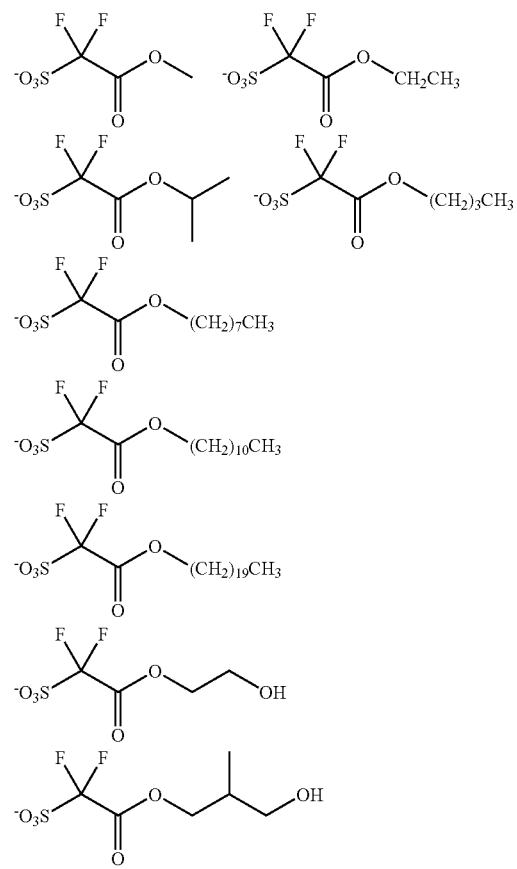

-continued
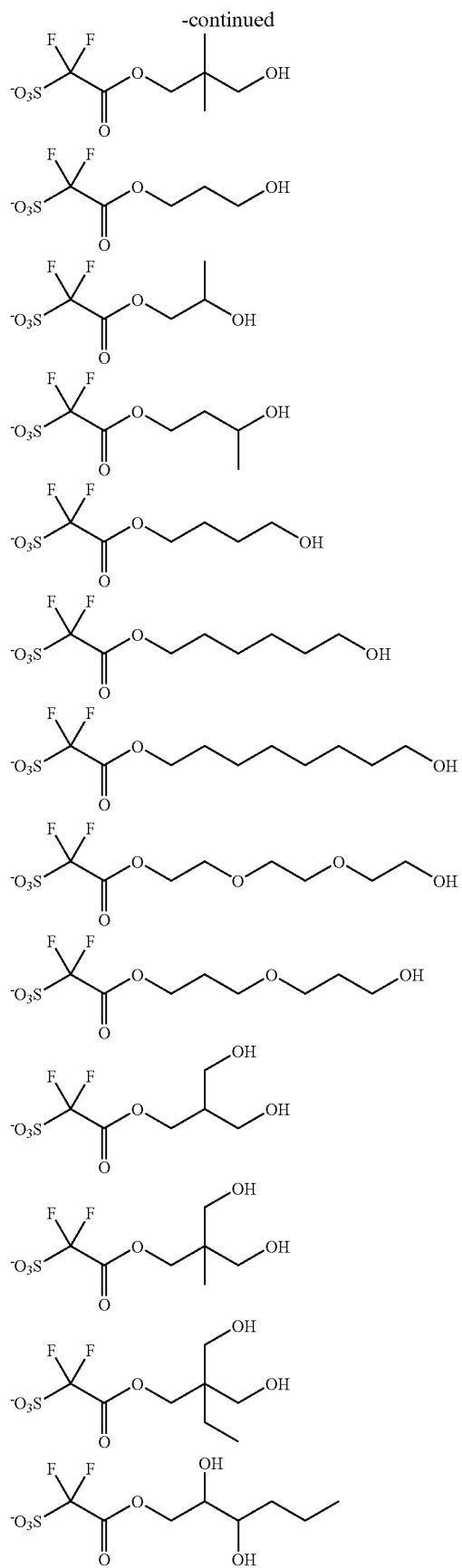
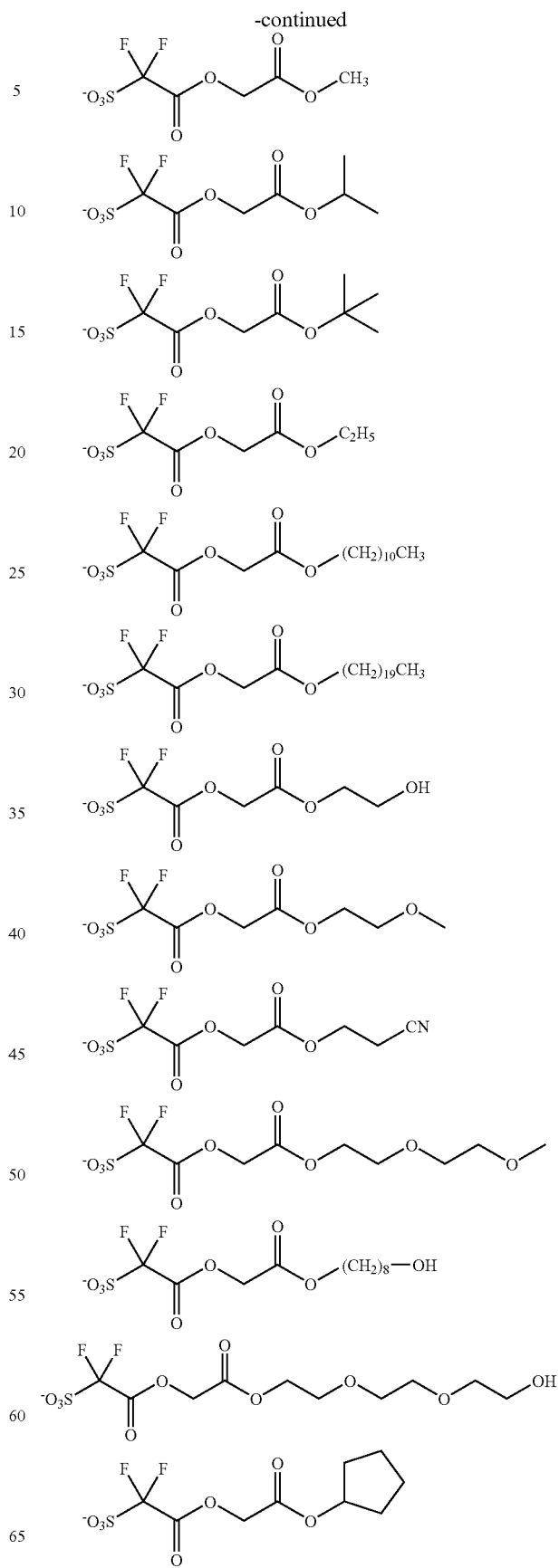

-continued
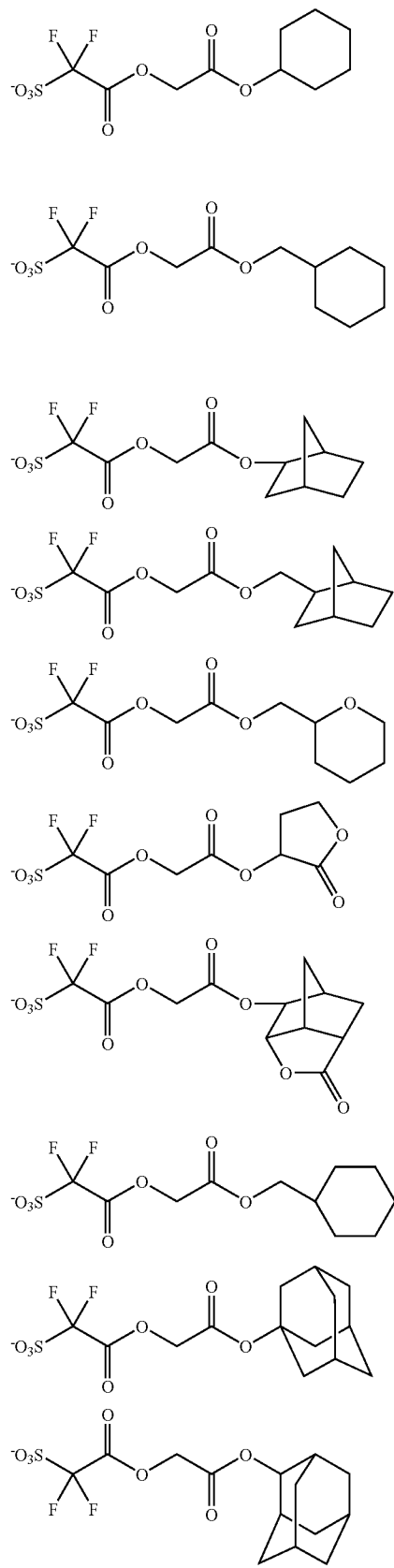
-continued
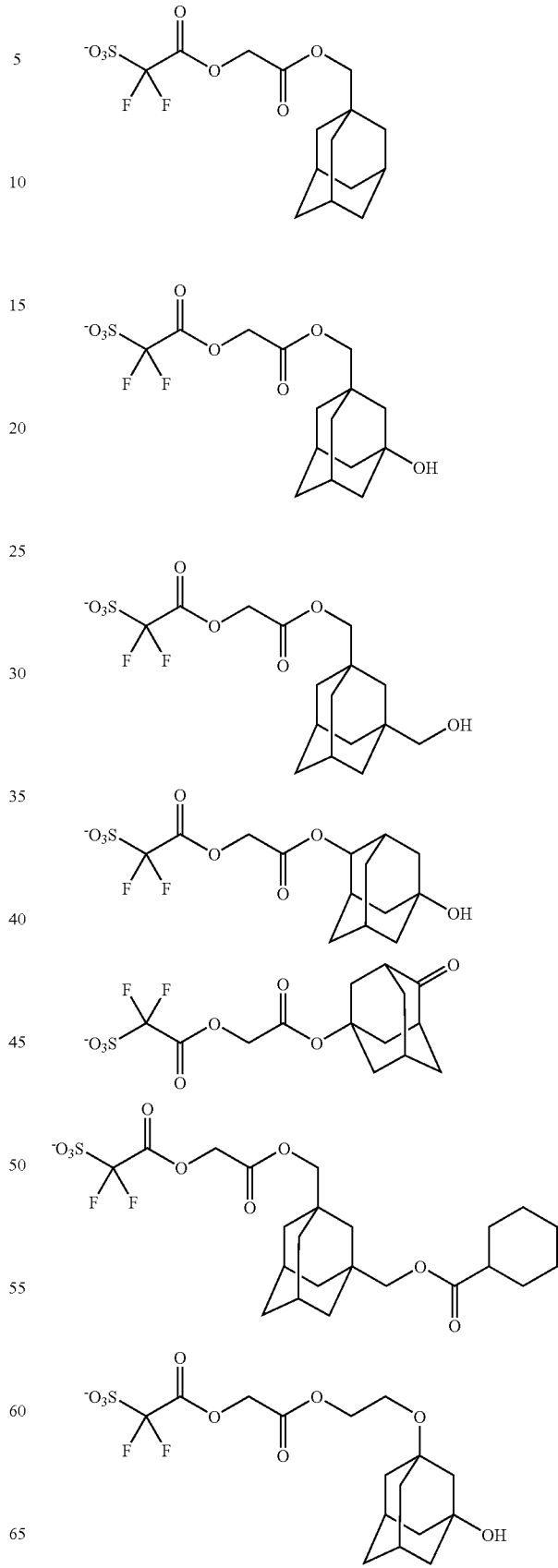

-continued
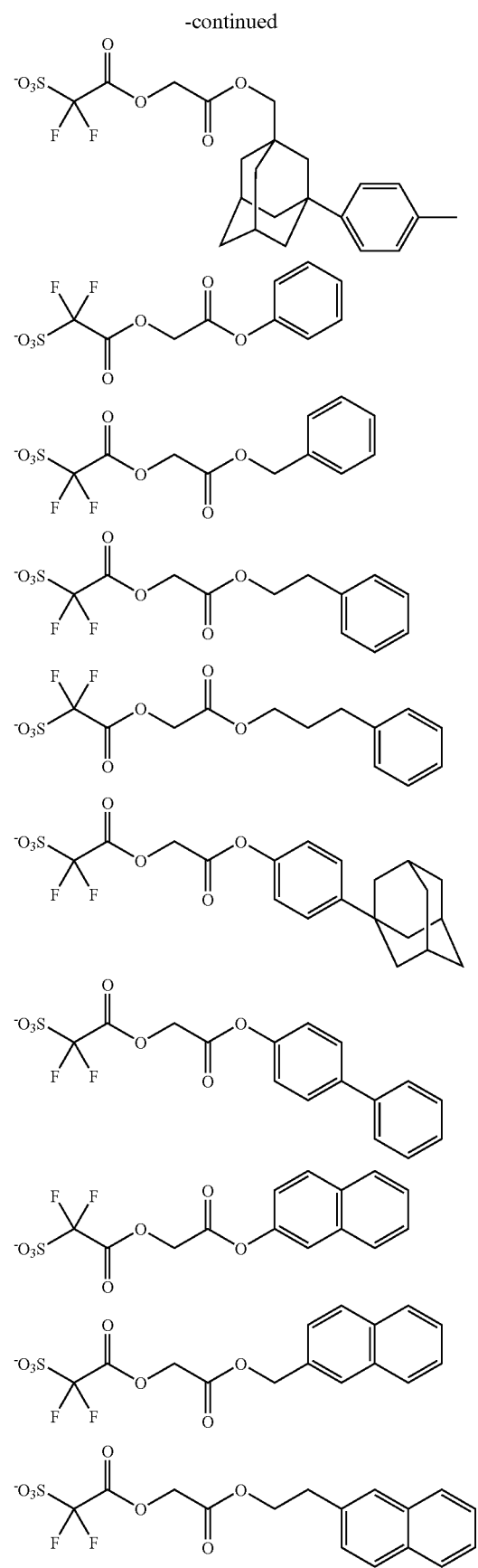
-continued
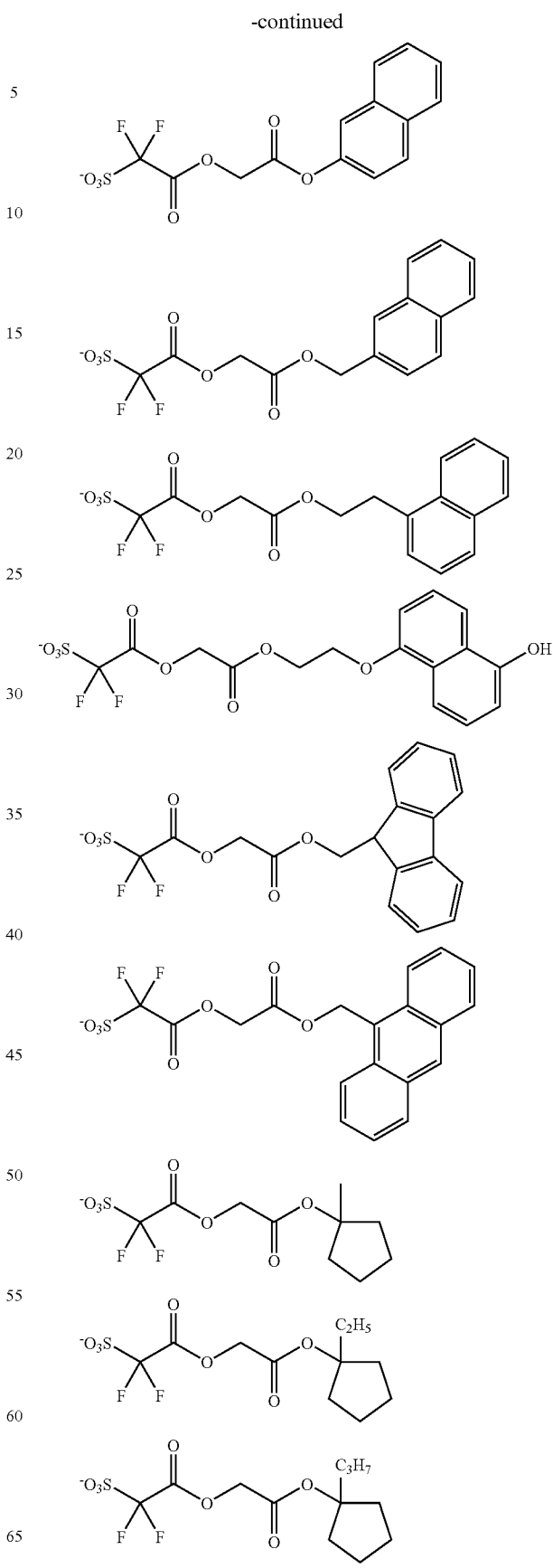

-continued
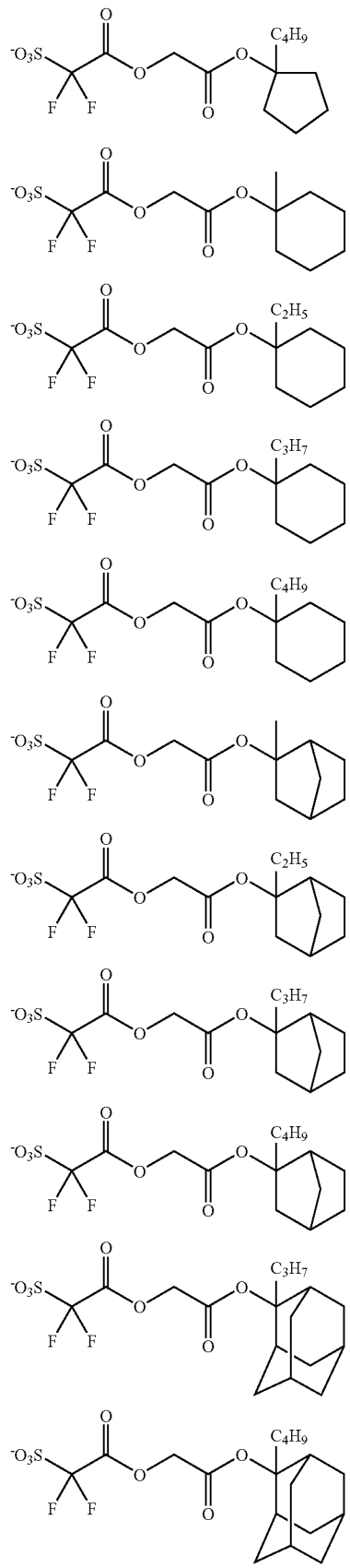
-continued
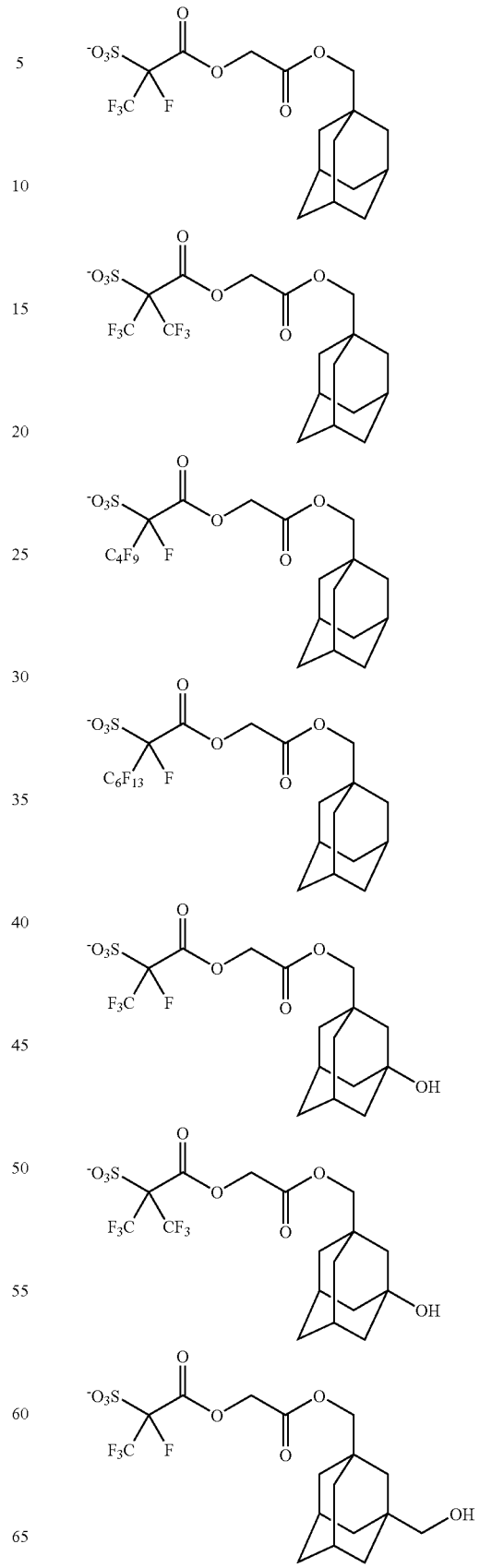

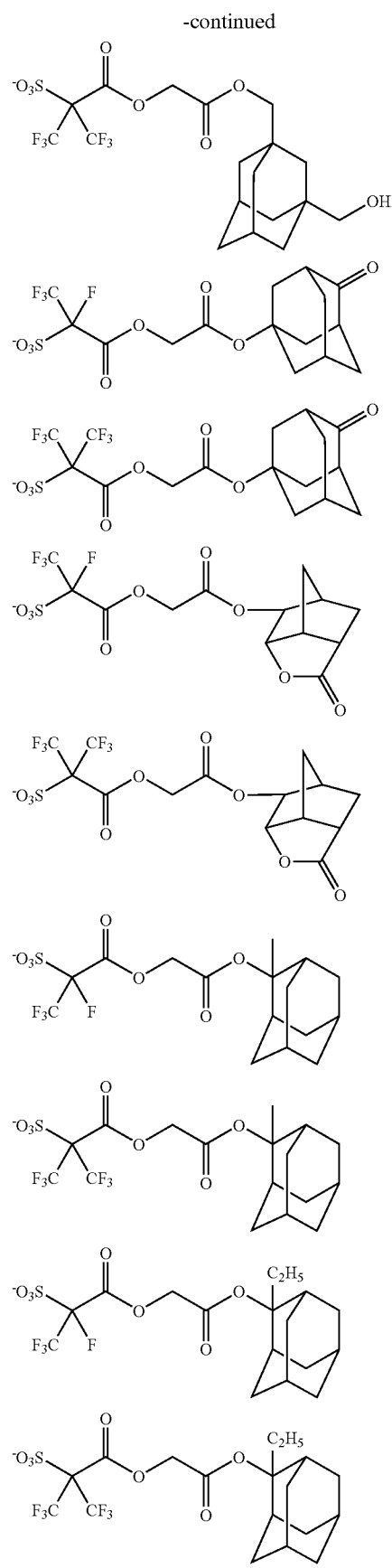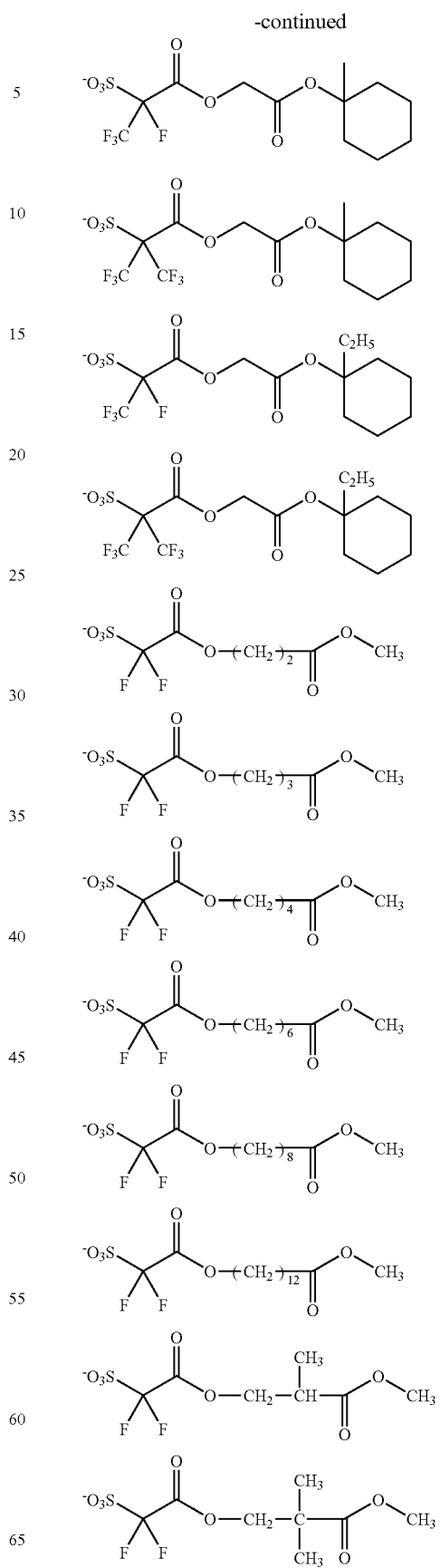

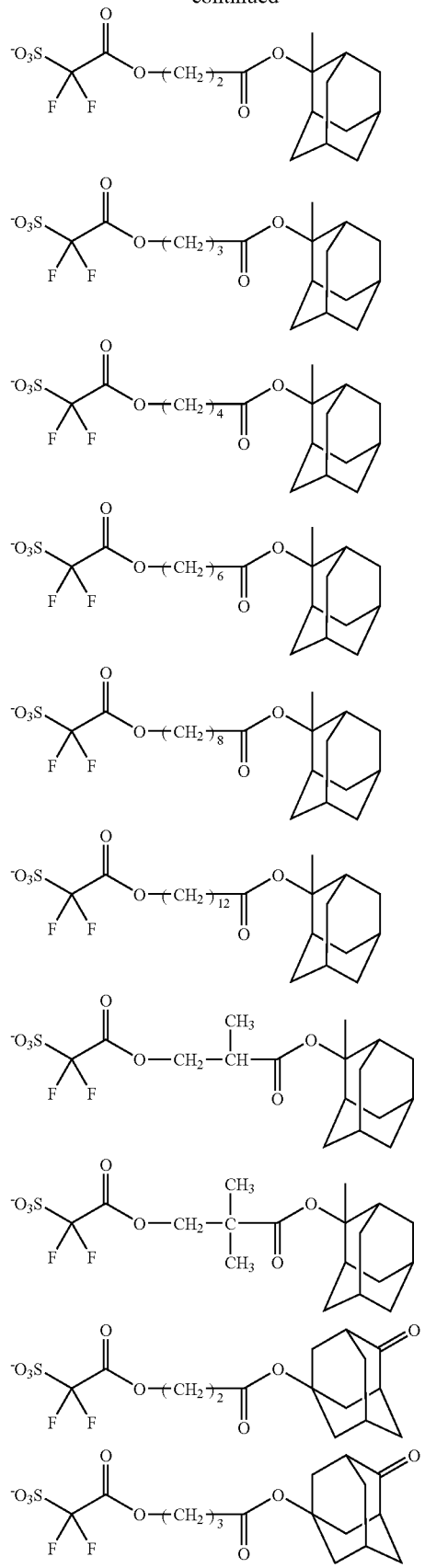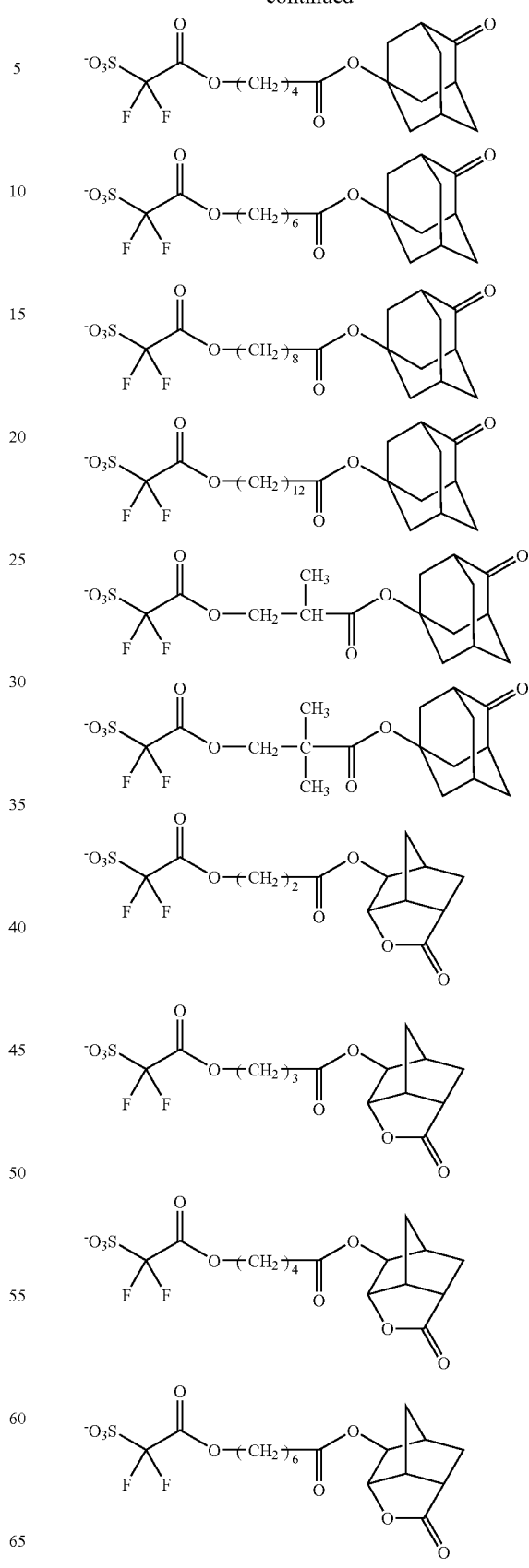

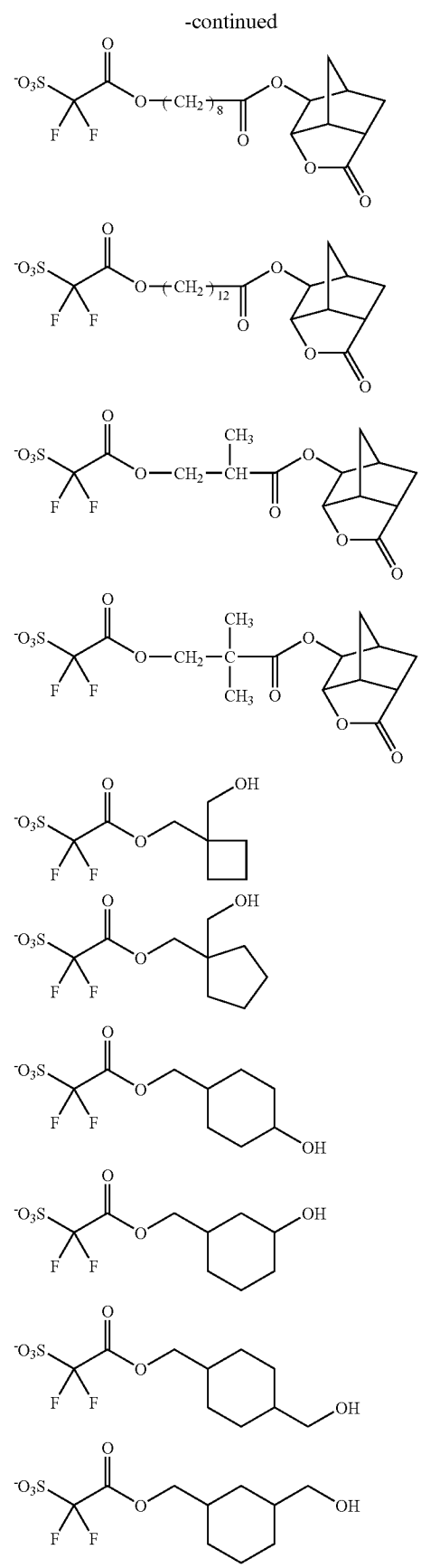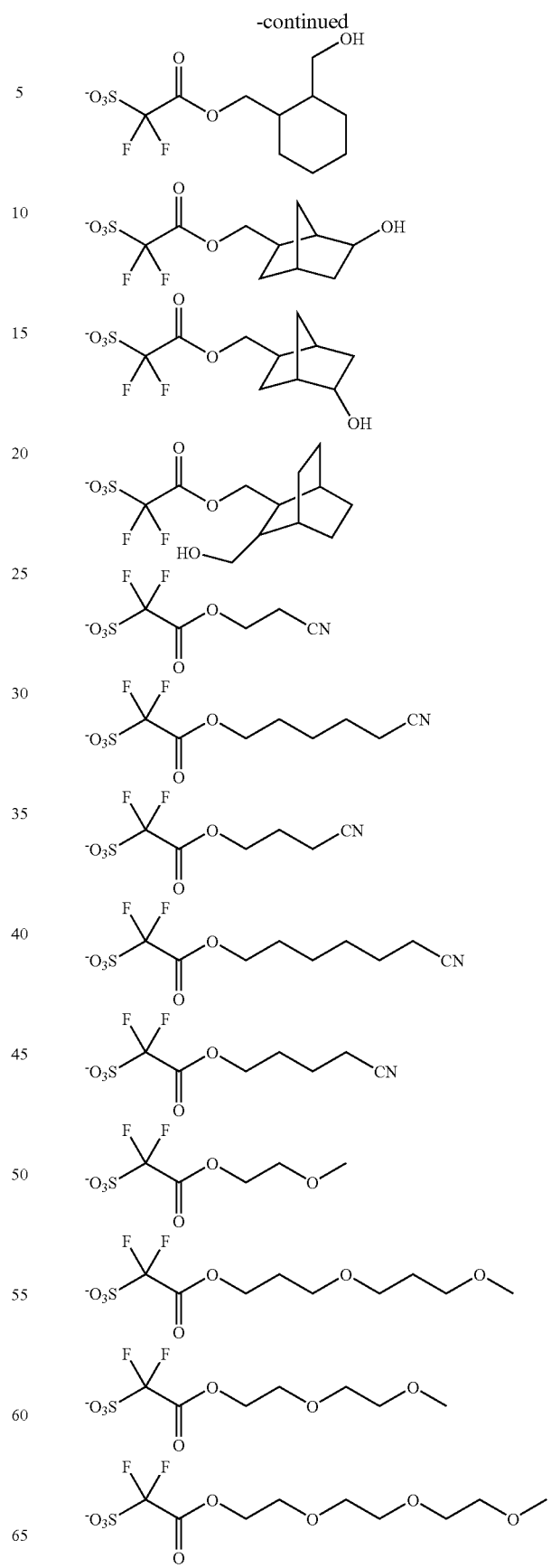

-continued
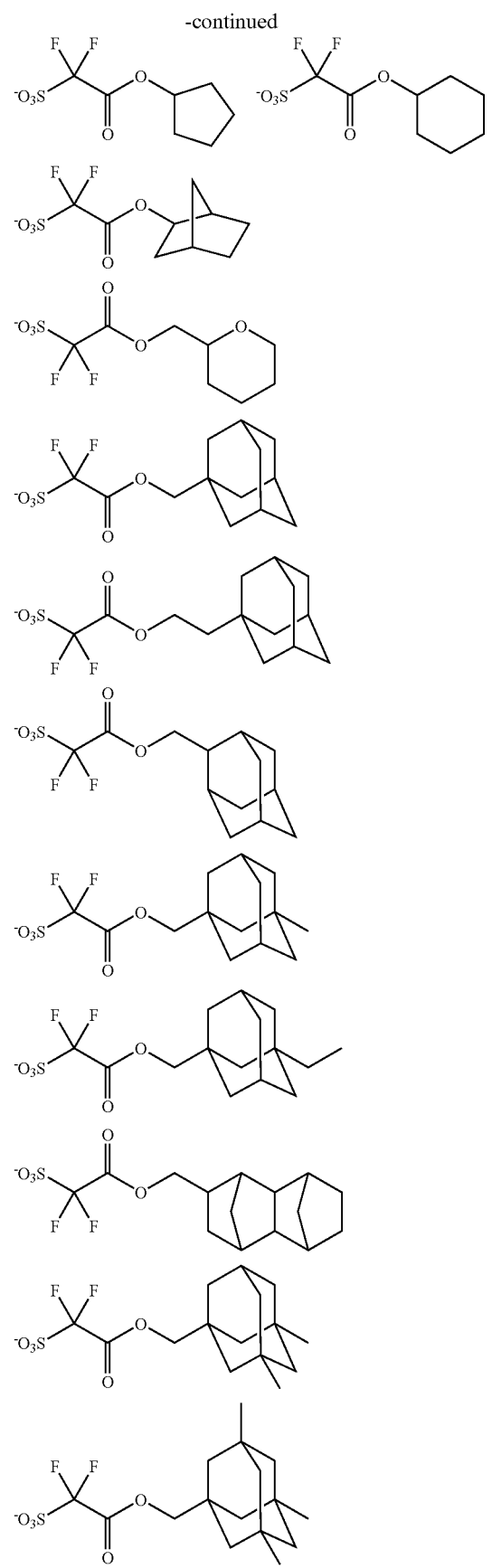
-continued
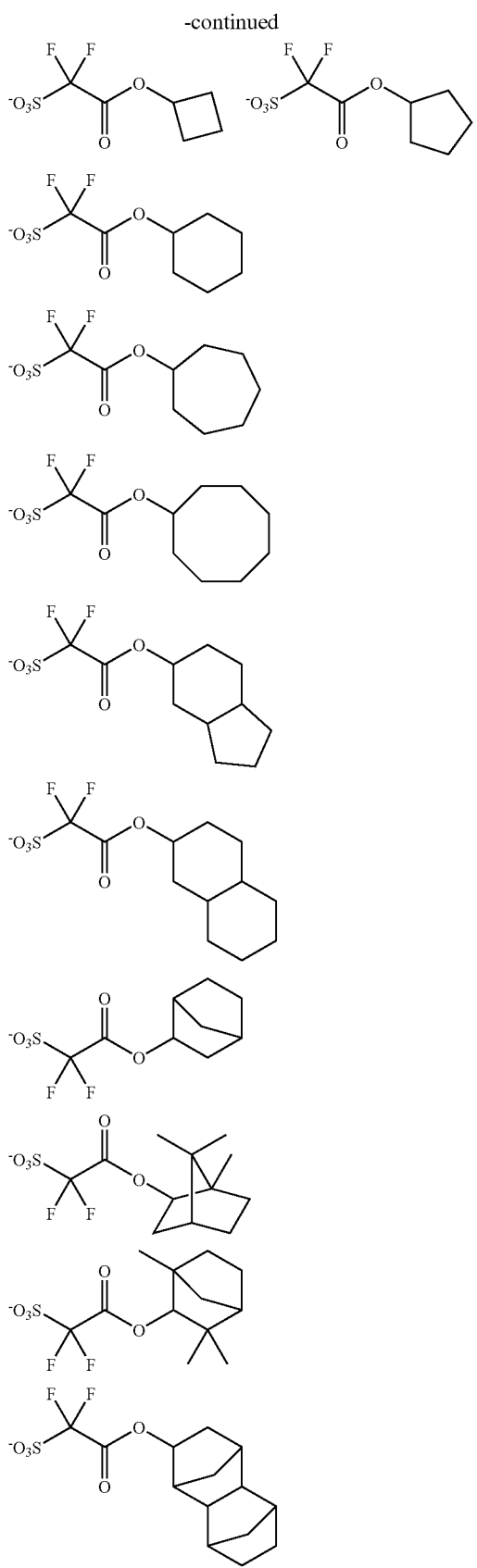

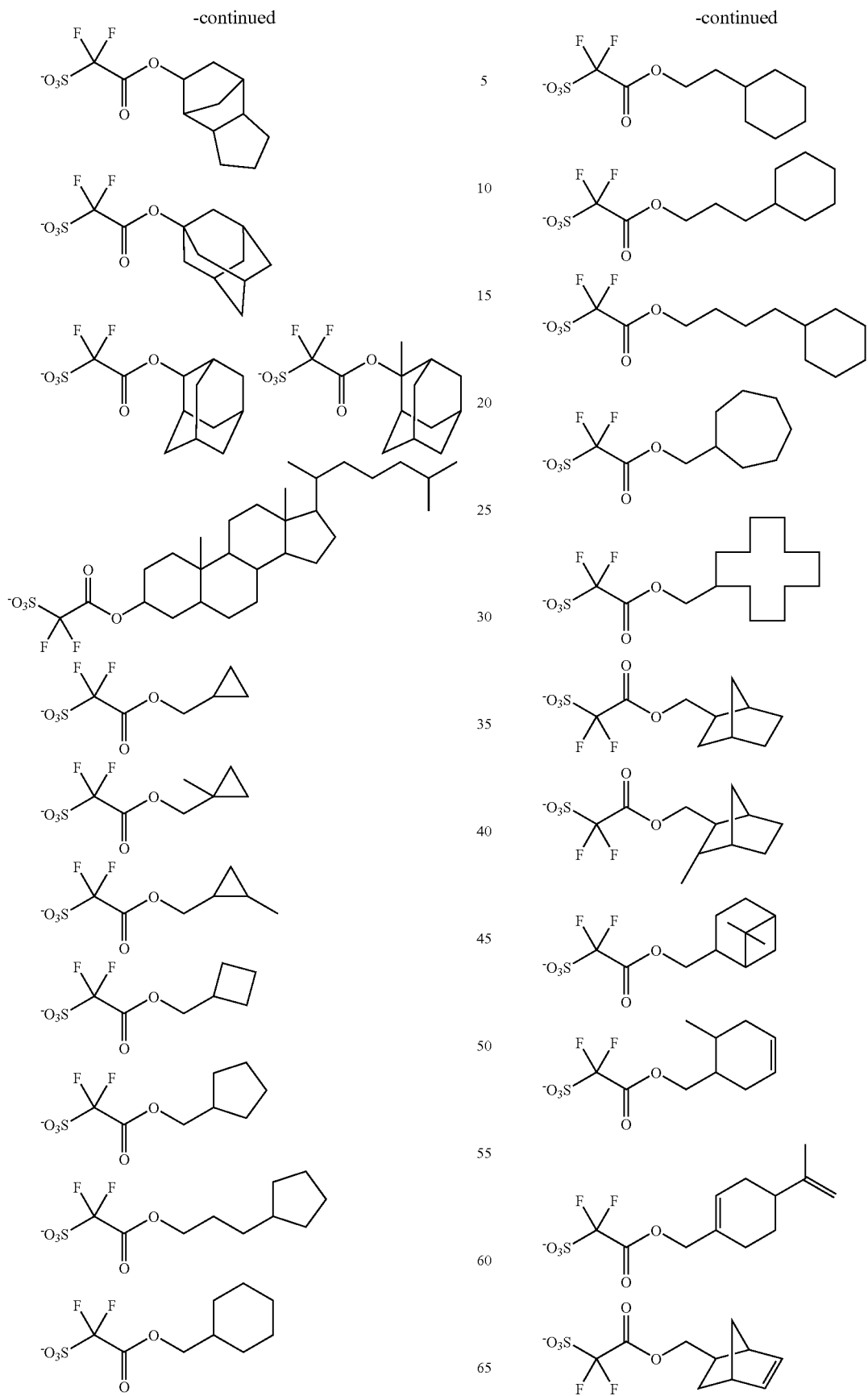

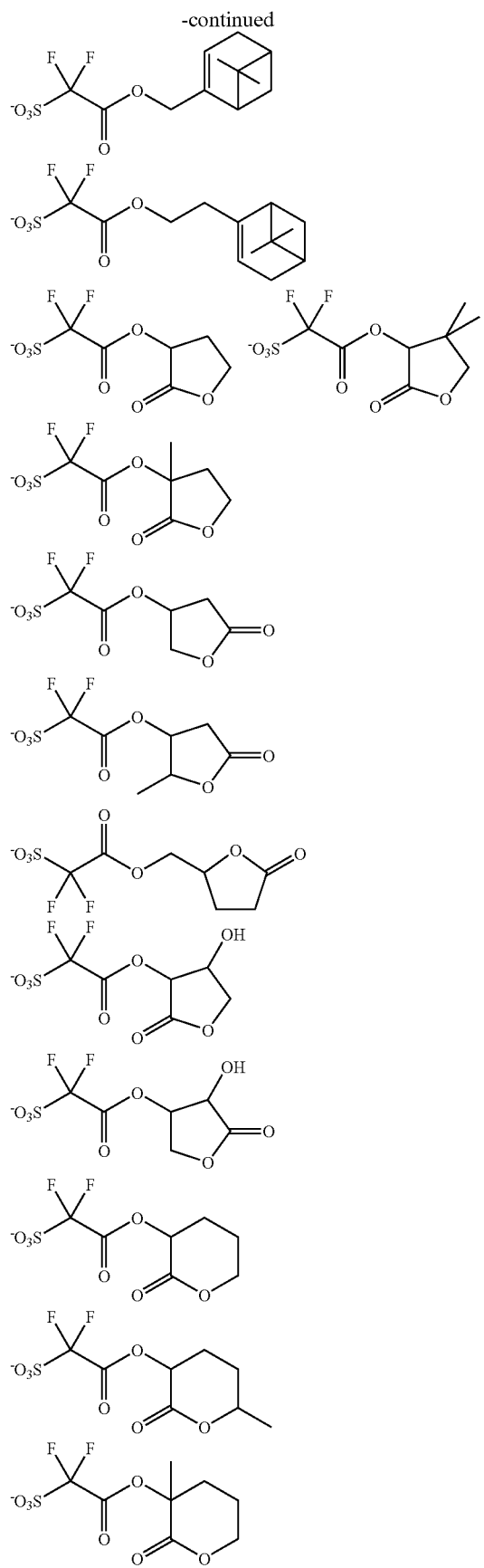
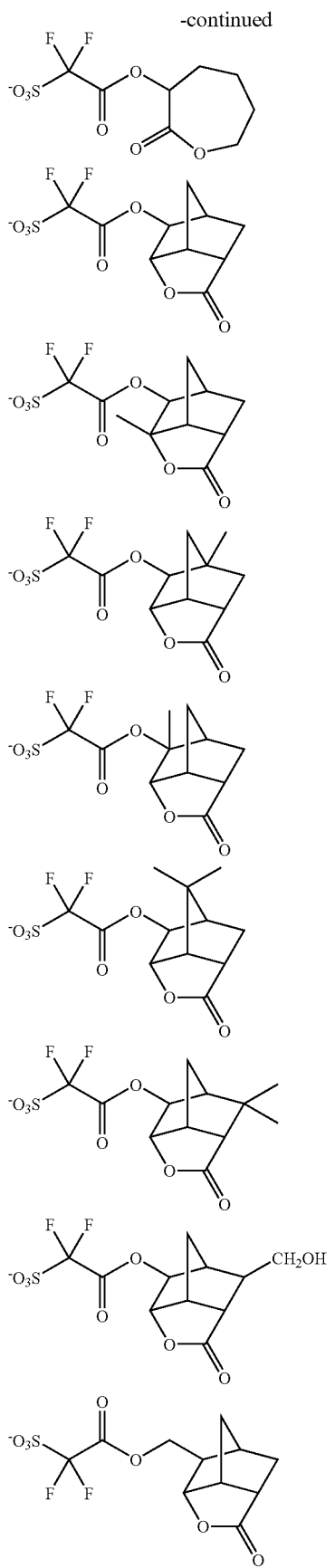

101
-continued
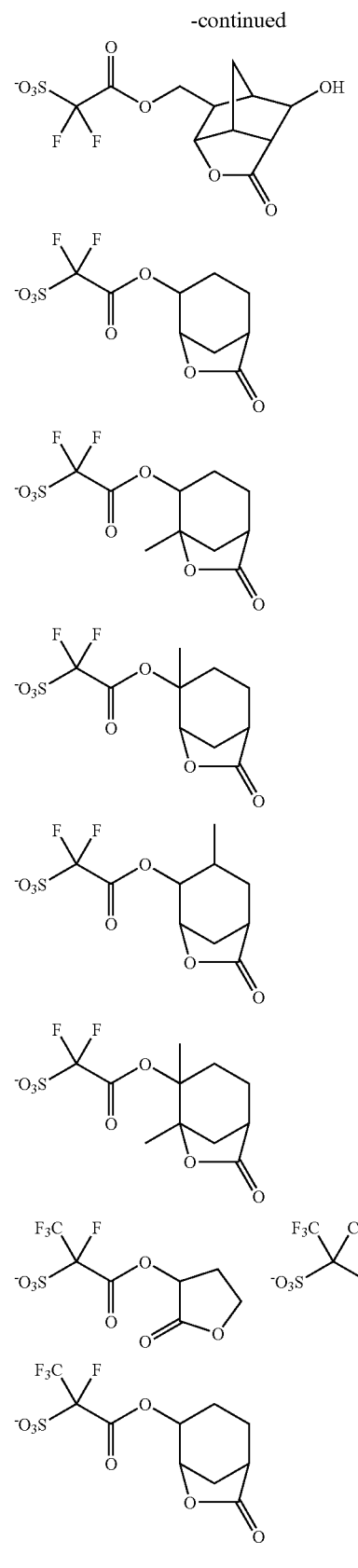
102
-continued
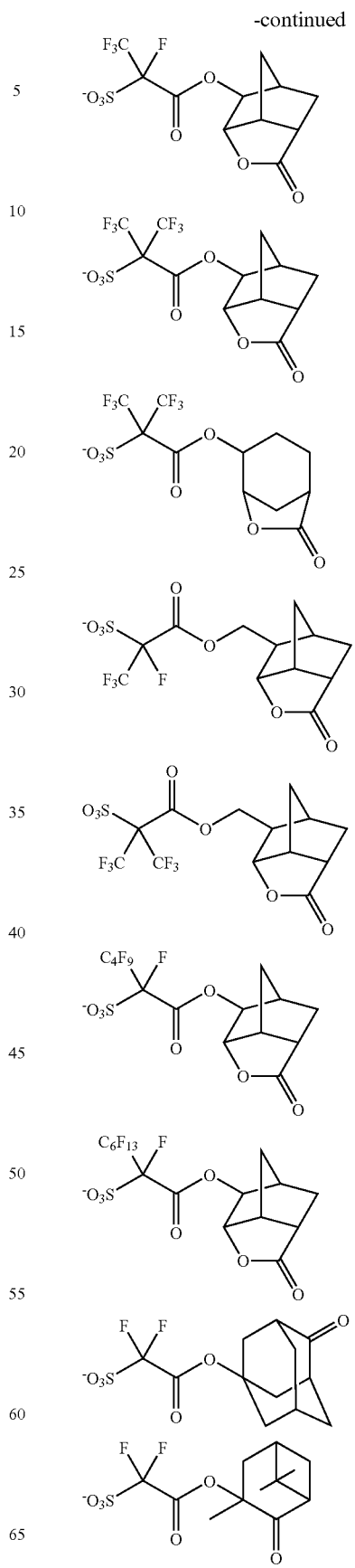

-continued
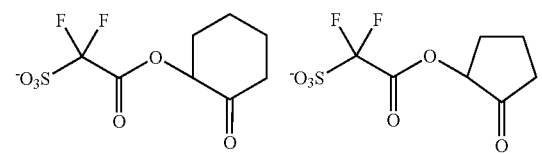
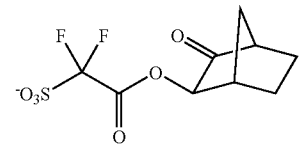
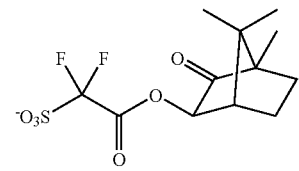
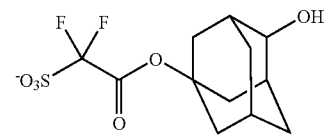
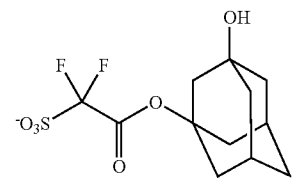
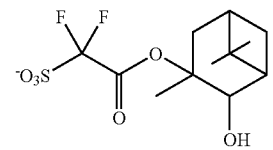
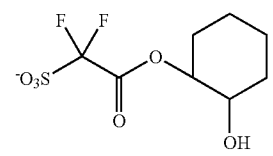
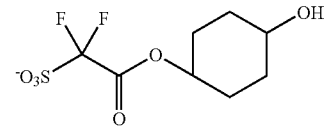
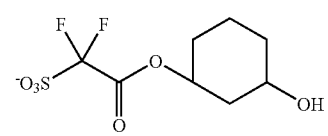
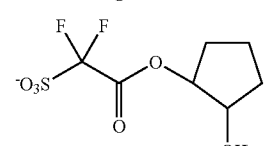
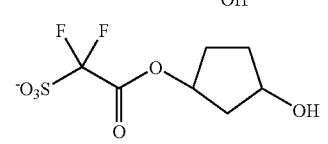
-continued
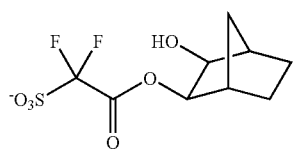
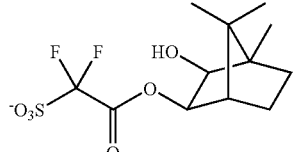
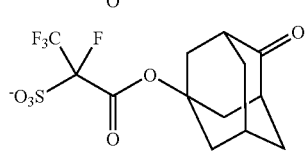
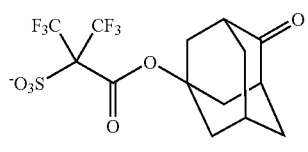
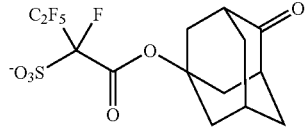
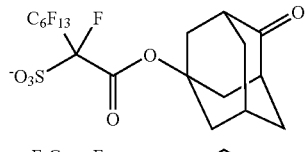
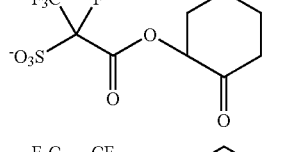
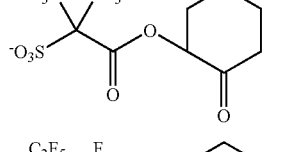
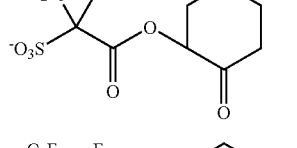
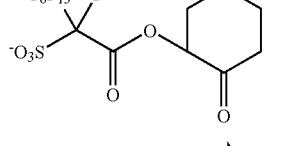

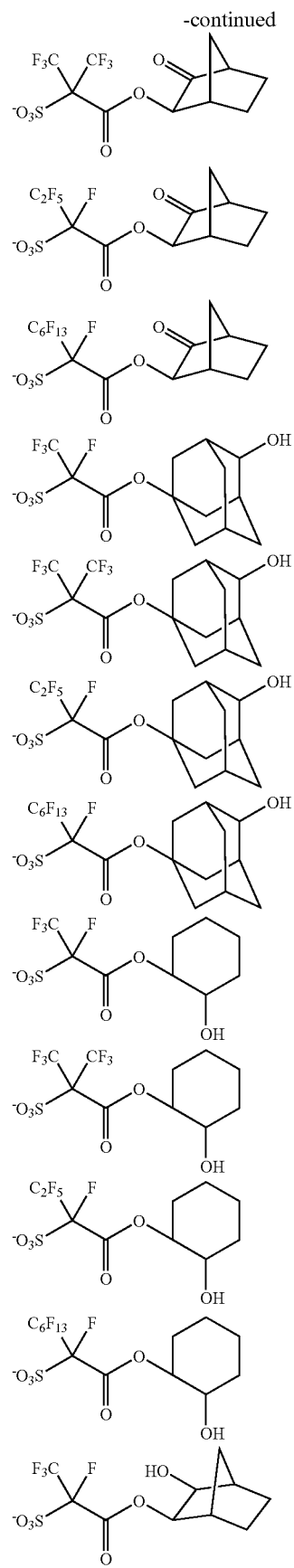
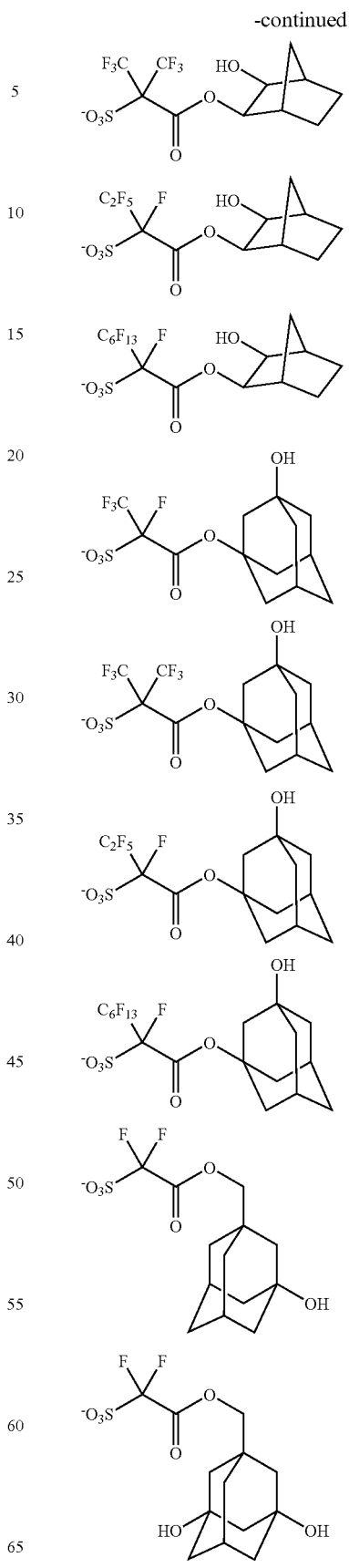

-continued
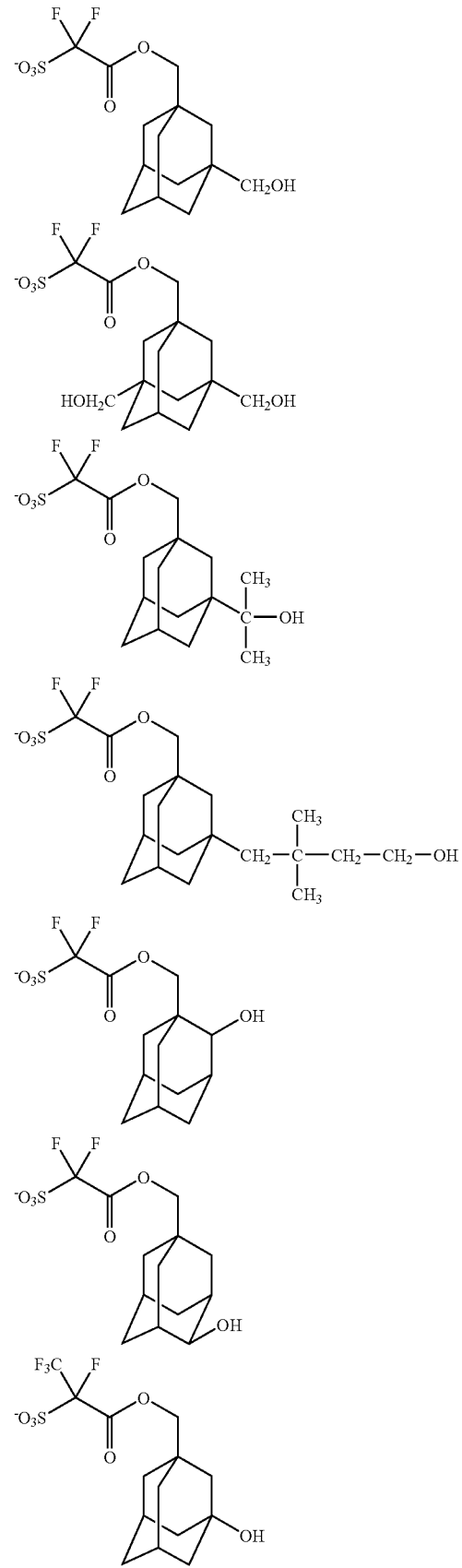
-continued
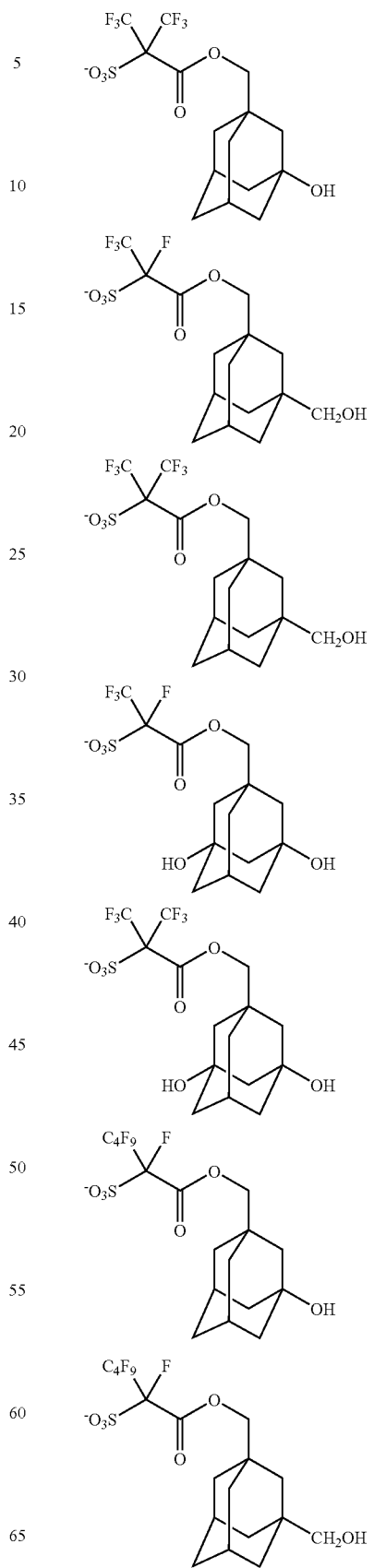

-continued
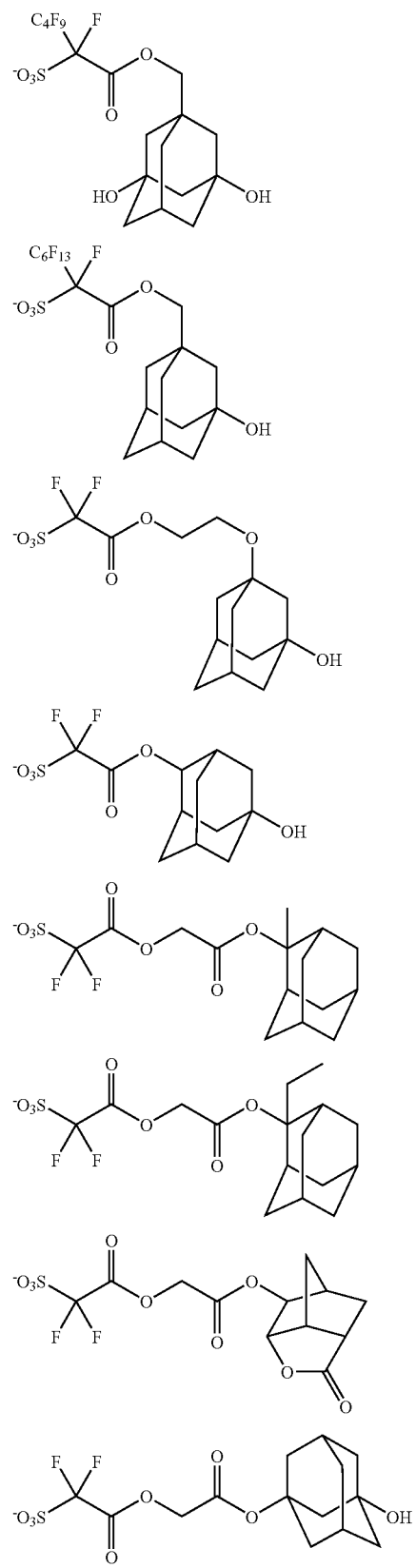
-continued
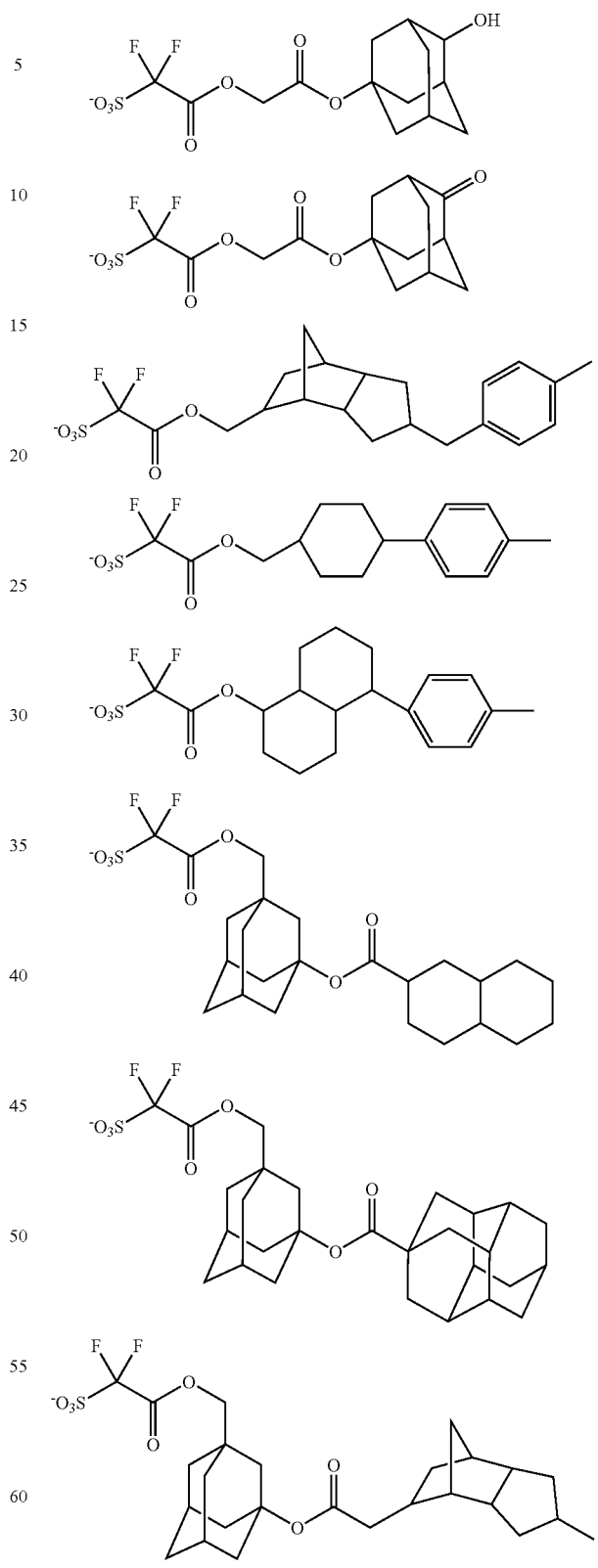

111 112
-continued
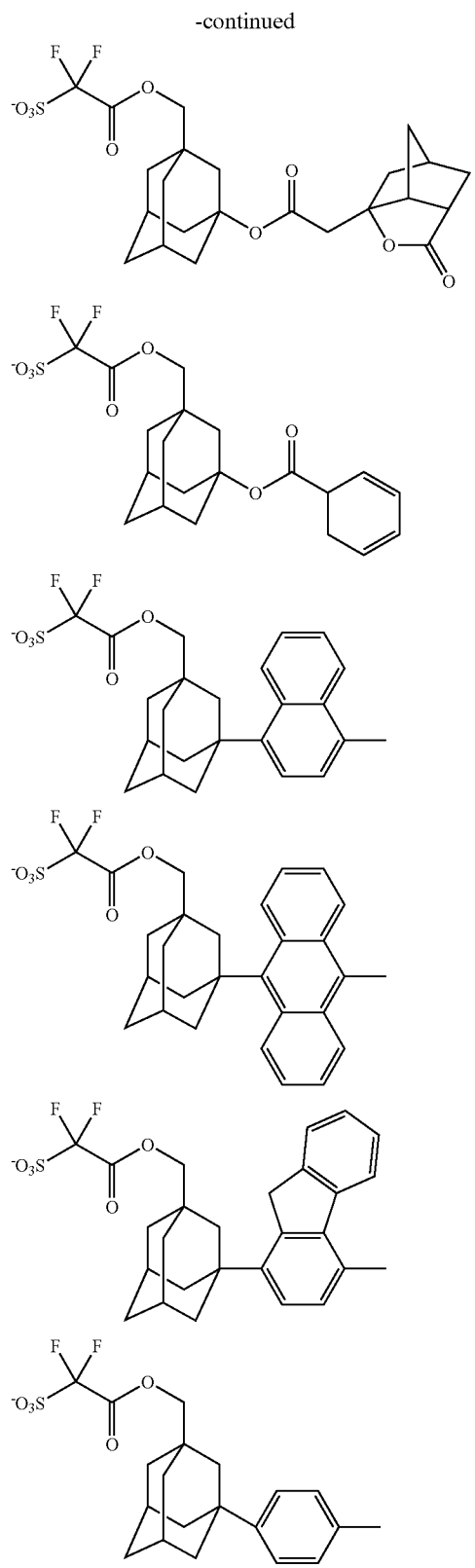
-continued
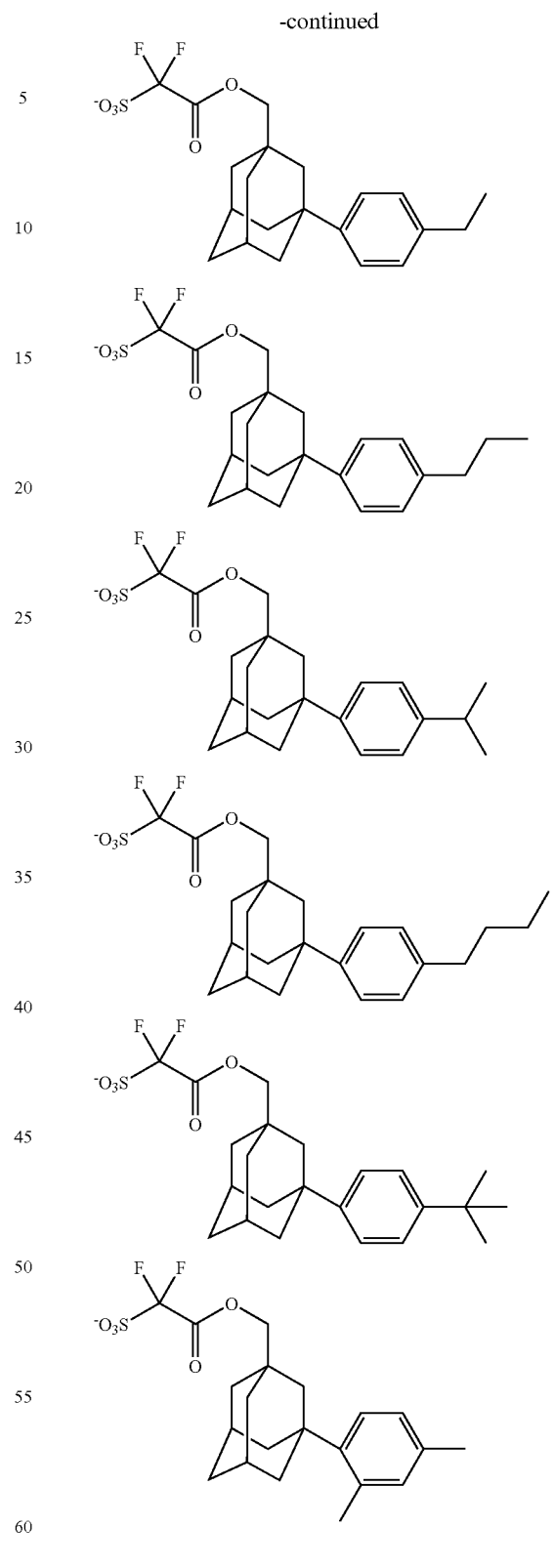

-continued
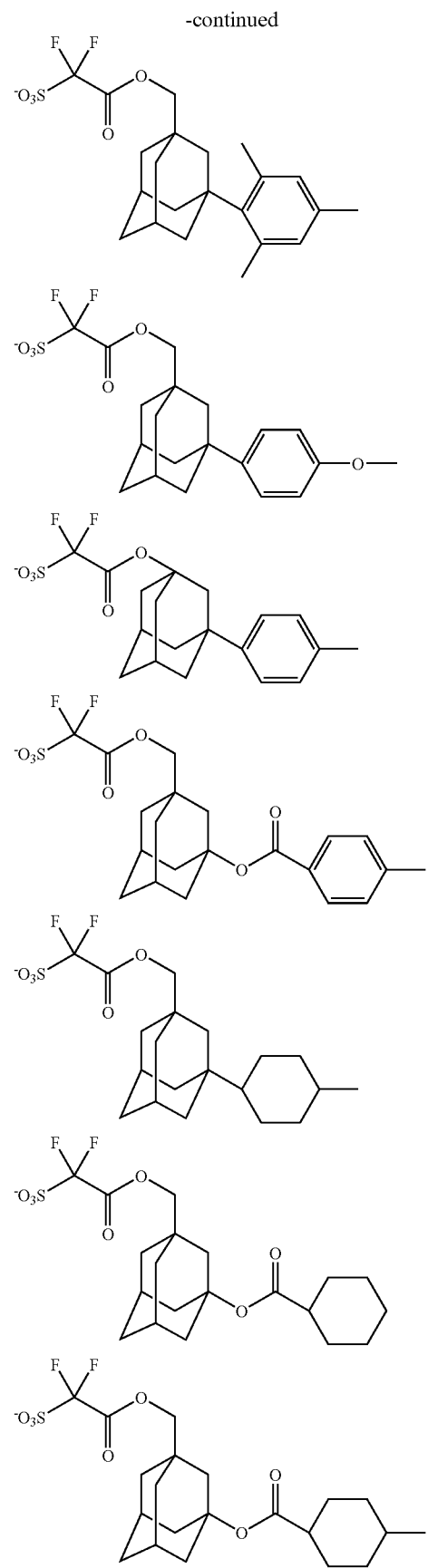
-continued
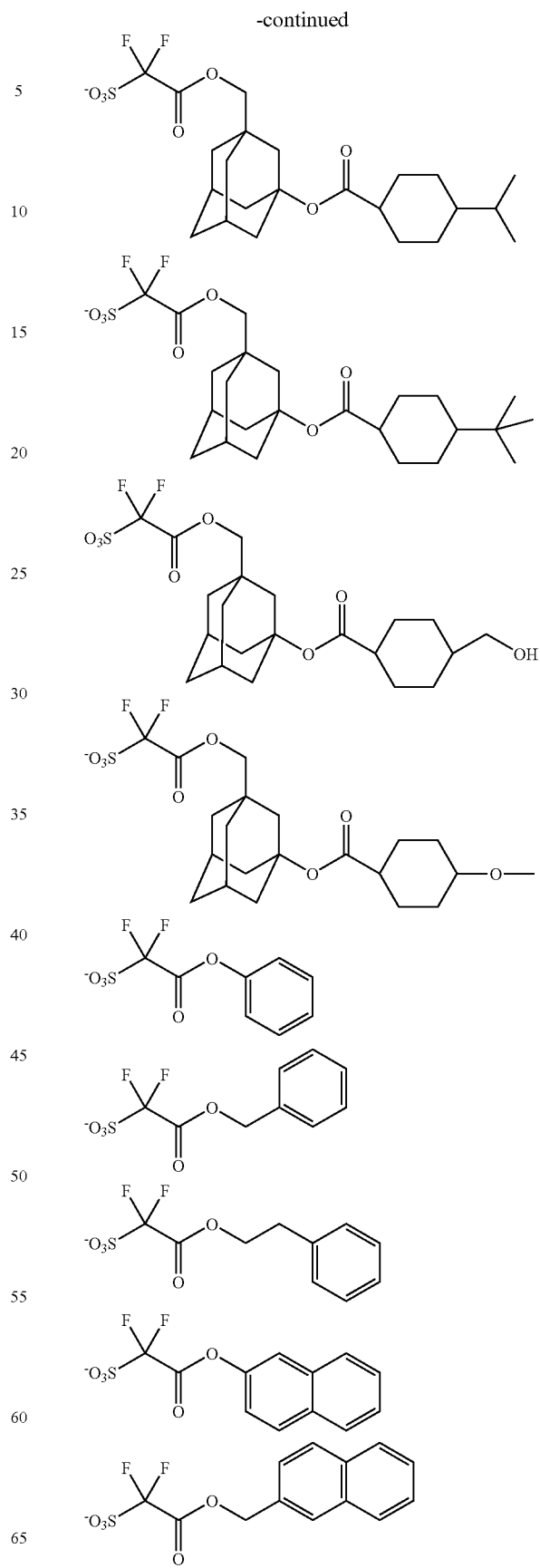

-continued
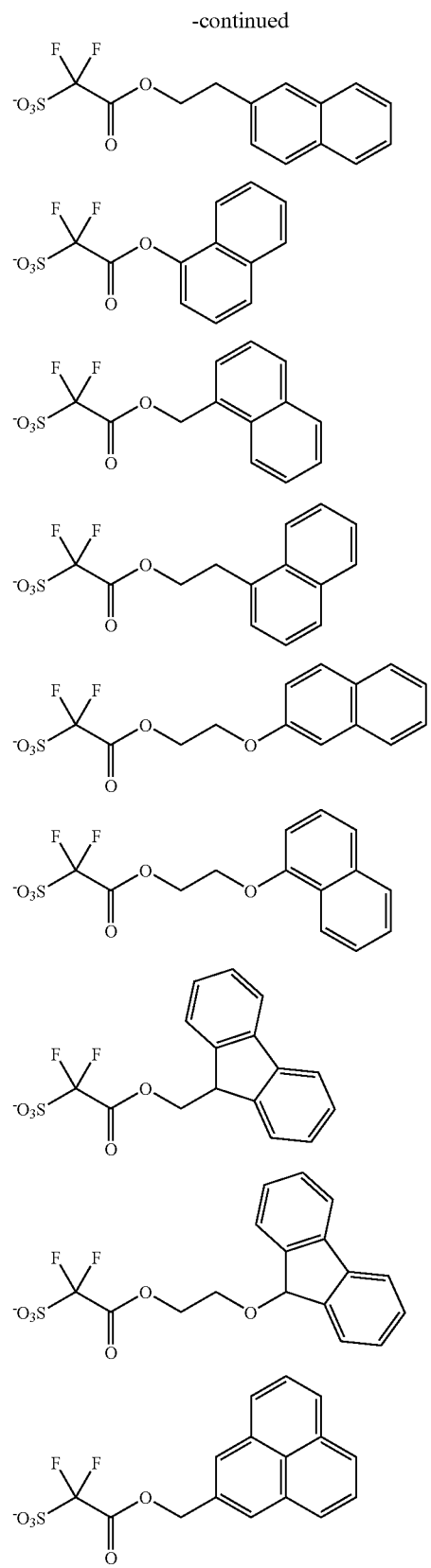
-continued
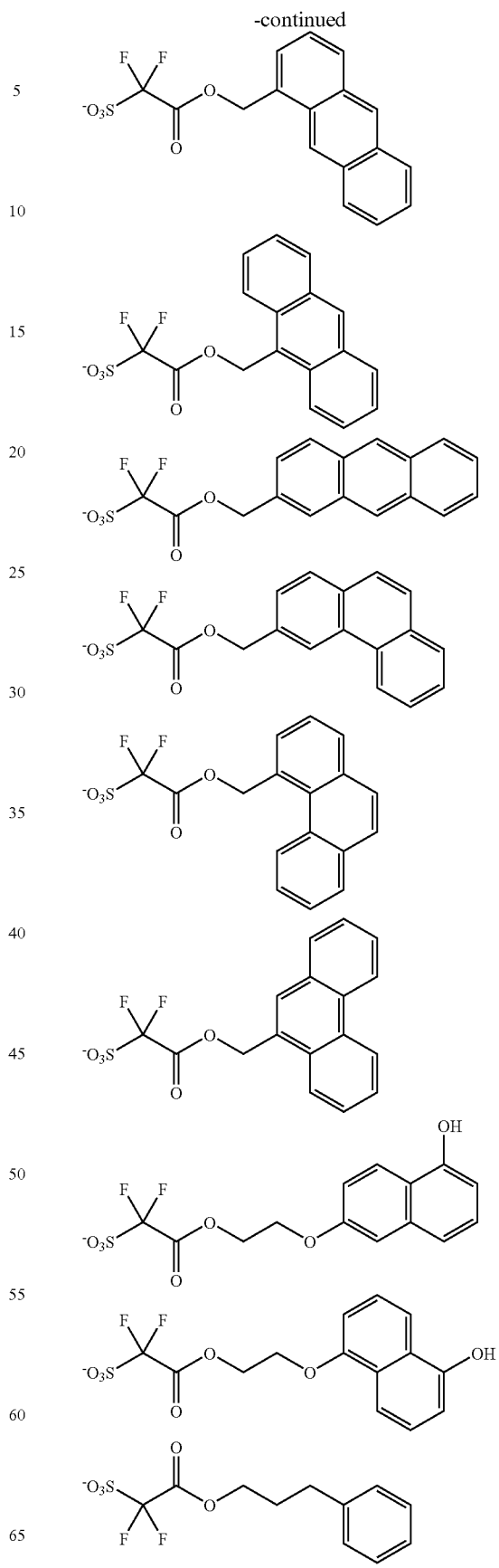

-continued

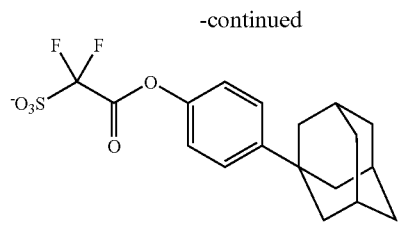

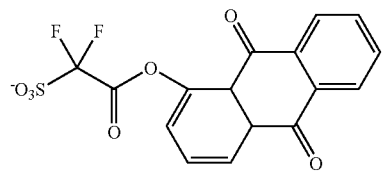

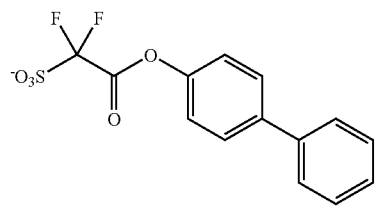

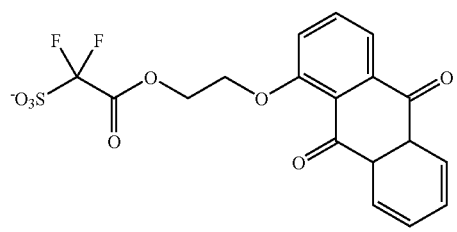

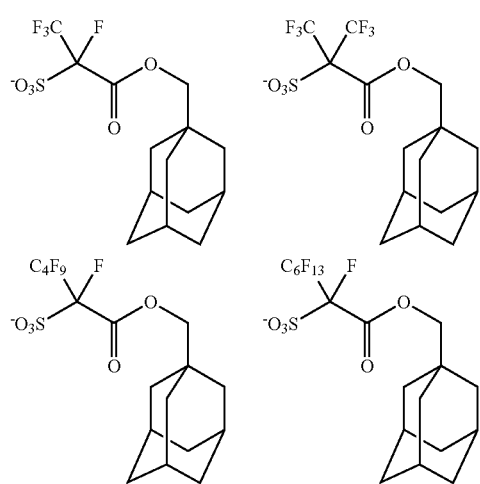

In the Salt (II), A⁺ represents an organic counter ion. Examples of the organic counter ion include a cation represented by the formula (VIIIa):

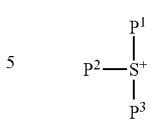
(VIIIa)

wherein $P^1$, $P^2$ and $P^3$ each independently represent a C1-C30 alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group (hereinafter, simply referred to as the cation (VIIIa)), a cation represented by the formula (VIIIb):

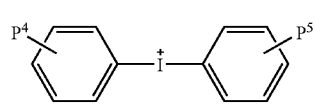
(VIIIb)

wherein $P^4$ and $P^5$ each independently represent a hydrogen atom, a hydroxyl group, a C1-C12 alkyl group or a C1-C12 alkoxy group (hereinafter, simply referred to as the cation (VIIIb)), a cation represented by the formula (VIIIc):

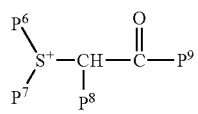
(VIIIc)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent S⁺, and at least one —CH₂— in the divalent acyclic hydrocarbon group may be substituted with —CO—, —O— or —S—, $P^8$ represents a hydrogen atom, $P^9$ represents a C1-C12 alkyl group, a C3-C12 cycloalkyl group or an aromatic group which may be substituted, or $P^8$ and $P^9$ are bonded to form a divalent acyclic hydrocarbon group which forms a 2-oxo-cycloalkyl group together with the adjacent —CHCO—, and at least one —CH₂— in the divalent acyclic hydrocarbon group may be replaced with —CO—, —O— or —S— (hereinafter, simply referred to as the cation (VIIIc)), and a cation represented by the formula (VIIId):

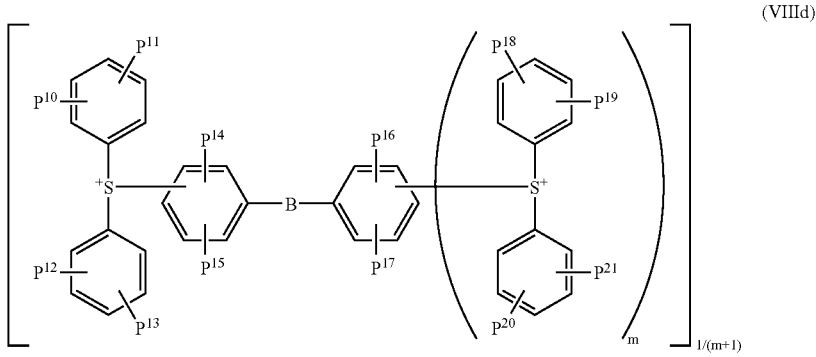

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent a hydrogen atom, a hydroxyl group, a C1-C12 alkyl group or a C1-C12 alkoxy group, B represents a sulfur or oxygen atom and m represents 0 or 1 (hereinafter, simply referred to as the cation (VIIId)).

Examples of the C1-C12 alkoxy group in the cations (VIIIa), (VIIIb) and (VIIId) include a methoxy, ethoxy, n-propoxy, isopropoxy, n-butoxy, isobutoxy, sec-butoxy, tert-butoxy, n-pentyloxy, n-hexyloxy, n-octyloxy and 2-ethylhexyloxy group.

Examples of the C3-C12 cyclic hydrocarbon group in the cation (VIIIa) include a cyclopentyl, cyclohexyl, 1-adamantyl, 2-adamantyl, phenyl, 2-methylphenyl, 4-methylphenyl, 1-naphthyl and 2-naphthyl group.

Examples of the C1-C30 alkyl group which may be substituted with at least one selected from the hydroxyl group, the C3-C12 cyclic hydrocarbon group and the C1-C12 alkoxy group in the cation (VIIIa) include a methyl, ethyl, n-propyl, isopropyl, n-butyl, isobutyl, sec-butyl, tert-butyl, n-pentyl, n-hexyl, n-octyl, 2-ethylhexyl and benzyl group.

Examples of the C3-C30 cyclic hydrocarbon group which may be substituted with at least one selected from the hydroxyl group and the C1-C12 alkoxy group in the cation (VIIIa) include a cyclopentyl, cyclohexyl, 1-adamantyl, 2-adamantyl, bicyclohexyl, phenyl, 2-methylphenyl, 4-methylphenyl, 4-ethylphenyl, 4-isopropylphenyl, 4-tert-butylphenyl, 2,4-dimethylphenyl, 2,4,6-trimethylphenyl, 4-n-hexylphenyl, 4-n-octylphenyl, 1-naphthyl, 2-naphthyl, fluorenyl, 4-phenylphenyl, 4-hydroxyphenyl, 4-methoxyphenyl, 4-tert-butoxyphenyl, 4-n-hexyloxyphenyl group.

Examples of the C1-C12 alkyl group in the cations (VIIIb), (VIIIc) and (VIIId) include a methyl, ethyl, n-propyl, isopropyl, n-butyl, isobutyl, sec-butyl, tert-butyl, n-pentyl, n-hexyl, n-octyl and 2-ethylhexyl group.

Examples of the C3-C12 cycloalkyl group in the cation (VIIIc) include a cyclopropyl, cyclobutyl, cyclopentyl, cyclohexyl, cycloheptyl, cyclooctyl and cyclodecyl group. Examples of the C3-C12 divalent acyclic hydrocarbon group formed by bonding $P^6$ and $P^7$ include a trimethylene, tetramethylene, pentamethylene group. Examples of the ring group formed together with the adjacent $S^+$ and the divalent acyclic hydrocarbon group include a tetramethylenesulfonio, pentamethylenesulfonio and oxybisethylenesulfonio group.

Examples of the aromatic group in the cation (VIIIc) include a phenyl, tolyl, xylyl, 4-n-butylphenyl, 4-isobutylphenyl, 4-tert-butylphenyl, 4-cyclohexylphenyl, 4-phenylphenyl and naphthyl group. The aromatic group may be substituted, and the examples of the substituents include a C1-C6 alkoxy group such as a methoxy, ethoxy, n-propoxy, n-butoxy, tert-butoxy and n-hexyloxy group; a C2-C12 acyloxy group such as an acetyloxy and 1-adamantylcarbonyloxy group; and a nitro group.

Examples of the divalent acyclic hydrocarbon group formed by bonding $P^8$ and $P^9$ include a methylene, ethylene, trimethylene, tetramethylene and pentamethylene group and examples of the 2-oxocycloalkyl group formed together with the adjacent —CHCO— and the divalent acyclic hydrocarbon group include a 2-oxocyclopentyl and 2-oxocyclohexyl group.

Examples of the cation (VIIIa) include the followings:

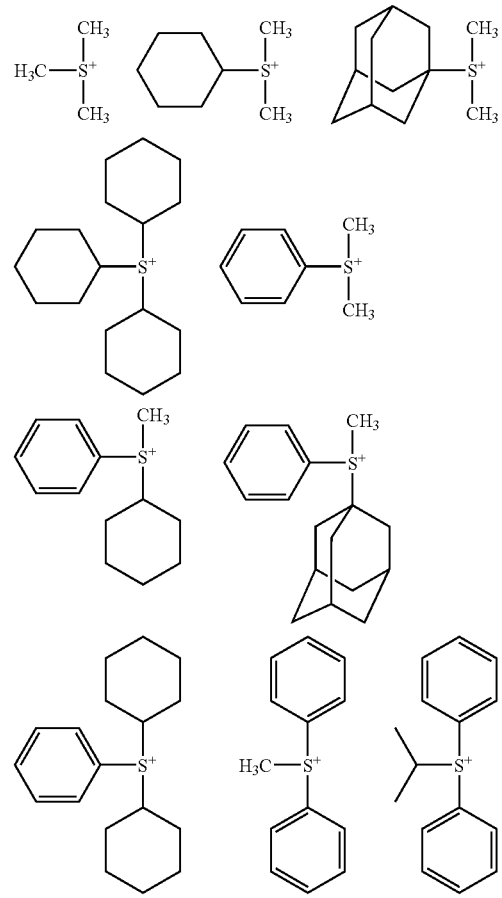

-continued
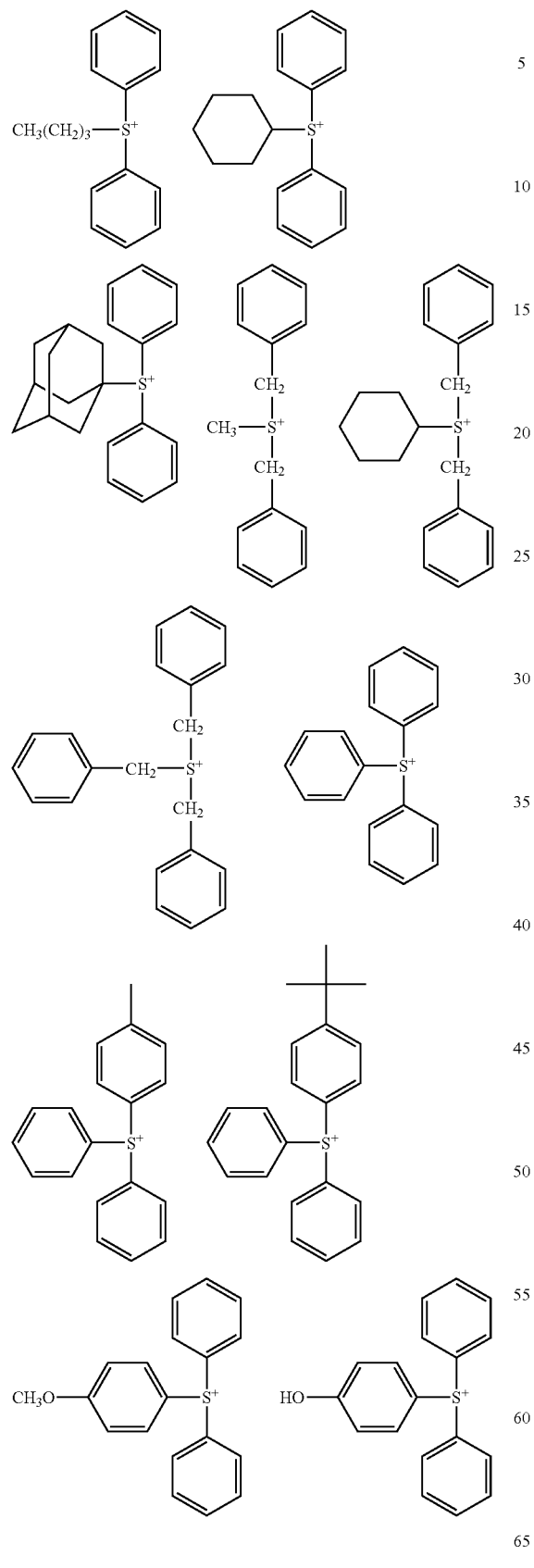
-continued
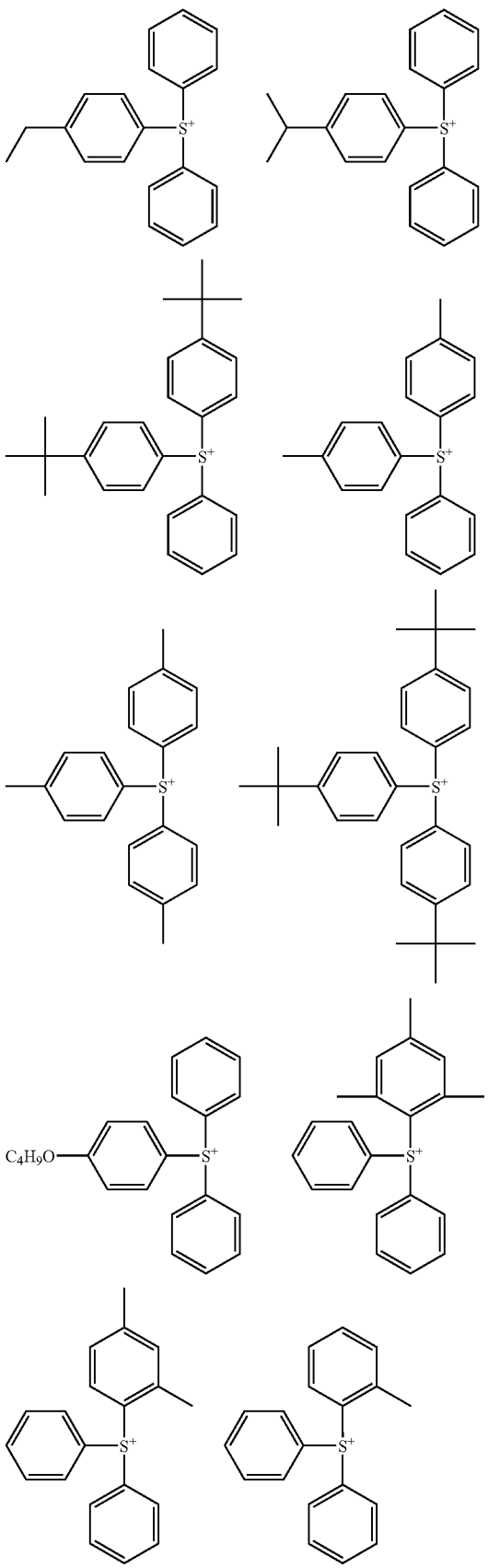

-continued
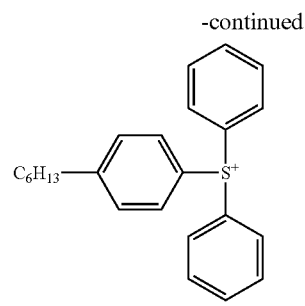
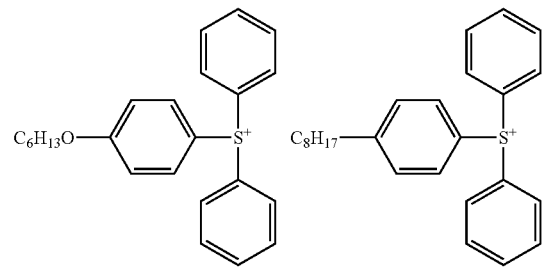
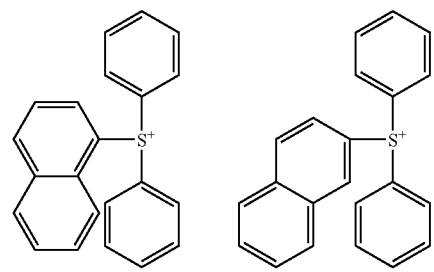
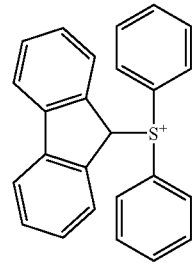
Specific examples of the cation (VIIIb) include the following:
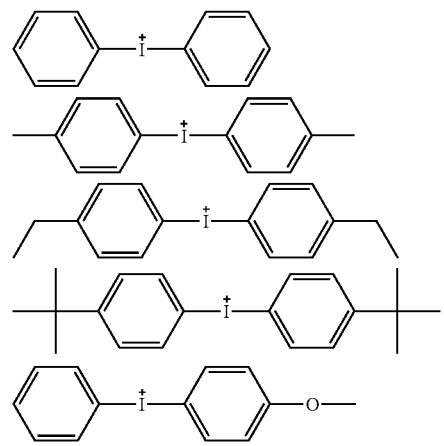
-continued
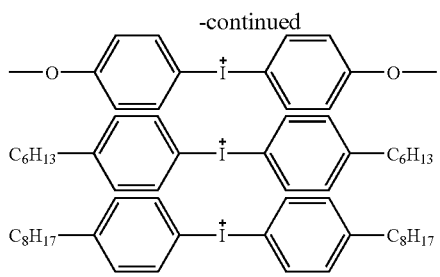
Specific examples of the cation (VIIIc) include the following:
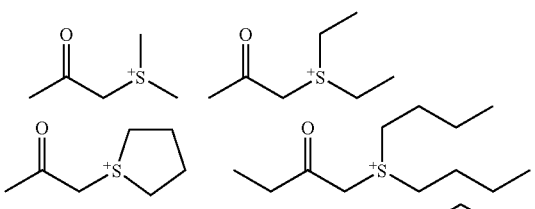
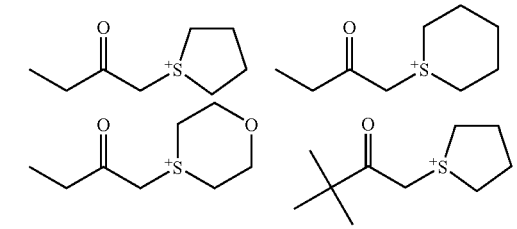
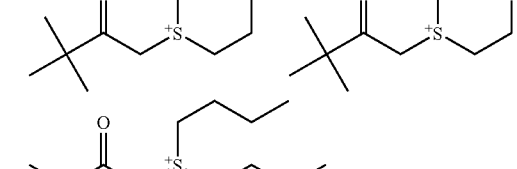
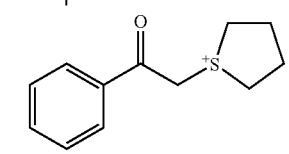
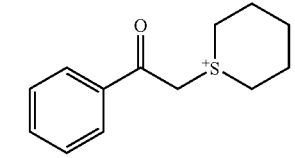
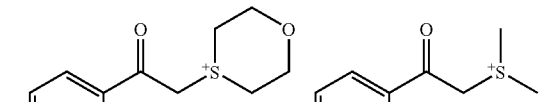
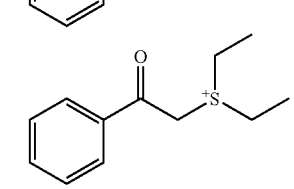

-continued
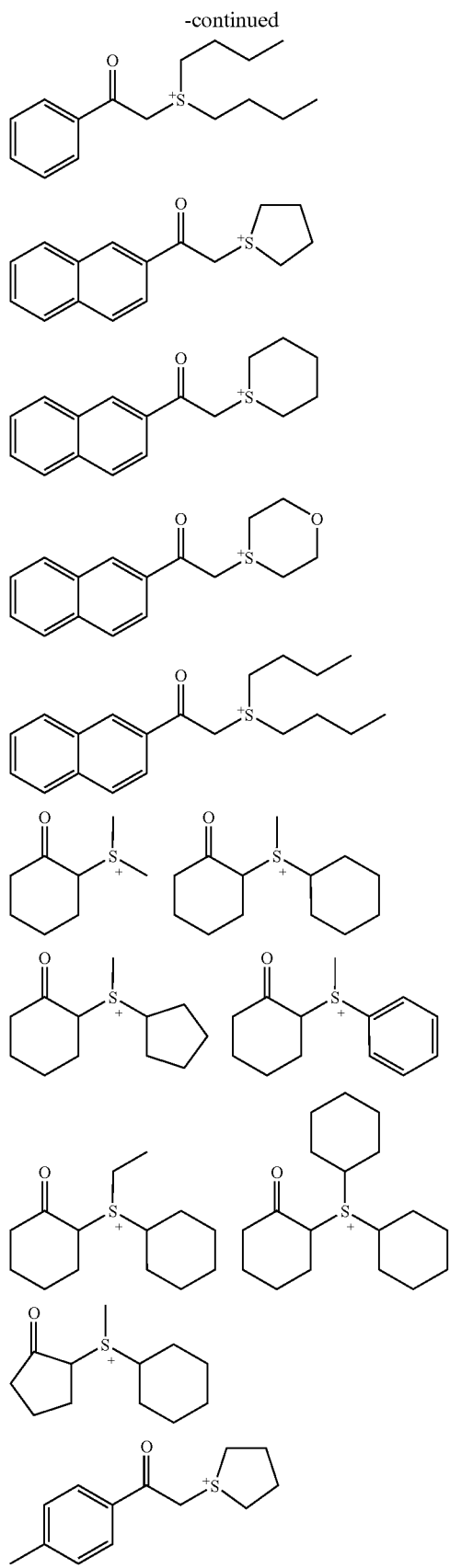
-continued
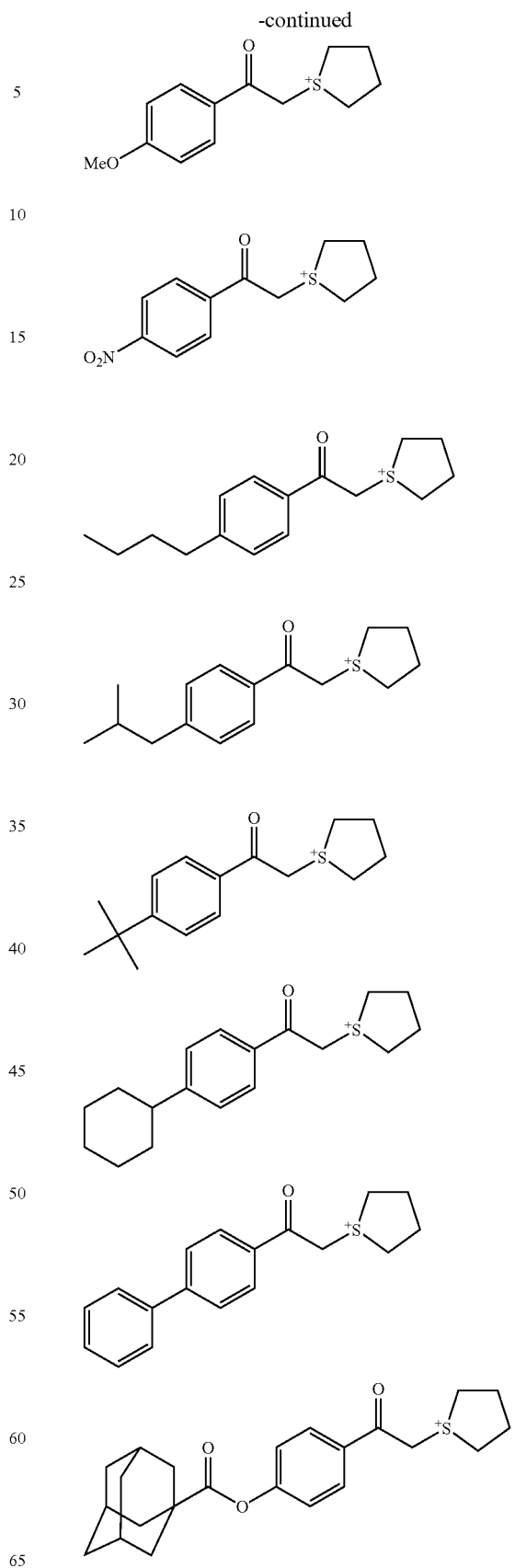

Specific examples of the cation (VIIId) include the following:
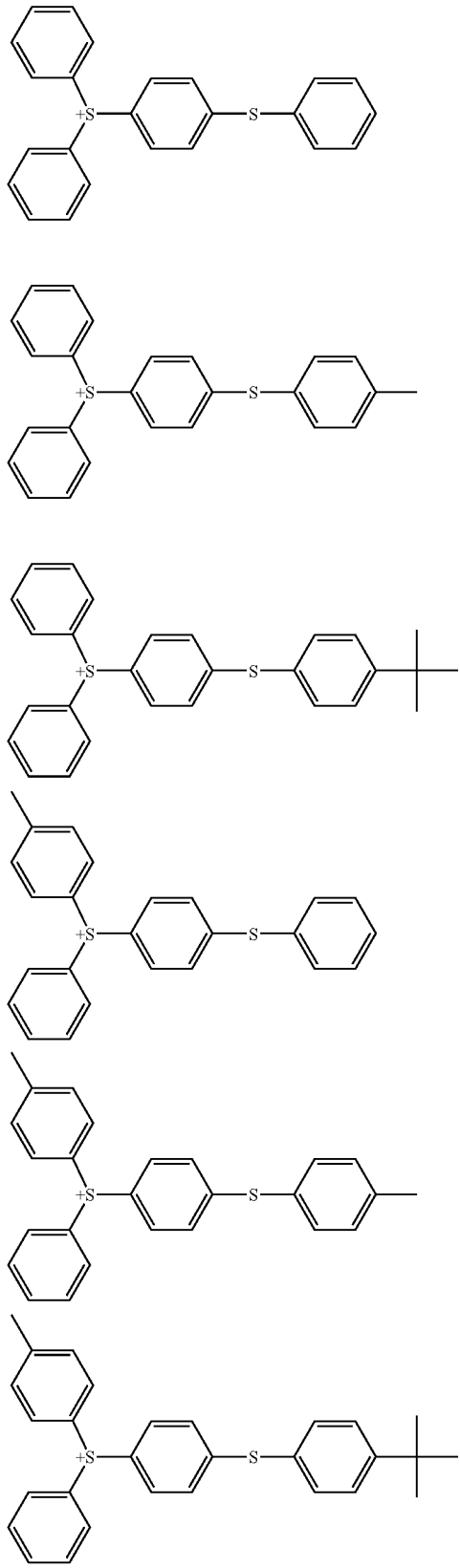
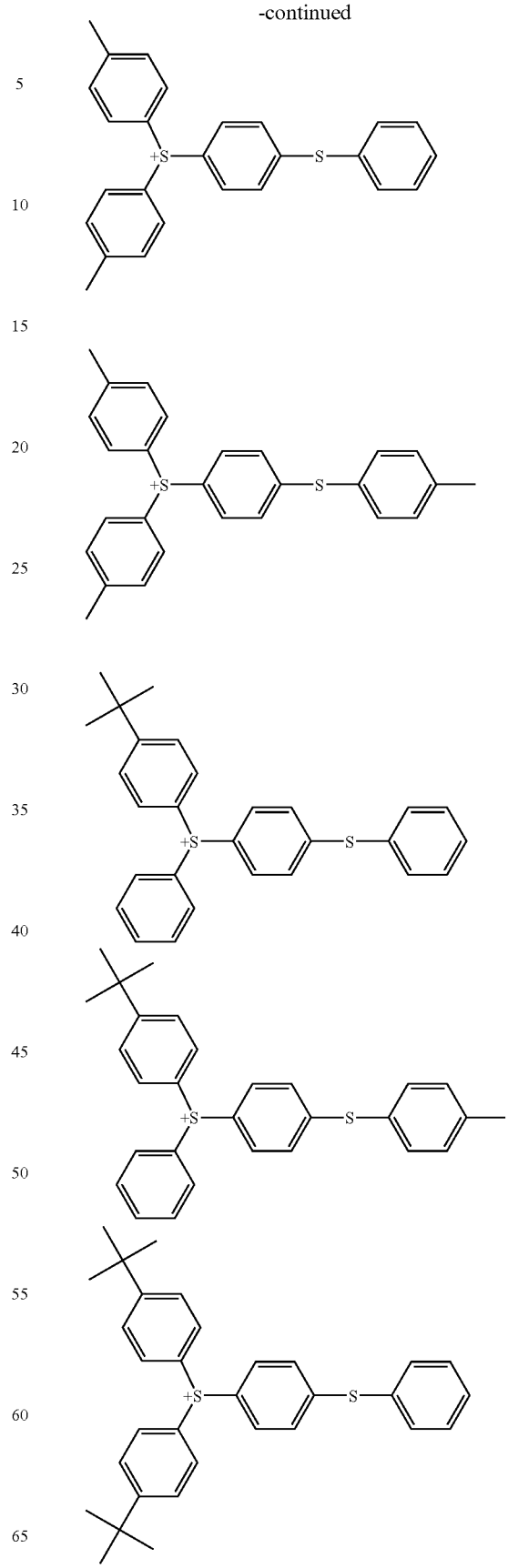

-continued
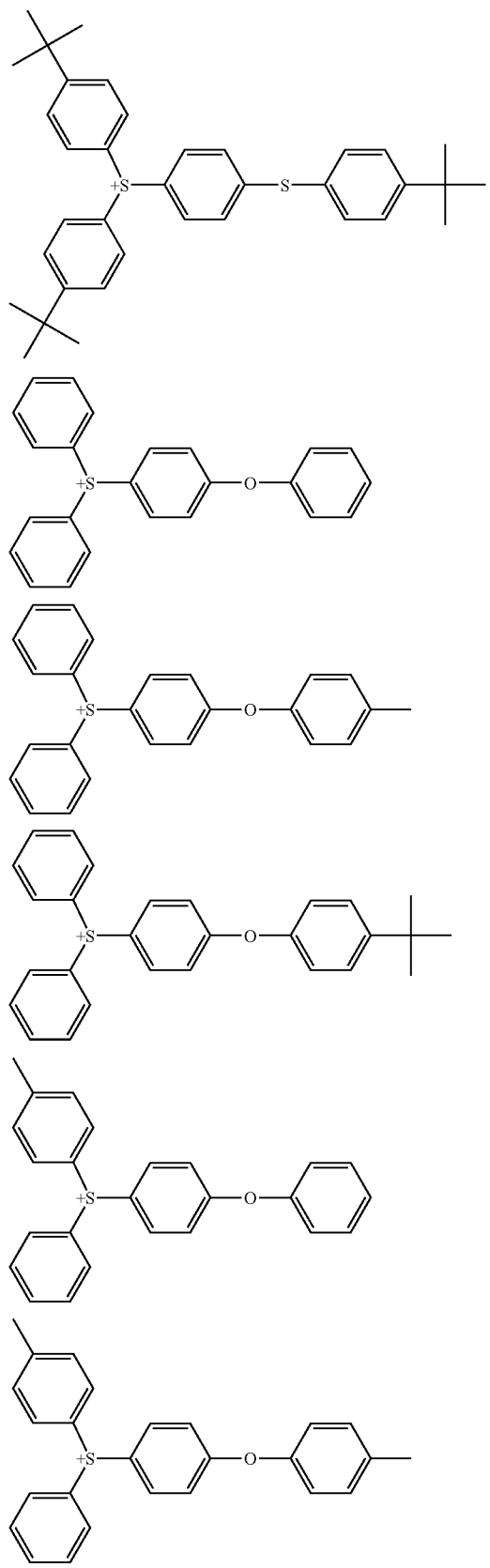
-continued
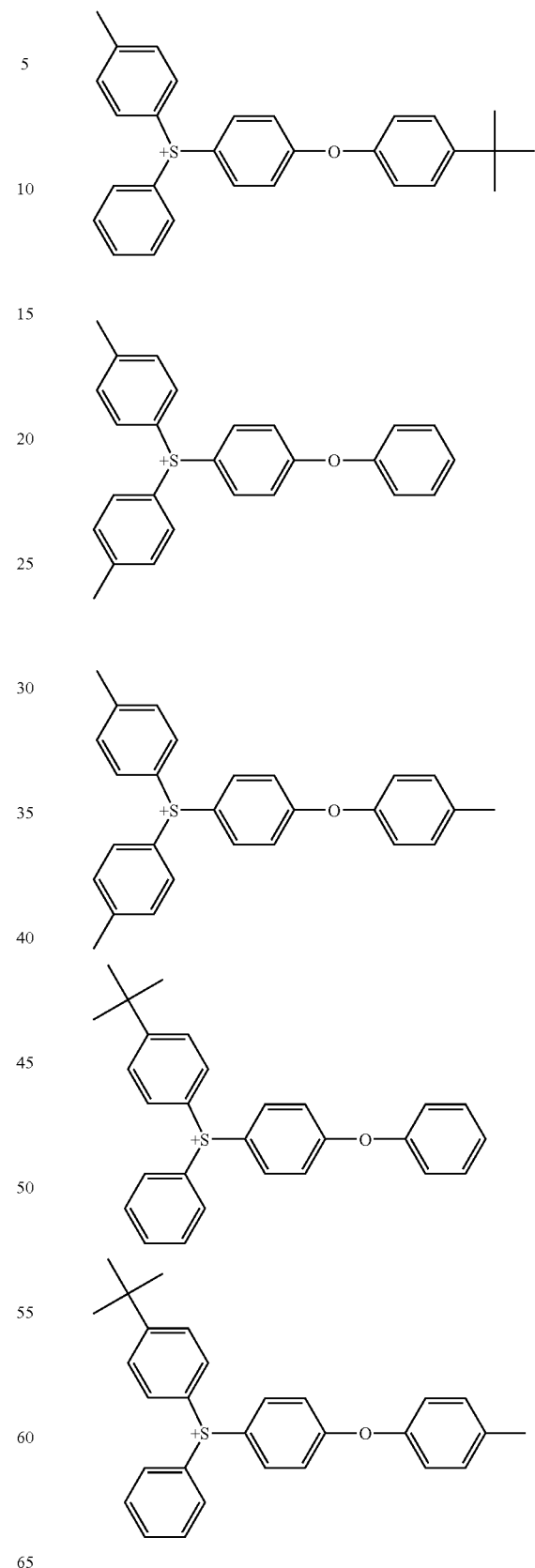

-continued
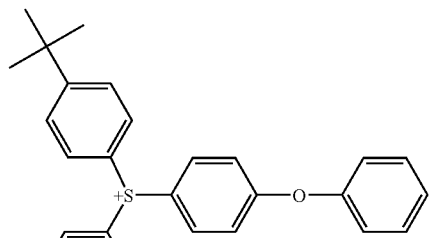
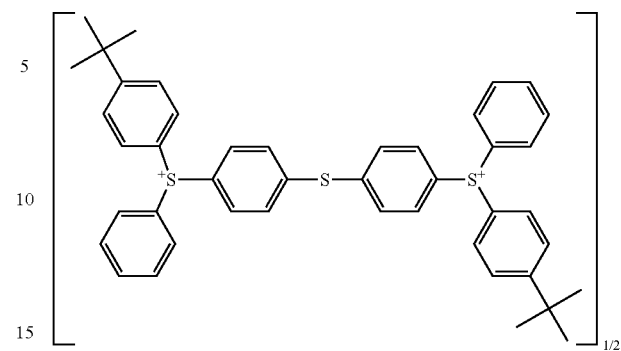
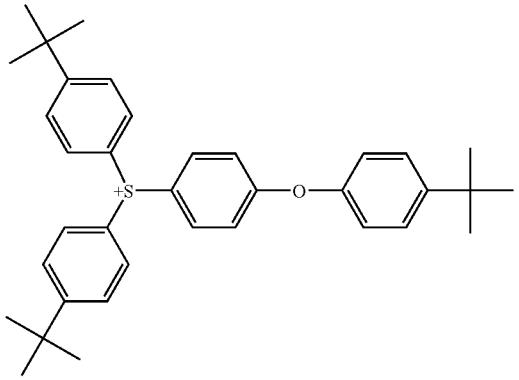
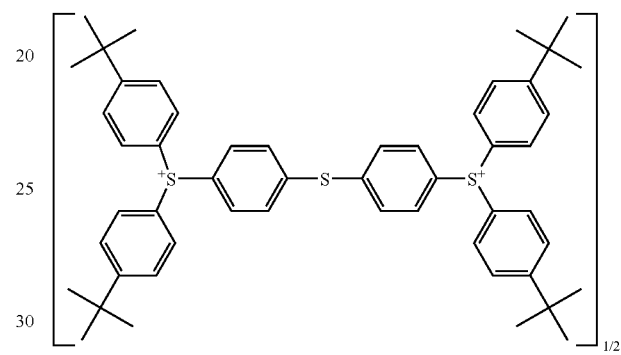
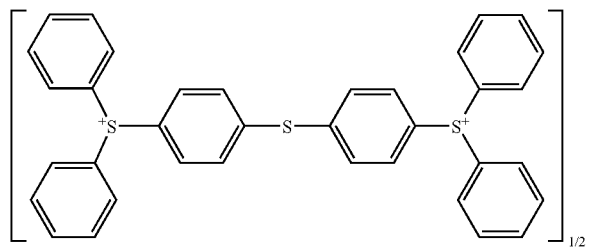
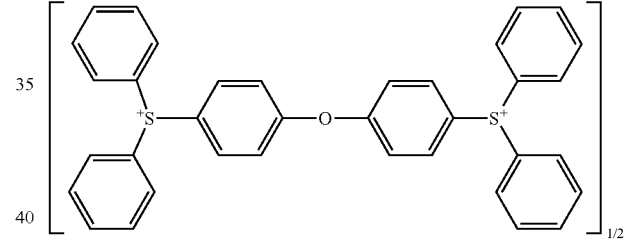
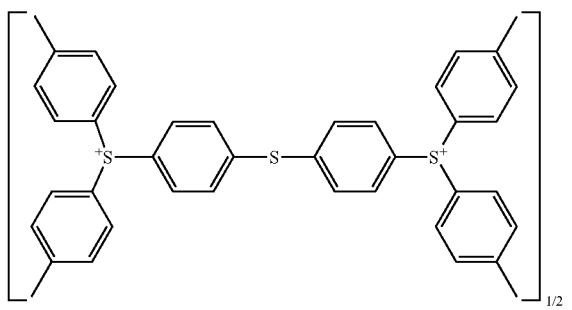
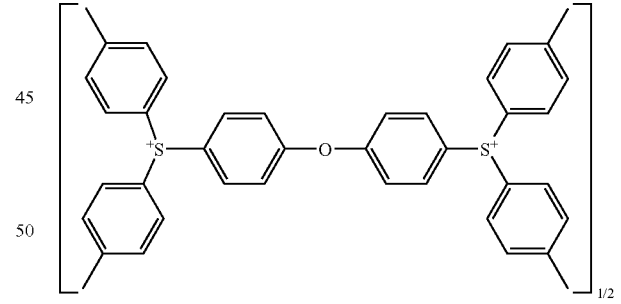
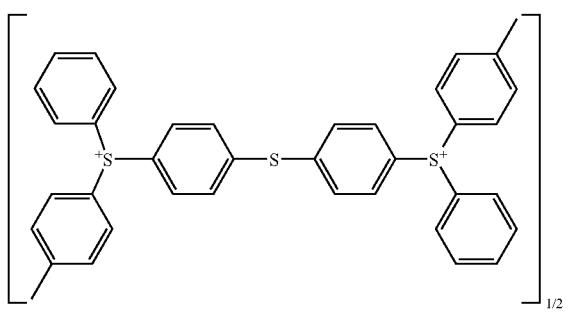
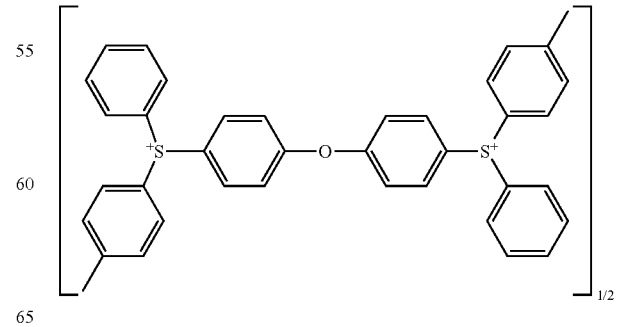

-continued

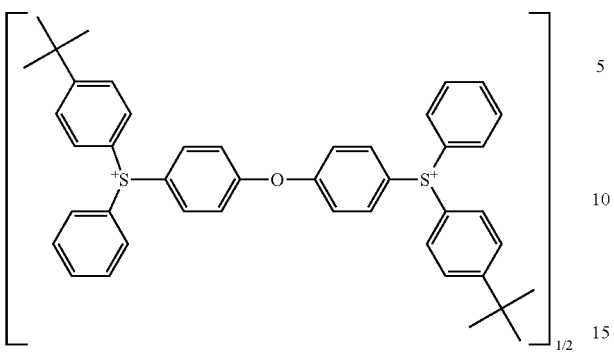

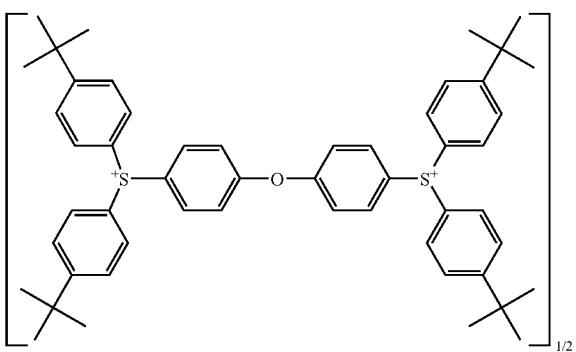

As the organic counter ion represented by $A^+$, the cations (VIIIa) and (VIIIc) are preferable.

As the organic counter ion represented by $A^+$, cations represented by the following formulae (VIIIe), (VIIIf), (VIIIg) and (VIIIj):

(VIIIe)

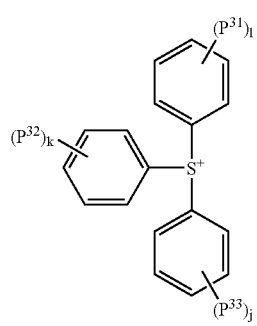

(VIIIf)

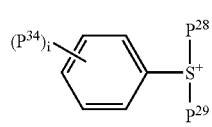

(VIIIg)

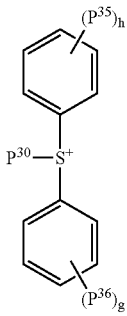

(VIIIj)

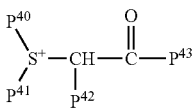

wherein $P^{28}$, $P^{29}$ and $P^{30}$ each independently represent a C1-C20 alkyl group or a C3-C30 cyclic hydrocarbon group except a phenyl group, and at least one hydrogen atom in the C1-C20 alkyl group may be substituted with a hydroxyl group, a C1-C12 alkoxy group or a C3-C12 cyclic hydrocarbon group and at least one hydrogen atom in the C3-C30 cyclic hydrocarbon group may be substituted with a hydroxyl group, a C1-C12 alkyl group or a C1-C12 alkoxy group, and $P^{31}$, $P^{32}$, $P^{33}$, $P^{34}$, $P^{35}$ and $P^{36}$ each independently represent a hydroxyl group, a C1-C12 alkyl group, a C1-C12 alkoxy group or a C3-C12 cyclic hydrocarbon group, and l, k, j, i, h and g each independently represent an integer of 0 to 5, $P^{40}$ and $P^{41}$ each independently represent a C1-C6 alkyl group or a C3-C6 cycloalkyl group, or $P^{40}$ and $P^{41}$ are bonded to form a C3-C7 divalent acyclic hydrocarbon group which forms the ring together with the adjacent $S^+$, $P^{42}$ represents a hydrogen atom, $P^{43}$ represents a C1-C6 alkyl group or a C6-C12 aromatic group which may be substituted with at least one selected from the C1-C6 alkoxy group, the C2-C12 acyl group and the nitro group, or $P^{42}$ and $P^{43}$ are bonded to form a C3-C7 divalent acyclic hydrocarbon group which forms a 2-oxocycloalkyl group together with the adjacent —CHCO—, and at least one —CH$_2$— in the C3-C7 divalent acyclic hydrocarbon group may be replaced with —CO—, —O— or —S—, are also preferable.

Examples of the C1-C20 alkyl group include a methyl, ethyl, n-propyl, isopropyl, n-butyl, tert-butyl, n-hexyl, n-octyl, n-decyl and n-icosyl group.

Examples of the C1-C12 alkoxy group and the C3-C30 cyclic hydrocarbon group include the same groups as mentioned above.

Examples of the C1-C12 alkyl group include a methyl, ethyl, n-propyl, isopropyl, n-butyl, tert-butyl, n-hexyl, n-octyl and n-decyl group, and examples of the C3-C12 cyclic hydrocarbon group include cyclopentyl, cyclohexyl and cyclooctyl group.

Examples of the C1-C6 alkyl group include a methyl, ethyl, n-propyl, isopropyl, n-butyl, tert-butyl and n-hexyl group, and examples of the C3-C6 cycloalkyl group include a cyclobutyl, cyclopentyl and cyclohexyl group.

Examples of the C3-C7 divalent acyclic hydrocarbon group formed by bonding $P^{40}$ and $P^{41}$ include a trimethylene, tetramethylene and pentamethylene group. Examples of the C3-C7 divalent acyclic hydrocarbon group formed by bonding $P^{42}$ and $P^{43}$ include the same groups as mentioned in the above.

Examples of the C6-C12 aromatic group include a phenyl, naphthyl, 4-methylphenyl, 4-ethylphenyl, 4-n-butylphenyl, 4-sec-butylphenyl, 4-isobutylphenyl, 4-tert-butylphenyl, 4-cyclohexylphenyl and 4-phenylphenyl group.

As the organic counter ion represented by $A^+$, cations represented by the formulae (VIIIh) and (VIIIk):

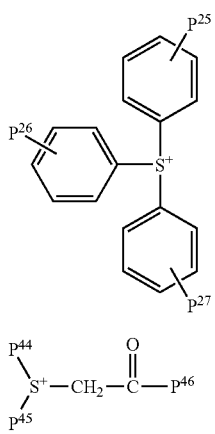

(VIIIh)

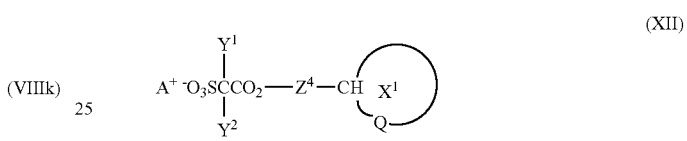

(VIIIk)

wherein $P^{25}$, $P^{26}$ and $P^{27}$ each independently represent a hydrogen atom, a hydroxyl group, a C1-C12 alkyl group or a C1-C12 alkoxy group, $P^{44}$ and $P^{45}$ are bonded to form a C3-C7 divalent acyclic hydrocarbon group which forms the ring together with the adjacent $S^+$, $P^{46}$ represents a phenyl or naphthyl group, are more preferable, and cations represented by the formulae (VIIIi) and (VIIIl):

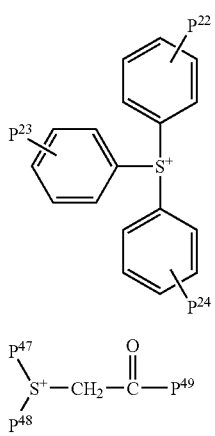

(VIIIi)

(VIIIl)

wherein $P^{22}$, $P^{23}$ and $P^{24}$ each independently represent a hydrogen atom or a C1-C4 alkyl group, $P^{47}$ and $P^{48}$ are bonded to form a C4-C5 divalent acyclic hydrocarbon group which forms the ring together with the adjacent $S^+$, $P^{49}$ represents a phenyl group, are especially preferable.

Examples of the alkyl group and the alkoxy group include the same groups as mentioned above.

As the Salt (II), the salt represented by the formula (VII):

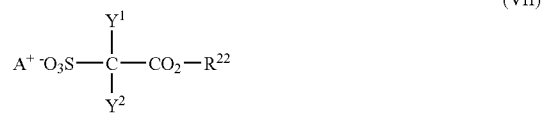

(VII)

wherein $A^+$, $Y^1$ and $Y^2$ are the same meanings as defined above, and $R^{22}$ represents a C1-C20 linear or branched chain hydrocarbon group which may be substituted or a C3-C30 cyclic hydrocarbon group which may be substituted, and at least one —$CH_2$— in the C1-C20 linear or branched chain hydrocarbon group or the C3-C30 cyclic hydrocarbon group may be substituted with —CO— or —O—, is preferable.

As the Salt (II), the salt represented by the following formula (XII):

$$A^+ \ {}^-O_3S\overset{Y^1}{\underset{Y^2}{C}}CO_2-Z^4-CH\underset{Q}{\overset{X^1}{\diagup}}$$

(XII)

wherein $A^+$, $Y^1$ and $Y^2$ are the same as defined above, $Z^4$ represents a single bond or a C1-C4 alkylene group, Q represents —$CH_2$—, —CO— or —CH(OH)— and ring $X^1$ represents a C3-C30 monocyclic or polycyclic hydrocarbon group in which two hydrogen atoms are substituted with =O at Q position when Q is —CO— or in which a hydrogen atom is substituted with a hydroxyl group at Q position when Q is —CH(OH)—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group, is more preferable.

Examples of the C1-C6 alkyl group, the C1-C6 alkoxy group, the C1-C4 perfluoroalkyl group and the C1-C6 hydroxyalkyl group include the same groups as described above, respectively.

Examples of the C1-C4 alkylene group include a methylene, ethylene, trimethylene and tetramethylen group. It is preferred that $Z^4$ represents the single bond, the methylene group or the ethylene group, and it is more preferred that $Z^4$ represents the single bond or the methylene group.

Examples of the ring $X^1$ include a C4-C8 cycloalkyl group such as a cyclobutyl, cyclopentyl, cyclohexyl and cyclooctyl group, an adamanthyl group, and a norbornyl group, in which a hydrogen atom may be substituted with a hydroxyl group or in which two hydrogen atoms may be substituted with =O, and in which at least one hydrogen atom may be substituted with the C1-C6 alkyl group, the C1-C6 alkoxy group, the C1-C4 perfluoroalkyl group, the C1-C6 hydroxyalkyl group, the hydroxyl group or the cyano group.

Specific examples of the ring $X^1$ include a cyclobutyl group, a cyclopentyl group, a cyclohexyl group, a cyclooctyl group, an adamanthyl group, a norbornyl group, a 2-oxocyclopentyl group, a 2-oxocyclohexyl group, a 3-oxocyclopentyl group, a 3-oxocyclohexyl group, a 4-oxocyclohexyl group, a 2-hydroxycyclopentyl group, a 2-hydroxycyclohexyl group, a 3-hydroxycyclopentyl group, a 3-hydroxycyclohexyl group, a 4-hydroxycyclohexyl group, a 4-oxo-2-adamantyl group, a 3-hydroxy-1-adamantyl group, a 4-hydroxy-1-adamantyl group, a 5-oxonorbornan-2-yl group, a 1,7,7-trimethyl-2-oxonorbornan-2-yl group, a 3,6,6-trimethyl-2-oxo-bicyclo[3.1.1]heptan-3-yl group, a 2-hydroxy-norbornan-3-yl group, a 1,7,7-trimethyl-2-hydroxynorbornan-3-yl group, a 3,6,6-trimethyl-2-hydroxybicyclo[3.1.1]heptan-3-yl group, and the following groups (in the following formulae, straight line with an open end shows a bond which is extended from an adjacent group).

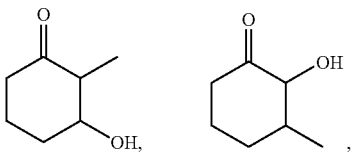

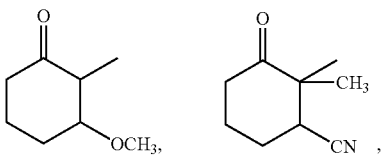

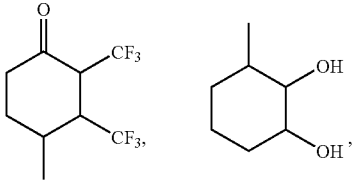

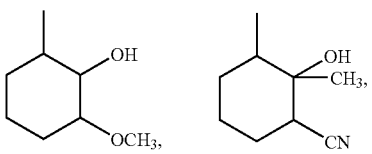

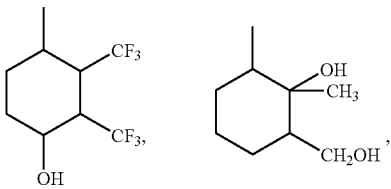

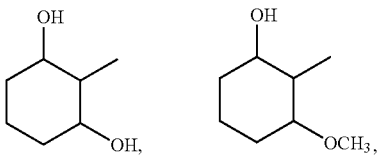

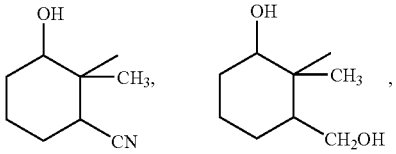

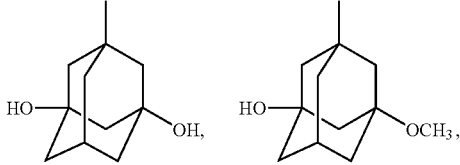

As the Salt (II), salts represented by the formula (XIII):

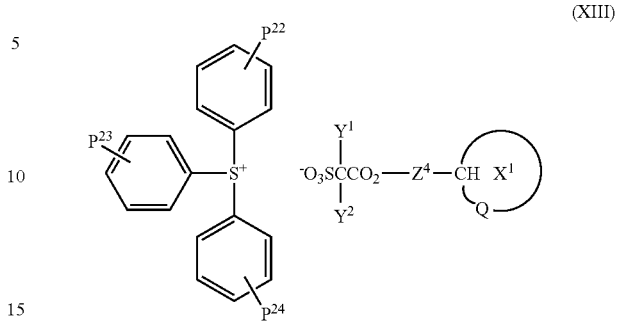

(XIII)

wherein $P^{22}$, $P^{23}$, $P^{24}$, $Y^1$, $Y^2$, $X^1$, Q and $Z^4$ are the same as defined above, and the formula (XIV):

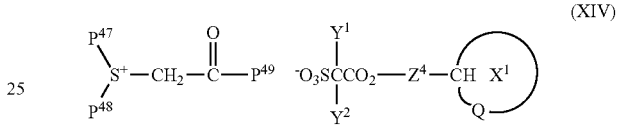

(XIV)

wherein $P^{47}$, $P^{48}$, $P^{49}$, $Y^1$, $Y^2$, $X^1$, Q and $Z^4$ are the same as defined above, are preferable.

In the Salt (III), $R^{23}$ represents a C1-C8 linear or branched chain perfluoroalkyl group and $A'^{+}$ represents an organic counter ion.

Examples of the C1-C8 linear or branched chain perfluoroalkyl group include a trifluoromethyl, pentafluoroethyl, heptafluoropropyl, nonafluorobutyl and heptadecafluorooctyl group.

Examples of the organic counter ion represented by $A'^{+}$ include the same cations as mentioned as $A^+$. It is preferred that $A'^{+}$ is a cation (VIIIa) or (VIIIc), and it is more preferred that $A'^{+}$ is a cation (VIIIh) or (VIIIk), and it is especially preferred that $A'^{+}$ is a cation (VIIIi) or (VIIIl).

The Salt (II) can be produced by a process comprising reacting a salt represented by the formula (XV):

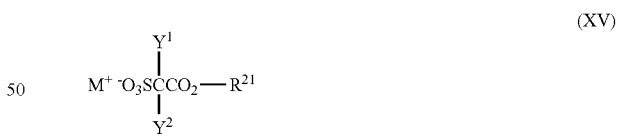

(XV)

wherein M represents Li, Na, K or Ag, and $Y^1$, $Y^2$ and $R^{21}$ are the same meanings as defined above (hereinafter, simply referred to as the salt (XV)), with a compound represented by the formula (XVI):

(XVI)

wherein $A^+$ is the same meaning as defined above, and G represents F, Cl, Br, I, $BF_4$, $AsF_6$, $SbF_6$, $PF_6$ or $ClO_4$ (hereinafter, simply referred to as the compound (XVI)).

The reaction of the salt (XV) and the compound (XVI) is usually conducted in an inert solvent such as acetonitrile, water, methanol and dichloromethane, at a temperature of about 0 to 150° C., preferably of 0 to 100° C., with stirring.

The amount of the compound (XVI) is usually 0.5 to 2 moles per 1 mole of the salt (XV). The Salt (II) obtained by the process above can be isolated by recrystallization, and can be purified by washing with water.

The Salt (III) can be produced by a process comprising reacting a salt of the formula (XVII):

$$M'^{+-}O_3S-R^{23} \quad (XVII)$$

wherein M' represents H, Li, Na, K or Ag, and $R^{23}$ is the same meanings as defined above (hereinafter, simply referred to as the salt (XVII)), with a compound of the formula (XVIII):

$$A'^{+-}G' \quad (XVIII)$$

wherein $A'^+$ is the same meaning as defined above, and G' represents F, Cl, Br, I, $BF_4$, $AsF_6$, $SbF_6$, $PF_6$ or $ClO_4$ (hereinafter, simply referred to as the compound (XVIII)).

The reaction of the salt (XVII) and the compound (XVIII) is usually conducted in an inert solvent such as acetonitrile, water, methanol and dichloromethane, at a temperature of about 0 to 150° C., preferably of 0 to 100° C., with stirring.

The amount of the compound (XVIII) is usually 0.5 to 2 moles per 1 mole of the salt (XVII). The Salt (III) obtained by the process above can be isolated by recrystallization, and can be purified by washing with water.

The Salt (II) and the Salt (III) are usually used as an acid generator, and the acid generated by irradiation to the Salt (II) and the Salt (III) catalytically acts against acid-labile groups in RESIN, cleaves the acid-labile-group, and RESIN becomes soluble in an alkali aqueous solution. Such a composition is suitable for chemically amplified positive resist composition.

As the present resist composition, a resist composition comprising the Salt (II) and at least one salt selected from the Salt (II) and the Salt (III) is preferable, and a resist composition comprising at least two salts selected from the Salt (II) is more preferable.

When the present resist composition comprises the Salt (II) and the Salt (III), $A^+$ of the Salt (II) and $A'^+$ of the Salt (III) may be same and may be different each other.

When the present resist composition comprises at least two kinds of the Salt (II), they may have same $A^+$ and different anion parts, or they may have different $A^+$ and same anion parts.

When the present resist composition comprises at least two kinds of the Salt (III), they may have same $A'^+$ and different anion parts, or they may have different $A'^+$ and same anion parts.

The present resist composition preferably comprises at least two salts selected from the Salt (II) wherein $A^+$ is the cation (VIIIa) or (VIIIc) and the Salt (III) wherein $A'^+$ is the cation (VIIIa) or (VIIIc).

It is more preferred that the present resist composition comprises the Salt (II) wherein $A^+$ is the cation (VIIIa) and at least one salt selected from the Salt (II) and the Salt (III).

As the present resist composition, a resist composition comprising the Salt (II) wherein $A^+$ is the cation (VIIIa) and at least one salt selected from the Salt (II) wherein $A^+$ is the cation (VIIIa) or (VIIIc) and the Salt (III) wherein $A'^+$ is the cation (VIIIa) or (VIIIc) is more preferable, and a resist composition comprising the Salt (II) wherein $A^+$ is the cation (VIIIa) and at least one salt selected from the Salt (II) wherein $A^+$ is the cation (VIIIc) and the Salt (III) wherein $A'^+$ is the cation (VIIIa) is especially preferable.

The present resist composition preferably includes 80 to 99.9% by weight of the resin component and 0.1 to 20% by weight of the sum of the Salt (II) and the Salt (III) based on the total amount of the resin component, the Salt (II) and the Salt (III).

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

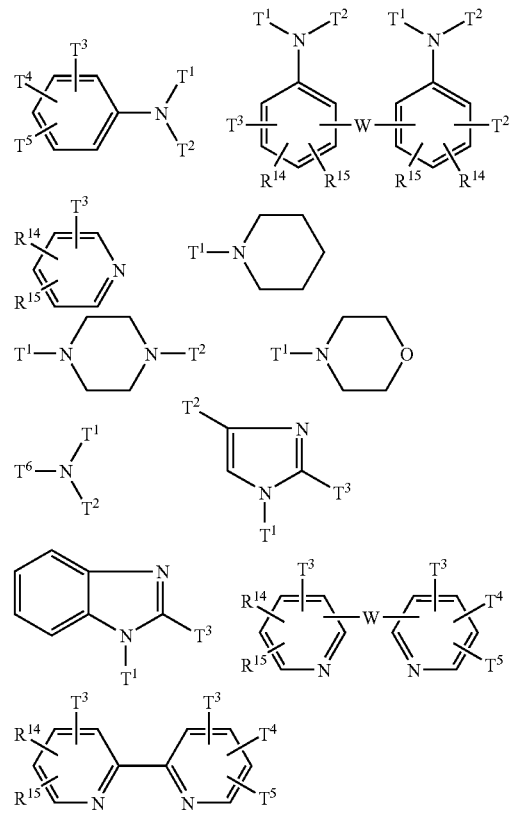

wherein $T^1$ and $T^{12}$ independently represent a hydrogen atom, an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group which may be substituted with a C1-C6 alkoxy group, $T^3$ and $T^4$ independently represent a hydrogen atom, an alkyl group, a cycloalkyl group, an aryl group or an alkoxy group, and the alkyl, cycloalkyl, aryl and alkoxy group may be substituted with at least one group selected from a hydroxyl group, an amino group which may be substituted with a C1-C4 alkyl group and a C1-C6 alkoxy group, or $T^3$ and $T^4$ bond together with the carbon atoms to which they bond to form an aromatic ring, $T^5$ represent a hydrogen atom, an alkyl group, a cycloalkyl group, an aryl group, an alkoxy group or a nitro group, and the alkyl, cycloalkyl, aryl and alkoxy groups which may be substituted with at least one group selected from a hydroxyl group, an amino group which may be substituted with a C1-C4 alkyl group and a C1-C6 alkoxy group, $T^6$ represents an alkyl or cycloalkyl group, and the alkyl and cycloalkyl group may be substituted with at least one group selected from a hydroxyl group, an amino group which may be substituted with a C1-C4 alkyl group and a C1-C6 alkoxy group, and W represents —CO—, —NH—, —S—, —S—S—, an alkylene group of which at least one methylene group may be replaced with —O—, or an alkenylene group of which at least one methylene group may be replaced with —O—, and a quaternary ammonium hydroxide represented by the following formula:

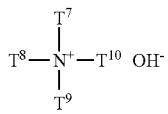

wherein $T^7$, $T^8$, $T^9$ and $T^{10}$ independently represent an alkyl group, a cycloalkyl group or an aryl group, and the alkyl, cycloalkyl and aryl groups may be substituted with at least one group selected from a hydroxyl group, an amino group which may be substituted with a C1-C4 alkyl group and a C1-C6 alkoxy group.

The alkyl group in $T^1$, $T^2$, $T^3$, $T^4$, $T^5$, $T^6$, $T^7$, $T^8$, $T^9$ and $T^{10}$ preferably has about 1 to 10 carbon atoms, and more preferably has about 1 to 6 carbon atoms.

Examples of the amino group which may be substituted with the C1-C4 alkyl group include an amino, methylamino, ethylamino, n-butylamino, dimethylamino and diethylamino group. Examples of the C1-C6 alkoxy group which may be substituted with the C1-C6 alkoxy group include a methoxy, ethoxy, n-propoxy, isopropoxy, n-butoxy, tert-butoxy, n-pentyloxy, n-hexyloxy and 2-methoxyethoxy group.

Specific examples of the alkyl group which may be substituted with at least one group selected from a hydroxyl group, an amino group which may be substituted with a C1-C4 alkyl group, and a C1-C6 alkoxy group which may be substituted with a C1-C6 alkoxy group include a methyl, ethyl, n-propyl, isopropyl, n-butyl, tert-butyl, n-pentyl, n-hexyl, n-octyl, n-nonyl, n-decyl, 2-(2-methoxyethoxy)ethyl, 2-hydroxyethyl, 2-hydroxypropyl, 2-aminoethyl, 4-aminobutyl and 6-aminohexyl group.

The cycloalkyl group in $T^1$, $T^2$, $T^3$, $T^4$, $T^5$, $T^6$, $T^7$, $T^8$, $T^9$ and $T^{10}$ preferably has about 5 to 10 carbon atoms. Specific examples of the cycloalkyl group which may be substituted with at least one group selected from a hydroxyl group, an amino group which may be substituted with a C1-C4 alkyl group and a C1-C6 alkoxy group include a cyclopentyl, cyclohexyl, cycloheptyl and cyclooctyl group.

The aryl group in $T^1$, $T^2$, $T^3$, $T^4$, $T^5$, $T^6$, $T^7$, $T^8$, $T^9$ and $T^{10}$ preferably has about 6 to 10 carbon atoms. Specific examples of the aryl group which may be substituted with at least one group selected from a hydroxyl group, an amino group which may be substituted with a C1-C4 alkyl group and a C1-C6 alkoxy group include a phenyl and naphthyl group.

The alkoxy group in $T^3$, $T^4$ and $T^5$ preferably has about 1 to 6 carbon atoms and specific examples thereof include a methoxy, ethoxy, n-propoxy, isopropoxy, n-butoxy, tert-butoxy, n-pentyloxy and n-hexyloxy group.

The alkylene and alkenylene groups in W preferably have 2 to 6 carbon atoms. Specific examples of the alkylene group include an ethylene, trimethylene, tetramethylene, methylenedioxy and ethylene-1,2-dioxy group, and specific examples of the alkenylene group include an ethane-1,2-diyl, 1-propene-1,3-diyl and 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptyamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris[2-(2-methoxyethoxy)ethyl] amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl) ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skelton as disclosed in JP 11-52575 A1 can be also used as the quencher.

In the point of forming patterns having higher resolution, the quaternary ammonium hydroxide is preferably used as the quencher.

When the basic compound is used as the quencher, the present resist composition preferably includes 0.01 to 1% by weight of the basic compound based on the total amount of the resin component and Salt (II).

The present resist composition can contain, if necessary, a small amount of various additives such as a sensitizer, a solution suppressing agent, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all Variations of the equivalent meanings and ranges to the claims.

The present invention will be described more specifically by way of examples, which are not construed to limit the scope of the present invention. The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography [HLC-8120GPC Type, Column (Three Columns): TSKgel Multipore HXL-M, Solvent: Tetrahydrofuran, manufactured by TOSOH CORPORATION] using styrene as a standard reference material. Structures of compounds were determined by NMR (GX-270 Type, or EX-270 Type, manufactured by JEOL LTD) and mass spectrometry (Liquid Chromatography: 1100 Type, manufactured by AGILENT TECHNOLOGIES LTD., Mass Spectrometry: LC/MSD Type or LC/MSD TOF Type, manufactured by AGILENT TECHNOLOGIES LTD.).

SALT SYNTHETIC EXAMPLE 1

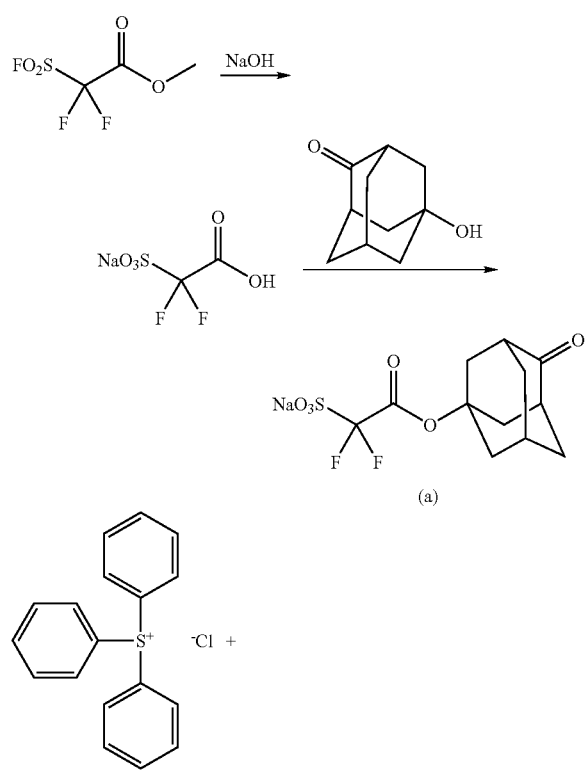

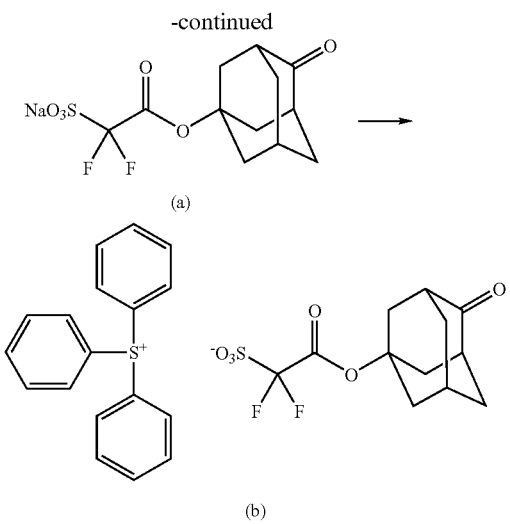

(1) 230 Parts of 30% aqueous sodium hydroxide solution was added into a mixture of 100 parts of methyl difluoro (fluorosulfonyl)acetate and 250 parts of ion-exchanged water in a ice bath. The resultant mixture was heated and refluxed at 100° C. for 3 hours. After cooling, the cooled mixture was neutralized with 88 parts of conc. hydrochloric acid and the solution obtained was concentrated to obtain 164.8 parts of sodium salt of difluorosulfoacetic acid (containing inorganic salt, purity: 62.6%).

(2) 5.0 Parts of sodium difluorosulfoacetate (purity: 62.6%), 2.6 parts of 4-oxo-1-adamantanol and 100 parts of ethylbenzene were mixed and 0.8 parts of conc. sulfuric acid was added thereto. The resultant mixture was refluxed for 30 hours. After cooling, the mixture was filtrated to obtain solids, and the solids were washed with tert-butyl methyl ether to obtain 5.5 parts of the salt represented by the above-mentioned formula (a). The purity thereof was 35.6%, which was calculated from the result of $^{1}$H-NMR analysis.

$^{1}$H-NMR(dimethylsulfoxide-$d_6$, Internal Standard: tetramethylsilane): d (ppm) 1.84 (d, 2H, J=13.0 Hz), 2.00 (d, 2H, J=11.9 Hz), 2.29-2.32 (m, 7H), 2.54(s, 2H)

(3) To 5.4 Parts of the salt represented by the formula (a), which was obtained in (2) (purity: 35.6%), a mixed solvent of 16 parts of acetonitrile and 16 parts of ion-exchanged water was added. To the resultant mixture, a solution prepared by mixing 1.7 parts of triphenylsulfonium chloride, 5 parts of acetonitrile and 5 parts of ion-exchanged water was added. After stirred for 15 hours, the mixture obtained was concentrated and extracted with 142 parts of chloroform. The organic layer obtained was washed with ion-exchanged water and concentrated. The concentrate obtained was washed with 24 parts of tert-butyl methyl ether and the solvent was decanted to remove to obtain 1.7 parts of the salt represented by the above-mentioned formula (b) in the form of white solid, which is called as B1.

$^{1}$H-NMR(dimethylsulfoxide-$d_6$, Internal Standard: tetramethylsilane): d (ppm) 1.83 (d, 2H, J=12.7 Hz), 2.00 (d, 2H, J=12.0 Hz), 2.29-2.32 (m, 7H), 2.53 (s, 2H), 7.75-7.91 (m, 15H) MS (ESI(+) Spectrum): M+ 263.2 ($C_{18}H_{15}S^+$=263.09)
MS (ESI(−) Spectrum): M− 323.0 ($C_{12}H_{13}F_2O_6S^-$=323.04)

SALT SYNTHETIC EXAMPLE 2

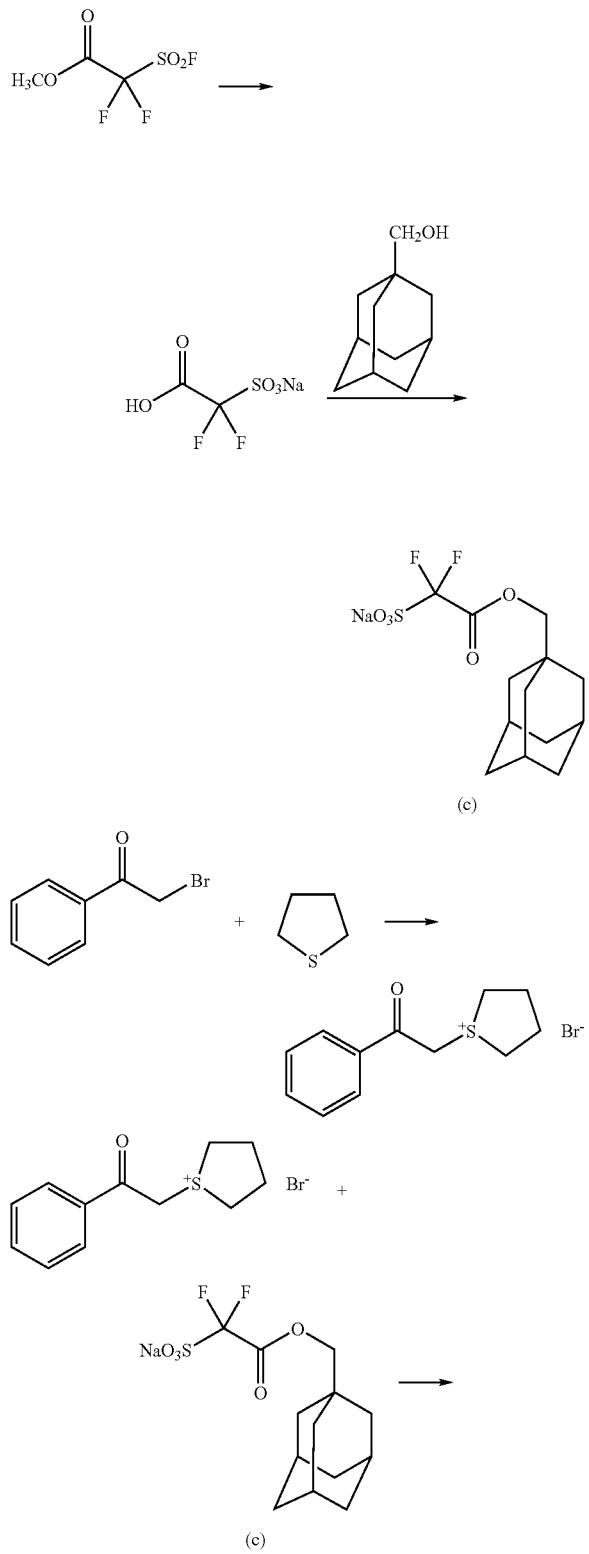

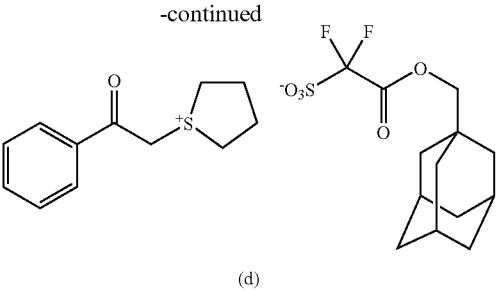

(1) 460 Parts of 30% aqueous sodium hydroxide solution was added into a mixture of 200 parts of methyl difluoro (fluorosulfonyl)acetate and 300 parts of ion-exchanged water in a ice bath. The resultant mixture was heated and refluxed at 100° C. for 2.5 hours. After cooling, the cooled mixture was neutralized with 175 parts of conc. hydrochloric acid and the solution obtained was concentrated to obtain 328.19 parts of sodium salt of difluorosulfoacetic acid (containing inorganic salt, purity: 62.8%).

(2) 75.1 Parts of p-toluenesulfonic acid was added to a mixture of 123.3 parts of sodium salt of difluorosulfoacetic acid (purity: 62.8%), 65.7 parts of 1-adamantanemethanol and 600 parts of dichloroethane, and the resultant mixture was heated and refluxed for 12 hours. The mixture was concentrated to remove dichloroethane and 400 parts of tert-butyl methyl ether was added to the residue obtained. The mixture obtained was stirred and filtrated to obtain the solid. To the solid, 400 parts of acetonitrile was added and the resultant mixture was stirred and filtrated. To the solid, 400 parts of acetonitrile was added and the resultant mixture was stirred and filtrated. The filtrates obtained were mixed and concentrated to obtain 99.5 parts of the salt represented by the above-mentioned formula (c).

$^1$H-NMR(dimethylsulfoxide-$d_6$, Internal Standard: tetramethylsilane): d (ppm) 1.51 (d, 6H), 1.62 (dd, 6H), 1.92 (s, 3H), 3.80 (s, 2H)

(3) 150 Parts of 2-bromoacetophenone was dissolved in 375 parts of acetone, and 66.5 parts of tetrahydrothiophene was added dropwise to the solution obtained. The resultant mixture was stirred at room temperature for 24 hours and the white precipitates were filtrated, washed, and dried to obtain 207.9 parts of 1-(2-oxo-2-phenylethyl)tetrahydrothiophenium bromide in the form of white crystals.

$^1$H-NMR (dimethylsulfoxide-$d_6$, Internal standard: tetramethylsilane): δ (ppm) 2.13-2.36 (m, 4H), 3.50-3.67 (m, 4H), 5.41 (s, 2H), 7.63 (t, 2H), 7.78 (t, 1H), 8.02 (d, 2H)

(4) 99.5 Parts of the salt represented by the formula (c), which was obtained in above (2), was dissolved in 298 parts of acetonitrile. To the solution obtained, 79.5 parts of 1-(2-oxo-2-phenylethyl)tetrahydrothiophenium bromide obtained in above (3) and 159 parts of ion-exchanged water. The resultant mixture was stirred for 15 hours and concentrated. The concentrate obtained was extracted twice with 500 parts of chloroform. The organic layers obtained were mixed, washed with ion-exchanged water and concentrated. To the concentrate, 250 parts of tert-butyl methyl ether was added and the resultant mixture was stirred and filtrated. The solid obtained was dried under reduced pressure to obtain 116.9 parts of the salt represented by the above-mentioned formula (d) in the form of white solid, which is called as B2.

$^1$H-NMR(dimethylsulfoxide-$d_6$, Internal Standard: tetramethylsilane): d (ppm) 1.50 (d, 6H), 1.62 (dd, 6H), 1.92 (s, 3H), 2.13-2.32 (m, 4H), 3.45-3.63 (m, 4H), 3.80 (s, 2H), 5.30

(s, 2H), 7.62 (t, 2H), 7.76 (t, 1H), 8.00 (d, 2H) MS (ESI(+) Spectrum): M+ 207.0 ($C_{12}H_{15}OS^+$=207.08) MS (ESI(-) Spectrum): M- 323.0 ($C_{13}H_{17}F_2O_5S^-$=323.08)

SALT SYNTHETIC EXAMPLE 3

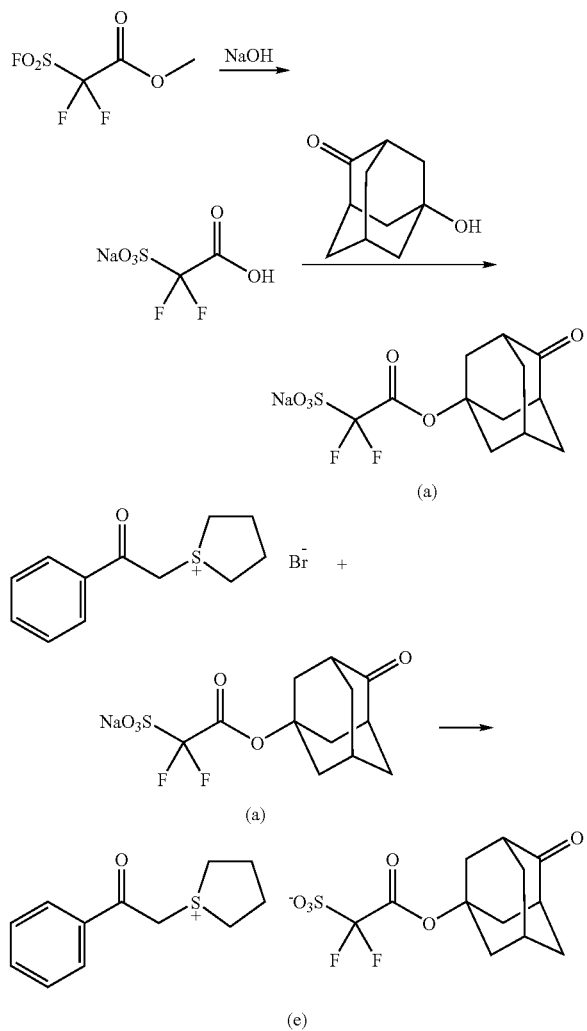

(1) 10.0 Parts of the salt represented by the formula (a) (purity: 55.2%), which was obtained according to similar method described in Salt Synthetic Example 1 (1) and (2), was mixed with a mixed solvent of 30 parts of acetonitrile and 20 parts of ion-exchanged water. To the resultant mixture, the solution prepared by mixing 5.0 parts of 1-(2-oxo-2-phenylethyl)tetrahydrothiophenium bromide, 10 parts of acetonitrile and 5 parts of ion-exchanged water was added. After stirred for 15 hours, the stirred mixture was concentrated and extracted with 98 parts of chloroform. The organic layer was washed with ion-exchanged water. The obtained organic layer was concentrated. The concentrate was mixed with 70 parts of ethyl acetate and the resultant mixture was filtrated to obtain 5.2 parts of the salt represented by the above-mentioned formula (e) in the form of white solid, which is called as B3.

$^1$H-NMR(dimethylsulfoxide-$d_6$, Internal Standard: tetramethylsilane): d (ppm) 1.83 (d, 2H, J=12.5 Hz), 2.00 (d, 2H, J=12.0 Hz), 2.21-2.37 (m, 1H), 2.53 (s, 2H), 3.47-3.62 (m, 4H), 5.31 (s, 2H), 7.63 (t, 2H, J=7.3 Hz), 7.78 (t, 1H, J=7.6 Hz), 8.01 (dd, 2H, J=1.5 Hz, 7.3 Hz) MS (ESI(+) Spectrum): M+ 207.1 ($C_{12}H_{15}OS^+$=207.08) MS (ESI(-) Spectrum): M- 323.0 ($C_{12}H_{13}F_2O_6S^-$=323.04)

SALT SYNTHETIC EXAMPLE 4

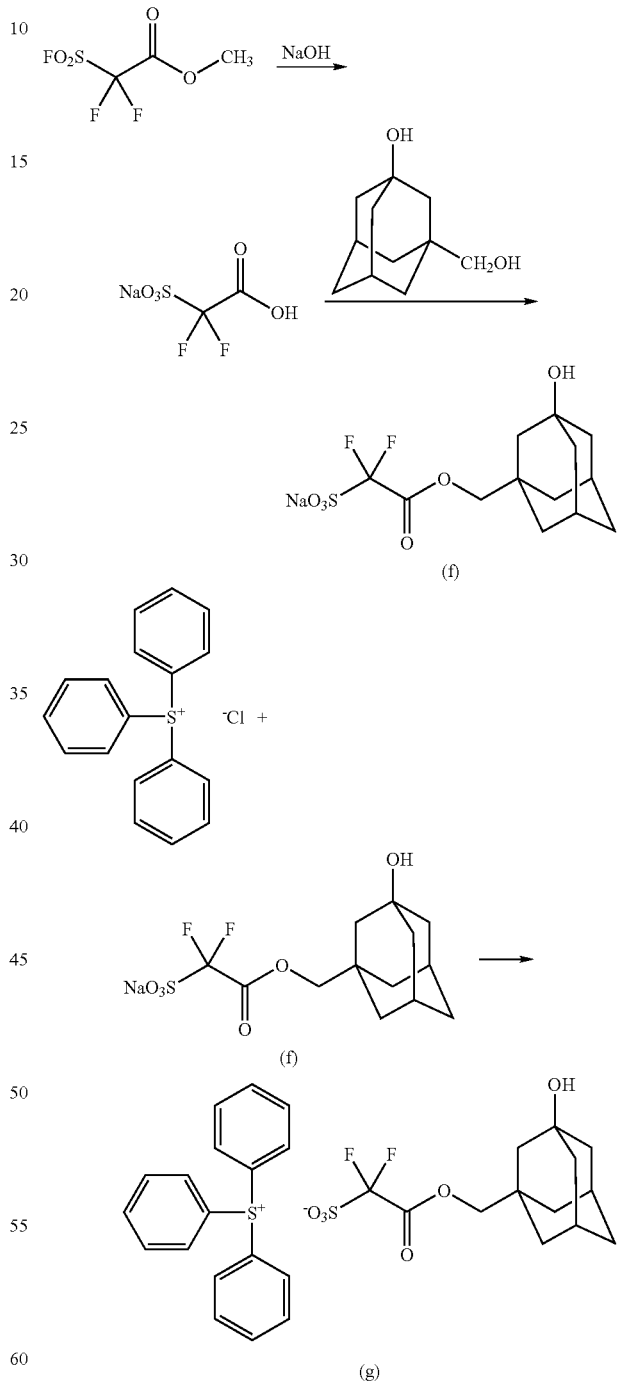

(1) 230 Parts of 30% aqueous sodium hydroxide solution was added into a mixture of 100 parts of methyl difluoro (fluorosulfonyl)acetate and 150 parts of ion-exchanged water in a ice bath. The resultant mixture was heated and refluxed at 100° C. for 3 hours. After cooling, the cooled mixture was neutralized with 88 parts of conc. hydrochloric acid and the solution obtained was concentrated to obtain 164.4 parts of sodium salt of difluorosulfoacetic acid (containing inorganic salt, purity: 62.7%).

(2) 1.9 Parts of sodium salt of difluorosulfoacetic acid (purity: 62.7%) and 9.5 parts of N,N-dimethylformaide were mixed and 1.0 part of 1,1'-carbonyldiimidazole was added thereto. The resultant mixture was stirred for 2 hours. The solution obtained was added to a solution prepared by mixing 1.1 parts of (3-hydroxy-1-adamantyl)methanol, 5.5 parts of N,N-dimethylformamide and 0.2 part of sodium hydride followed by stirring for 2 hours. The resultant solution was stirred for 15 hours to obtain the solution containing the salt represented by the above-mentioned formula (f).

(3) To the solution containing the salt represented by the formula (f), which was obtained in (2), 17.2 parts of chloroform and 2.9 parts of 14.8% aqueous triphenylsulfonium chloride solution were added. The resultant mixture was stirred for 15 hours, and then separated to an organic layer and an aqueous layer. The aqueous layer was extracted with 6.5 parts of chloroform to obtain a chloroform layer. The organic layer and the chloroform layer were mixed to wash with ion-exchanged water and concentrated. The concentrate obtained was mixed with 5.0 parts of tert-butyl methyl ether and the mixture obtained was stirred and filtrated to obtain 0.2 part of the salt represented by the above-mentioned formula (g) in the form of a white solid, which is called as B4.

$^1$H-NMR(dimethylsulfoxide-d$_6$, Internal Standard: tetramethylsilane): d (ppm) 1.38-1.51 (m, 12H), 2.07 (s, 2H), 3.85 (s, 2H), 4.41 (s, 1H), 7.75-7.89 (m, 15H) MS (ESI(+) Spectrum): M+ 263.07 (C$_{18}$H$_{15}$S$^+$=263.09) MS (ESI(−) Spectrum): M− 339.10 (C$_{13}$H$_{17}$F$_2$O$_6$S$^−$=339.07)

SALT SYNTHETIC EXAMPLE 5

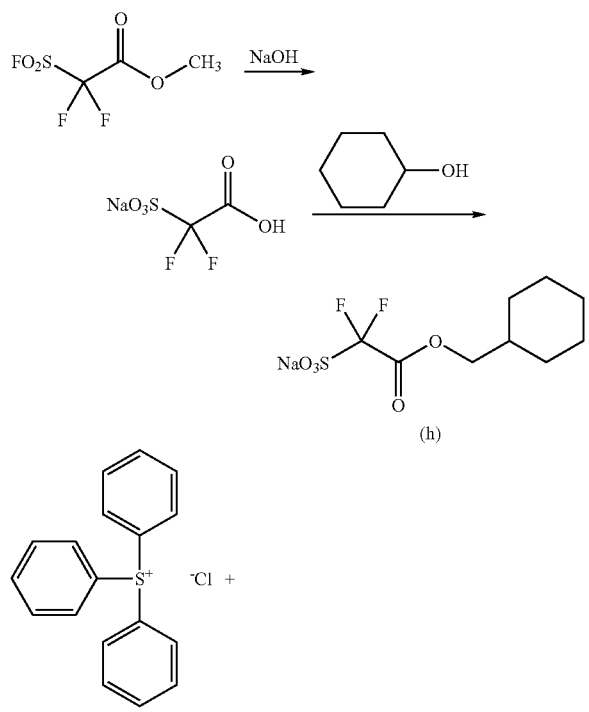

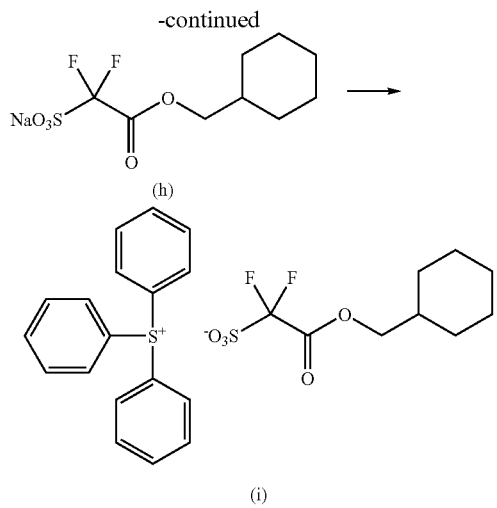

(1) 230 Parts of 30% aqueous sodium hydroxide solution was added into a mixture of 100 parts of methyl difluoro (fluorosulfonyl)acetate and 250 parts of ion-exchanged water in a ice bath. The resultant mixture was heated and refluxed at 100° C. for 2.5 hours. After cooling, the cooled mixture was neutralized with 88 parts of conc. hydrochloric acid and the solution obtained was concentrated to obtain 158.4 parts of sodium salt of difluorosulfoacetic acid (containing inorganic salt, purity: 65.1%).

(2) 50.0 Parts of sodium salt of difluorosulfoacetic acid (purity: 65.1%). 18.76 parts of cyclohexyl methanol and 377 parts of dichloroethane were mixed and 31.26 parts of p-toluenesulfonic acid was added thereto. The resultant mixture was heated and refluxed for 6 hours. The mixture obtained was concentrated to remove dichloroethane, and then 200 parts of heptane was added, to the residue obtained. The resultant mixture was stirred and filtrated. The solid obtained was mixed with 200 parts of acetonitrile. The resultant mixture was stirred and filtrated. The filtrate obtained was concentrated to obtain 39.03 parts of the salt represented by the above-mentioned formula (h).

$^1$H-NMR(dimethylsulfoxide-d$_6$, Internal Standard: tetramethylsilane): d (ppm) 0.90-1.27 (m, 5H), 1.58-1.71 (m, 6H), 4.02 (d, 2H)

(3) 39.03 Parts of the salt represented by the formula (h), which was obtained in (2), was dissolved in 195.2 parts of ion-exchanged water. To the solution obtained, a solution prepared by mixing 39.64 parts of triphenylsulfonium chloride and 196.4 parts of ion-exchanged water was added and then 500 parts of acetonitrile was added thereto. The resultant mixture was stirred for 15 hours, and then concentrated. The residue obtained was extracted twice with 250 parts of chloroform, and the organic layers obtained were mixed and washed with ion-exchanged water, and then concentrated. The concentrate obtained was mixed with 200 parts of tert-butylmethyl ether and the mixture obtained was stirred and filtrated to obtain 40.16 part of the salt represented by the above-mentioned formula (i) in the form of a white solid, which is called as B5.

$^1$H-NMR(dimethylsulfoxide-d$_6$, Internal Standard: tetramethylsilane): d (ppm) 0.88-1.28 (m, 5H), 1.56-1.71 (m, 6H), 4.01 (d, 2H), 7.75-7.90 (m, 15H) MS (ESI(+) Spectrum):

M+ 263.1 ($C_{18}H_{15}S^+$=263.09) MS (ESI(−) Spectrum): M−271.1 ($C_9H_{13}F_2O_5S^−$=271.05)

SALT SYNTHETIC EXAMPLE 6

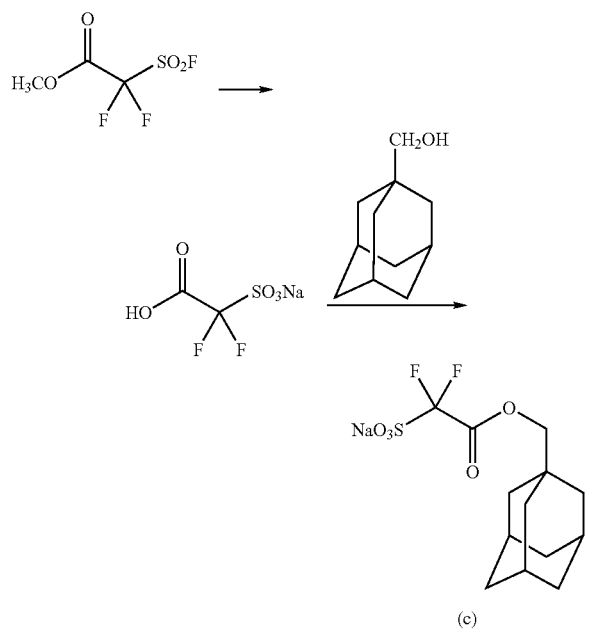

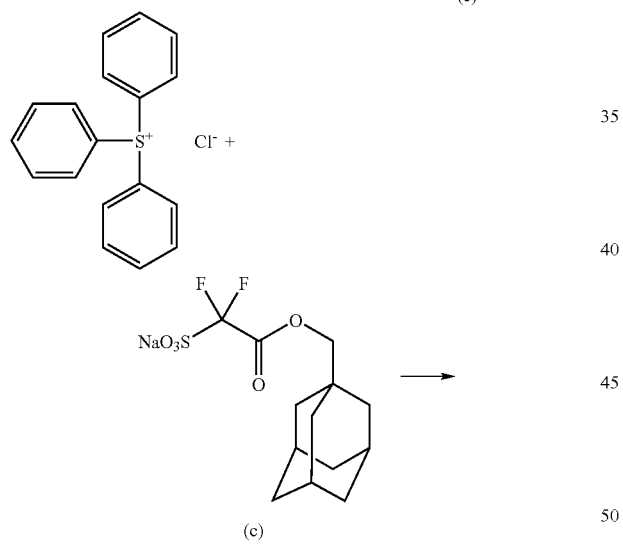

(1) 460 Parts of 30% aqueous sodium hydroxide solution was added into a mixture of 200 parts of methyl difluoro(fluorosulfonyl)acetate and 300 parts of ion-exchanged water in a ice bath. The resultant mixture was heated and refluxed at 100° C. for 2.5 hours. After cooling, the cooled mixture was neutralized with 175 parts of conc. hydrochloric acid and the solution obtained was concentrated to obtain 328.19 parts of sodium salt of difluorosulfoacetic acid (containing inorganic salt, purity: 63.5%).

(2) 24.0 Parts of p-toluenesulfonic acid was added to a mixture of 39.4 parts of sodium salt of difluorosulfoacetic acid (purity: 63.5%), 21.0 parts of 1-adamantanemethanol and 200 parts of dichloroethane, and the resultant mixture was heated and refluxed for 7 hours. The mixture was concentrated to remove dichloroethane and 250 parts of tert-butyl methyl ether was added to the residue obtained. The mixture obtained was stirred and filtrated to obtain the solid. To the solid, 250 parts of acetonitrile was added and the resultant mixture was stirred and filtrated. The filtrate obtained was concentrated to obtain 32.8 parts of the salt represented by the above-mentioned formula (c).

(3) 32.8 Parts of the salt represented by the above-mentioned formula (c), which was obtained in above (2), was dissolved in 100 parts of ion-exchanged water. To the resultant solution, a solution prepared by mixing 28.3 parts of triphenylsulfonium chloride and 140 parts of methanol was added to stir for 15 hours. The resultant mixture was concentrated. The residue obtained was extracted twice with 200 parts of chloroform. The organic layers obtained were mixed and repeated to wash with ion-exchanged water until the aqueous layer obtained was neutralized. The solution obtained was concentrated. To the concentrate, 300 parts of tert-butyl methyl ether was added and stirred. The resultant mixture was filtrated and the solid obtained was dried to obtain 39.7 parts of the salt represented by the above-mentioned formula (j) in the form of white solid, which is called as B6.

$^1$H-NMR (dimethylsulfoxide-$d_6$, Internal standard: tetramethylsilane): δ (ppm) 1.52 (d, 6H), 1.63 (dd, 6H), 1.93 (s, 3H), 3.81 (s, 2H), 7.76-7.90 (m, 15H) MS (ESI(+) Spectrum): M$^+$ 263.2 ($C_{18}H_{15}S^+$=263.09) MS (ESI(−) Spectrum): M$^−$ 323.0 ($C_{13}H_{17}F_2O_5S^−$=323.08)

SALT SYNTHETIC EXAMPLE 7

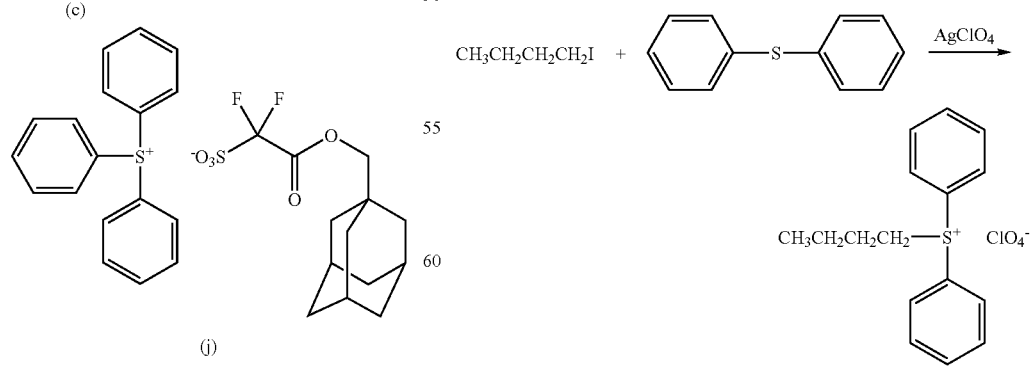

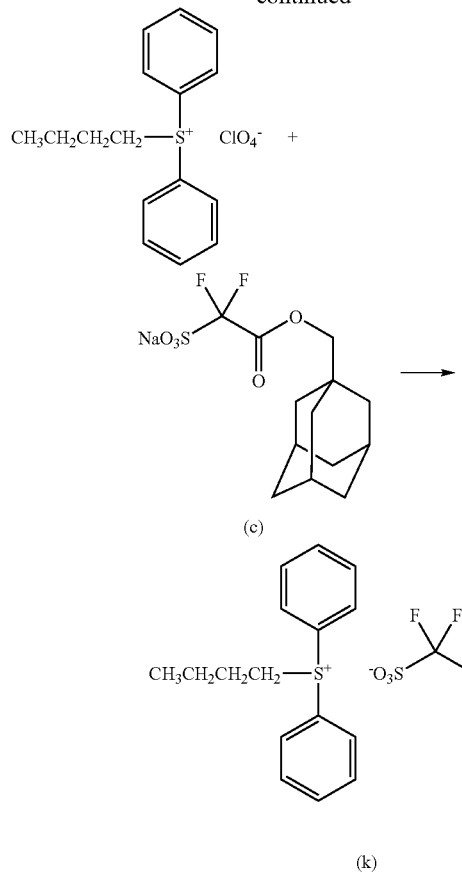

(c)

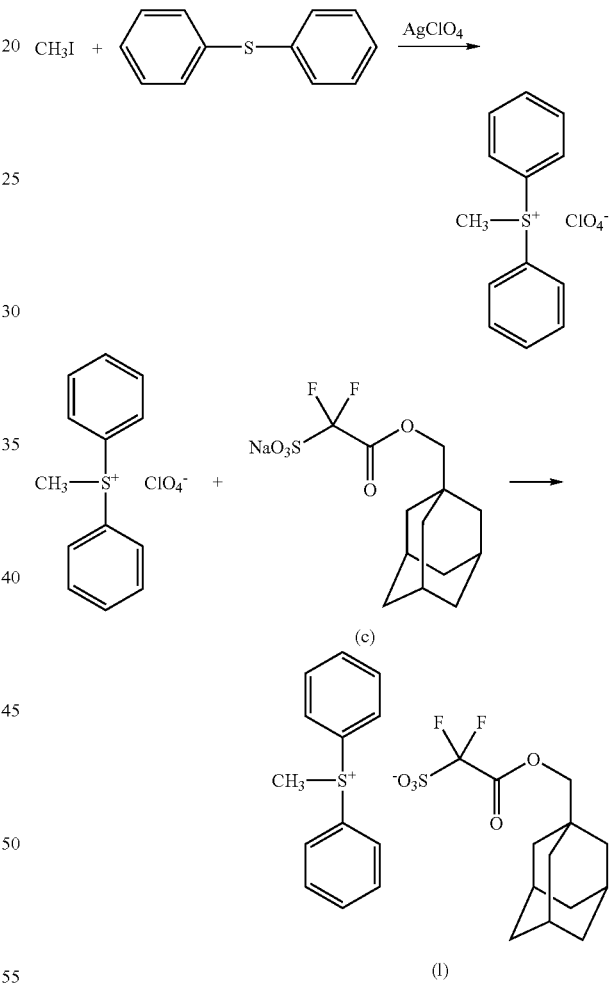

(1) 26.5 Parts of diphenylsulfide was dissolved in 79.4 parts of acetonitrile. 29.5 Parts of silver (I) perchlorate was added thereto and then a solution prepared by mixing 52.3 parts of acetonitrile and 26.2 parts of n-butyl iodide was added. The resultant mixture was stirred for 24 hours. The precipitate was filtrated to remove and the filtrate was concentrated. The concentrate was mixed with 135.9 parts of tert-butyl methyl ether and the resultant mixture was stirred and filtrated. To the solid, 101.7 parts of tert-butyl methyl ether was added and the resultant mixture was stirred and filtrated to obtain 14.8 parts of n-butyldiphenylsulfonium perchlorate as white solid.

$^1$H-NMR (dimethylsulfoxide-$d_6$, Internal standard: tetramethylsilane): δ (ppm) 0.88 (t, 3H), 1.41-1.49 (m, 2H), 1.52-1.64 (m, 2H), 4.31 (t, 2H), 7.69-7.82 (m, 6H), 8.08 (d, 4H)

(2) 5.00 Parts of the salt represented by the above-mentioned formula (c), which was obtained according to a similar method described in the above Salt Synthetic Example 6 (1) and (2), was mixed with 50.0 parts of chloroform. To the resultant mixture, a mixture prepared by mixing 13.94 parts of n-butyldiphenylsulfonium perchlorate obtained in above (1) with 41.82 parts of ion-exchanged water was added. The resultant mixture was stirred for 15 hours, and separated to an organic layer and an aqueous layer. The aqueous layer was extracted with 10.0 parts of chloroform to obtain a chloroform layer. The organic layer and the chloroform layer were mixed and repeated to wash with ion-exchanged water until the aqueous layer obtained was neutralized, and then concentrated. The concentrate obtained was mixed with 37.6 parts of tert-butyl methyl ether and the resultant mixture was stirred and then filtrated. The solid obtained was mixed with 16.8 parts of ethyl acetate and the resultant mixture was stirred and filtrated to obtain 2.89 parts of the salt represented by the above-mentioned formula (k) in the form of white solid, which is called as B7.

$^1$H-NMR (dimethylsulfoxide-$d_6$, Internal standard: tetramethylsilane): δ (ppm) 0.88 (t, 3H), 1.42-1.67 (m, 16H), 1.91 (s, 3H), 3.80 (s, 2H), 4.33 (t, 2H), 7.71-7.83 (m, 6H), 8.09 (d, 4H) MS (ESI(+) Spectrum): M$^+$ 243.11 ($C_{16}H_{19}S^+$= 243.12) MS (ESI(−) Spectrum): M$^−$ 323.10 ($C_{13}H_{17}F_2O_5S^−$= 323.08)

SALT SYNTHETIC EXAMPLE 8

(1) 6.56 Parts of diphenylsulfide was dissolved in 19.7 parts of acetonitrile. 7.30 Parts of silver (I) perchlorate was added thereto and then a solution prepared by mixing 10.0 parts of acetonitrile and 5.00 parts of methyl iodide was added. The resultant mixture was stirred for 24 hours. The precipitate was filtrated to remove and the filtrate was concentrated. The concentrate was mixed with 39.2 parts of tert-butyl methyl ether and the resultant mixture was stirred and filtrated to obtain 9.38 parts of methyldiphenylsulfonium perchlorate as white solid.

$^1$H-NMR (dimethylsulfoxide-$d_6$, Internal standard: tetramethylsilane): δ (ppm) 3.81 (s, 3H), 7.67-7.79 (m, 6H), 8.01-8.04 (m, 4H)

(2) 8.29 Parts of the salt represented by the above-mentioned formula (c), which was obtained according to a similar method described in the above Salt Synthetic Example 6 (1) and (2), was mixed with 49.7 parts of chloroform. To the resultant mixture, a mixture prepared by mixing 9.38 parts of methyldiphenylsulfonium perchlorate obtained in above (1) with 28.14 parts of ion-exchanged water was added. The resultant mixture was stirred for 15 hours, and separated to an organic layer and an aqueous layer. The aqueous layer was extracted with 33.1 parts of chloroform to obtain a chloroform layer. The organic layer and the chloroform layer were mixed and repeated to wash with ion-exchanged water until the aqueous layer obtained was neutralized, and then concentrated. The concentrate obtained was mixed with 33.8 parts of tert-butyl methyl ether and the resultant mixture was stirred. The supernatant was removed by decantation to obtain 7.81 parts of the salt represented by the above-mentioned formula (1) in the form of colorless liquid, which is called as B8.

$^1$H-NMR (dimethylsulfoxide-$d_6$, Internal standard: tetramethylsilane): δ (ppm) 1.50 (d, 6H), 1.61 (dd, 6H), 1.91 (s, 3H), 3.80 (s, 2H), 3.82 (s, 3H), 7.67-7.79 (m, 6H), 8.02-8.05 (m, 4H) MS (ESI(+) Spectrum): M$^+$ 201.0 ($C_{13}H_{13}S^+$ =201.07) MS (ESI(−) Spectrum): M$^-$ 323.0 ($C_{13}H_{17}F_2O_5S^-$ =323.08)

SALT SYNTHETIC EXAMPLE 9

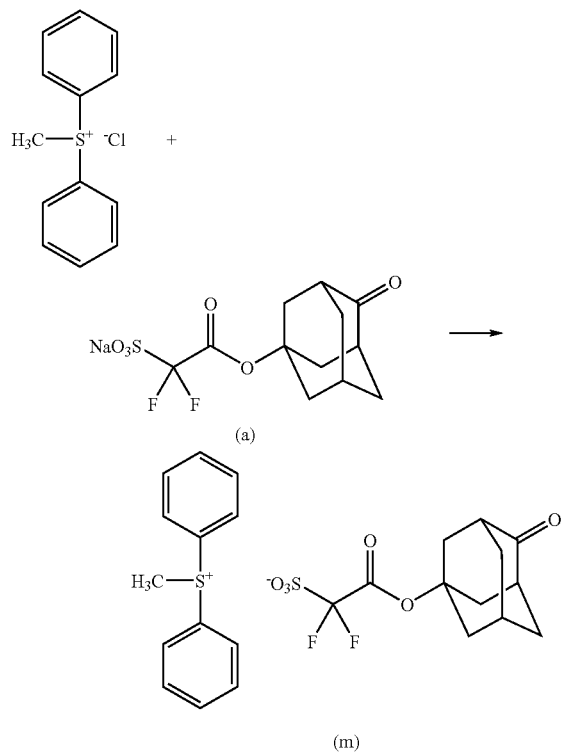

(1) 5.0 Parts of the salt represented by the formula (a) (purity: 49.1%), which was obtained according to a similar method described in above Salt Synthetic Example 1 (1) and (2), and 50.0 parts of chloroform were mixed. To the resultant mixture, 42.0 parts of aqueous triphenylsulfonium chloride solution (concentration: 5.0%) was added. After stirred for 15 hours, the mixture obtained was separated to an organic layer and an aqueous layer. The aqueous layer obtained was extracted with 25.0 parts of chloroform to obtain a chloroform layer. The organic layer and the chloroform layer were mixed and the resultant solution was repeated to wash with ion-exchanged water until the aqueous layer obtained was neutralized. The solution was concentrated and the concentrate obtained was mixed with 29.6 parts of tert-butyl methyl ether and the supernatant was removed by decantation. The residue obtained was mixed with 16.6 parts of ethyl acetate and the supernatant was removed by decantation to obtain 1.6 parts of the salt represented by the above-mentioned formula (m) in the form of pale yellow oil, which is called as B9.

$^1$H-NMR(dimethylsulfoxide-$d_6$, Internal Standard: tetramethylsilane): d (ppm) 1.82 (d, 2H), 1.99 (d, 2H), 2.21-2.35 (m, 7H), 2.52 (s, 2H), 3.81 (s, 3H), 7.67-7.79 (m, 6H), 8.01-8.06 (m, 4H)

SALT SYNTHETIC EXAMPLE 10

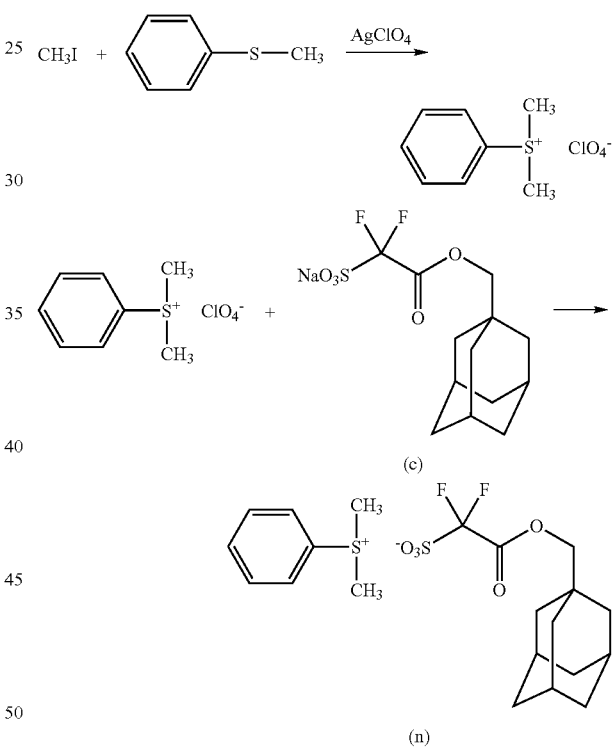

(1) 5.0 Parts of thioanisole was dissolved in 15.0 parts of acetonitrile. 8.35 Parts of silver (I) perchlorate was added thereto and then 11.4 parts of acetonitrile solution containing 5.71 parts of methyl iodide was added. The resultant mixture was stirred for 24 hours. The precipitate was filtrated to remove and the filtrate was concentrated. The concentrate was mixed with 36.8 parts of tert-butyl methyl ether and the resultant mixture was stirred and filtrated to obtain 8.22 parts of dimethylphenylsulfonium perchlorate as white solid.

$^1$H-NMR(dimethylsulfoxide-$d_6$, Internal Standard: tetramethylsilane): d (ppm) 3.25 (s, 6H), 7.67-7.80 (m, 3H), 8.03-8.08 (m, 2H)

(2) 5.98 Parts of the salt represented by the above-mentioned formula (c), which was obtained according to a similar method described in above Salt Synthetic Example 6 (1) and (2), was mixed with 35.9 parts of chloroform. To the resultant mixture, a solution obtained by mixing 4.23 parts of dimethylphenylsulfonium perchlorate obtained in above (1) with 12.7 parts of ion-exchanged water was added. The resultant mixture was stirred for 4 hours, and separated to an organic layer and an aqueous layer. The aqueous layer was extracted with 23.9 parts of chloroform to obtain a chloroform layer. The organic layer and the chloroform layer were mixed and repeated to wash with ion-exchanged water until the aqueous layer obtained was neutralized, and then concentrated. The concentrate obtained was mixed with 31.8 parts of tert-butyl methyl ether and the resultant mixture was filtrated to obtain 5.38 parts of the salt represented by the above-mentioned formula (n) in the form of white solid, which is called as B10.

$^1$H-NMR (dimethylsulfoxide-d$_6$, Internal standard: tetramethylsilane): δ (ppm) 1.51 (d, 6H), 1.62 (dd, 6H), 1.92 (s, 3H), 3.26 (s, 6H), 3.80 (s, 2H), 7.68-7.80 (m, 3H), 8.03-8.06 (m, 2H) MS (ESI(+) Spectrum): M$^+$ 139.0 (C$_8$H$_{11}$S$^+$=139.06) MS (ESI(−) Spectrum): M$^-$ 323.0 (C$_{13}$H$_{17}$F$_2$O$_5$S$^-$=323.08)

SALT SYNTHETIC EXAMPLE 11 sodium salt of difluorosulfoacetic acid (containing inorganic salt, purity: 62.8%).

(2) 5.0 Parts of sodium difluorosulfoacetate (purity: 62.8%) which was obtained in above (1), 2.6 parts of 4-oxo-1-adamantanol and 100 parts of ethylbenzene were mixed and 0.8 parts of conc. sulfuric acid was added thereto. The resultant mixture was refluxed for 30 hours. After cooling, the mixture was filtrated to obtain solids, and the solids were washed with tert-butyl methyl ether to obtain 5.5 parts of the salt represented by the above-mentioned formula (a). The purity thereof was 57.6%, which was calculated by the result of H-NMR analysis.

$^1$H-NMR(dimethylsulfoxide-d$_6$, Internal Standard: tetramethylsilane): d (ppm) 1.84 (d, 2H), 2.00 (d, 2H), 2.29-2.32 (m, 7H), 2.54 (s, 2H)

(3) To 4.3 Parts of the salt represented by the formula (a), which was obtained in (2) (purity: 57.6%), 43.0 parts of chloroform was added. To the resultant mixture, 2.2 parts of the sulfonium salt represented by the above-mentioned formula (o) and 11.7 parts of ion-exchanged water were added.

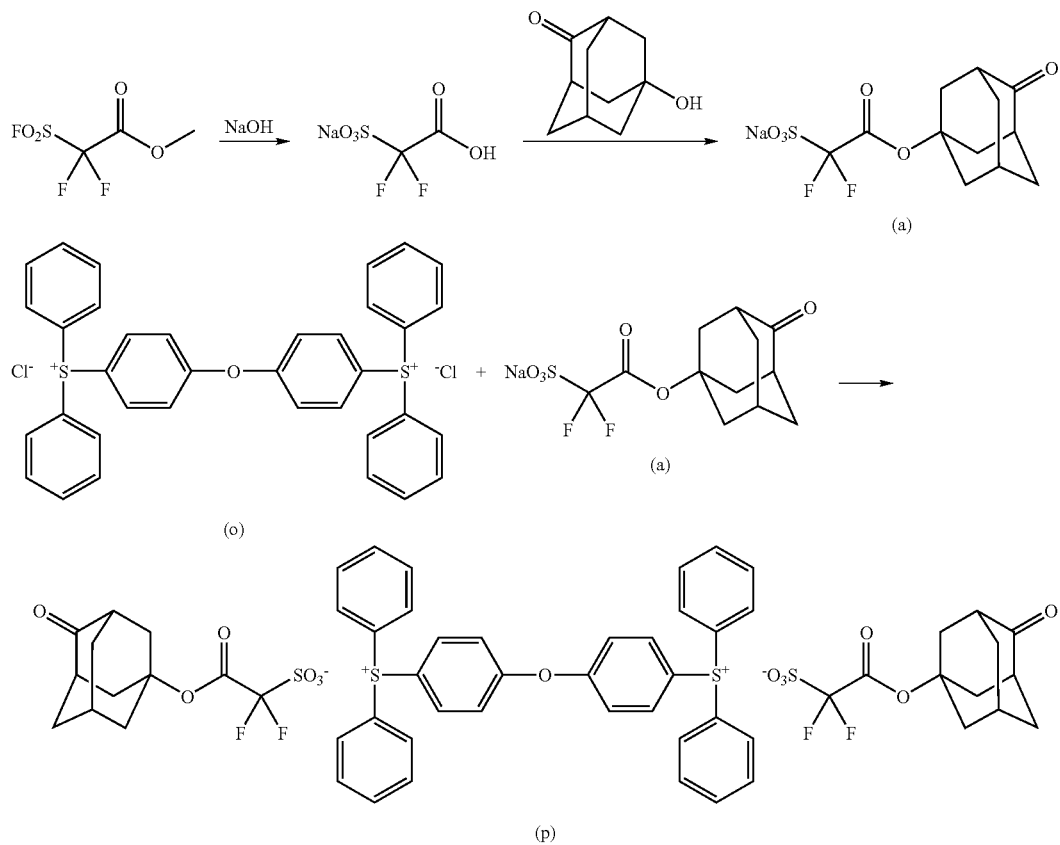

(1) 460 Parts of 30% aqueous sodium hydroxide solution was added into a mixture of 200 parts of methyl difluoro (fluorosulfonyl)acetate and 300 parts of ion-exchanged water in a ice bath. The resultant mixture was heated and refluxed at 100° C. for 2.5 hours. After cooling, the cooled mixture was neutralized with 175 parts of conc. hydrochloric acid and the solution obtained was concentrated to obtain 328.19 parts of After stirred for 15 hours, the mixture obtained was separated to an organic layer and an aqueous layer. The organic layer was repeated to wash with ion-exchanged water until the aqueous layer obtained was neutralized, and then concentrated. The concentrate obtained was mixed with 15.0 parts of tert-butyl methyl ether and the supernatant was removed by decantation. The residue obtained was dried to obtain 2.3 parts of the salt represented by the above-mentioned formula (p) in the form of white solid, which is called as B11.

¹H-NMR(dimethylsulfoxide-d₆, Internal Standard: tetramethylsilane): d (ppm) 1.82 (d, 2H), 1.98 (d, 2H), 2.27-2.35 (m, 7H), 2.51 (s, 2H), 7.52 (d, 4H), 7.74-7.89 (m, 20H), 7.91 (d, 4H)

Monomers used in the following Resin Synthetic Examples are following monomers M1, M2, M3, M4, M5 and M6.

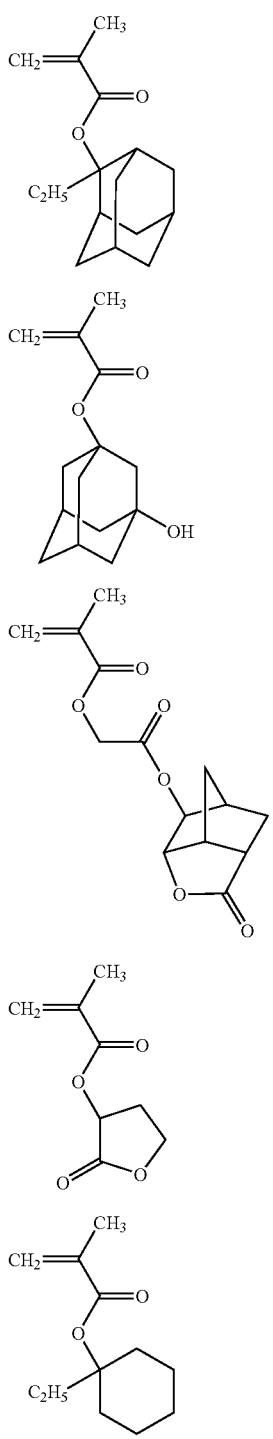

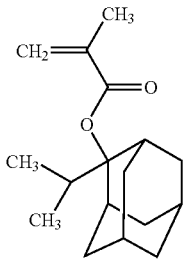

RESIN SYNTHETIC EXAMPLE 1

13.50 Parts of the monomer M1, 3.53 parts of the monomer M2 and 18.66 parts of the monomer M3 were dissolved in 1.5 times amount of 1,4-dioxane as much as the amount of all monomers to be used (monomer molar ratio; monomer M1:monomer M2:monomer M3=40:11:49). To the solution, 2,2'-azobisisobutyronitrile and 2,2'-azobis(2,4-dimethylvaleronitrile) were added as an initiator in a ratio of 1 mol % and 3 mol % respectively, based on all monomer molar amount, and the resultant mixture was heated at 74° C. for about 5 hours. The reaction solution was poured into large amount of a mixed solvent of methanol and water to cause precipitation. The precipitate was isolated and washed twice with large amount of a mixed solvent of methanol and water for purification. As a result, copolymer having a weight-average molecular weight of about 9,200 was obtained in a yield of 80%. This copolymer had the following structural units. This is called as resin A1.

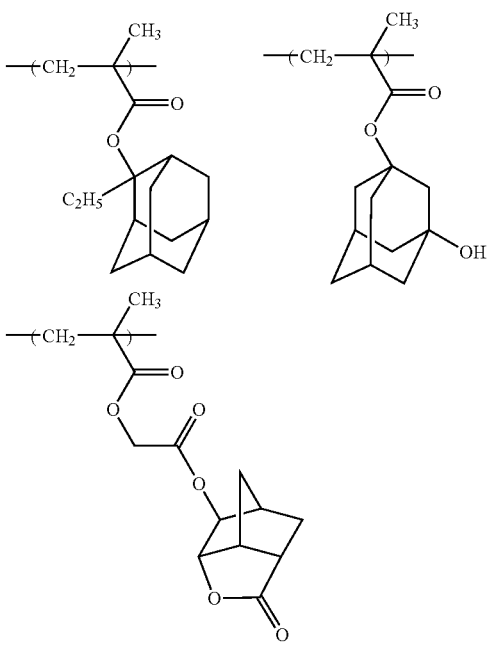

RESIN SYNTHETIC EXAMPLE 2

30.00 Parts of the monomer M1, 14.27 parts of the monomer M2 and 10.28 parts of the monomer M4 were dissolved in 2.6 times amount of methyl isobutyl ketone as much as the amount of all monomers to be used (monomer molar ratio; monomer M1:monomer M2:monomer M4=50:25:25). To the solution, 2,2'-azobisisobutyronitrile was added as an initiator in a ratio of 2 mol % based on all monomer molar amount. The resultant mixture was heated at 87° C. for about 6 hours. The reaction solution was poured into large amount of a mixed solvent of methanol and water to cause precipitation. The precipitate was isolated and washed twice with large amount of a mixed solvent of in ethanol and water for purification. As a result, copolymer having a weight-average molecular weight of about 9,400 was obtained in a yield of 47%. This copolymer had the following structural units. This is called as resin A2.

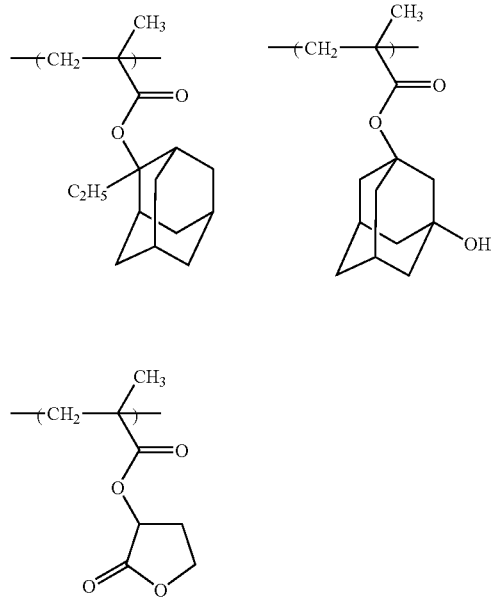

RESIN SYNTHETIC EXAMPLE 3

15.00 Parts of the monomer M1, 4.89 parts of the monomer M2, 11.12 parts of the monomer M3 and 8.81 parts of the monomer M4 were dissolved in 1.5 times amount of 1,4-dioxane as much as the amount of all monomers to be used (monomer molar ratio; monomer M1:monomer M2:monomer M3:monomer M4=35:12:23:30). To the solution, 2,2'-azobisisobutyronitrile and 2,2'-azobis(2,4-dimethylvaleronitrile) were added as an initiator in a ratio of 1 mol % and 3 mol % respectively, based on all monomer molar amount. The resultant mixture was heated at 77° C. for about 5 hours. The reaction solution was cooled and then, was poured into large amount of a mixed solvent of methanol and water to cause precipitation. The precipitate was isolated and washed twice with large amount of a mixed solvent of methanol and water for purification. As a result, copolymer having a weight-average molecular weight of about 8,100 was obtained in a yield of 78%. This copolymer had the following structural units. This is called as resin A3.

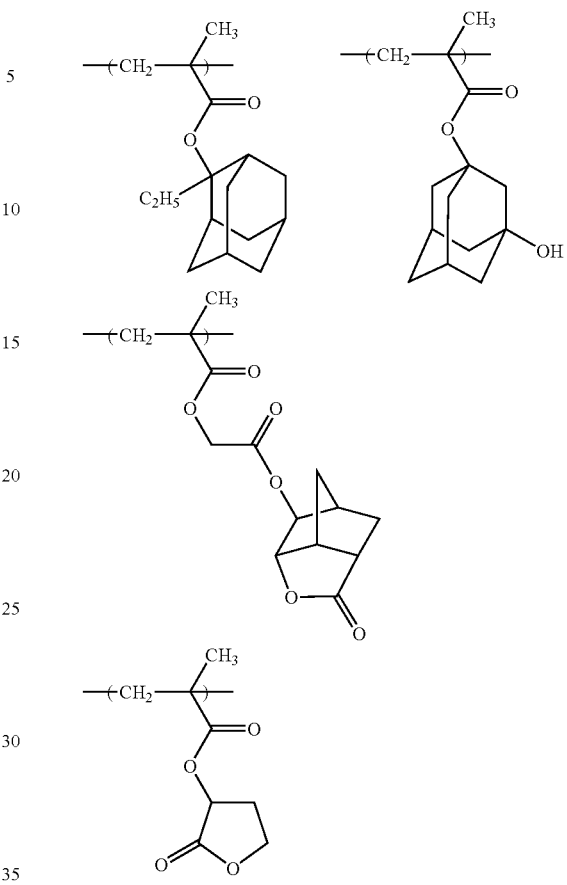

RESIN SYNTHETIC EXAMPLE 4

Into a four-necked flask equipped with a thermometer and condenser, 77.24 parts of 1,4-dioxane was charged and bubbled with nitrogen gas for 30 minutes. In the nitrogen atmosphere, after the solvent was heated up to 74° C., a solution prepared by mixing 45.00 parts of the monomer M1, 10.07 parts of the monomer M2, 50.78 parts of the monomer M3, 14.51 parts of the monomer M4, 8.37 parts of the monomer M5, 0.88 part of 2,2'-azobisisobutyronitrile, 3.97 parts of 2,2'-azobis(2,4-dimethylvaleronitrile) and 115.86 parts of 1,4-dioxane was added dropwise to the heated solvent over 2 hour with maintaining the temperature at 74° C. (monomer molar ratio; monomer M1:monomer M2:monomer M3:monomer M4:monomer M5=34:8:34:16:8). After the addition, the resultant mixture was maintained at 74° C. for 5 hours. The reaction mixture was cooled and diluted with 141.61 parts of 1,4-dioxane. The resultant mixture was poured into a mixed solution of 1339 parts of methanol and 335 parts of ion-exchanged water with stirring, the mixture was stirred, then the resin deposited in the mixture was corrected by filtration. The deposit was added to 837 parts of methanol, the mixture was stirred, then the solid was corrected by filtration. The series of operations comprising adding, stirring and correcting by filtration was repeated two more times, and then dried under reduced pressure to obtain 96.4 parts of copolymer having a weight-average molecular weight of 8,924 and Mw (weight-average molecular weight)/Mn (number-average molecular weight) of 1.87 was obtained in a yield of 75%. This copolymer had the following structural units. This is called as resin A4.

RESIN SYNTHETIC EXAMPLE 5

Into a four-necked flask equipped with a thermometer and condenser, 83.33 parts of 1,4-dioxane was charged and bubbled with nitrogen gas for 30 minutes. In the nitrogen atmosphere, after the solvent was heated up to 74° C., a solution prepared by mixing 8.68 parts of the monomer M2, 36.05 parts of the monomer M3, 32.31 parts of the monomer M4, 16.83 parts of the monomer M5, 45.00 parts of the monomer M6, 1.01 parts of 2,2'-azobisisobutyronitrile, 4.56 parts of 2,2°-azobis(2,4-dimethylvaleronitrile) and 124.99 parts of 1,4-dioxane was added dropwise to the heated solvent over 2 hour with maintaining the temperature at 74° C. (monomer molar ratio; monomer M2:monomer M3: monomer M4:monomer M5:monomer M6=6:21:31:14:28). After the addition, the resultant mixture was maintained at 74° C. for 5 hours. The reaction mixture was cooled and diluted with 152.76 parts of 1,4-dioxane. The resultant mixture was poured into a mixed solution of 1444 parts of methanol and 361 parts of ion-exchanged water with stirring, the mixture was stirred, then the resin deposited in the mixture was corrected by filtration. The deposit was added to 903 parts of methanol, the mixture was stirred, then the solid was corrected by filtration. The series of operations comprising adding, stirring and correcting by filtration was repeated two more times, and then dried under reduced pressure to obtain 97.9 parts of copolymer having a weight-average molecular weight of 7,830 and Mw (weight-average molecular weight)/ Mn (number-average molecular weight) of 1.80 was obtained in a yield of 71%. This copolymer had the following structural units. This is called as resin A5.

RESIN SYNTHETIC EXAMPLE 6

Into a four-necked flask equipped with a thermometer and condenser, 82.87 parts of 1,4-dioxane was charged and bubbled with nitrogen gas for 30 minutes. In the nitrogen atmosphere, after the solvent was heated up to 74° C., a solution prepared by mixing 45.00 parts of the monomer M1, 10.07 parts of the monomer M2, 74.68 parts of the monomer M3, 8.37 parts of the monomer MS, 0.88 part of 2,2'-azobisisobutyronitrile, 3.97 parts of 2,2'-azobis(2,4-dimethylvaleronitrile) and 124.31 parts of 1,4-dioxane was added dropwise to the heated solvent over 2-hour with maintaining the temperature at 74° C. (monomer molar ratio; monomer M1:monomer M2:monomer M3:monomer M5=34:8:50:8). After the addition, the resultant mixture was maintained at 74° C. for 5 hours. The reaction mixture was cooled and diluted with 151.93 parts of 1,4-dioxane. The resultant mixture was poured into a mixed solution of 1436 parts of methanol and 359 parts of ion-exchanged water with stirring, the mixture was stirred, then the resin deposited in the mixture was corrected by filtration. The deposit was added to 898 parts of methanol, the mixture was stirred, then the solid was corrected by filtration. The series of operations comprising adding, stirring and correcting by filtration was repeated two more times, and then dried under reduced pressure to obtain 101.1 parts of copolymer having a weight-average molecular weight of 9,037 and Mw (weight-average molecular weight)/Mn (number-average molecular weight) of 1.87 was obtained in a yield of 73%. This copolymer had the following structural units. This is called as resin A6.

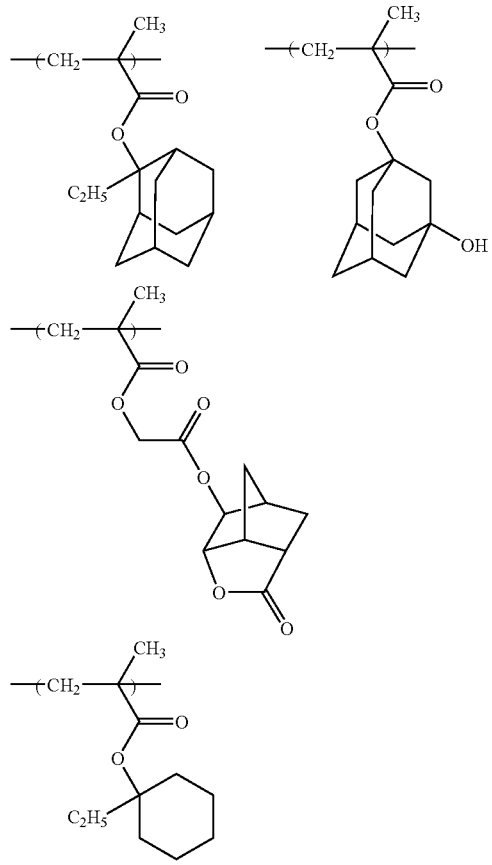

EXAMPLES 1 TO 17 AND COMPARATIVE EXAMPLES 1 TO 6

<Acid Generator>

Acid Generator B1:

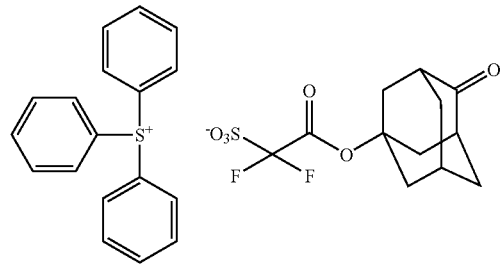

Acid Generator B2:

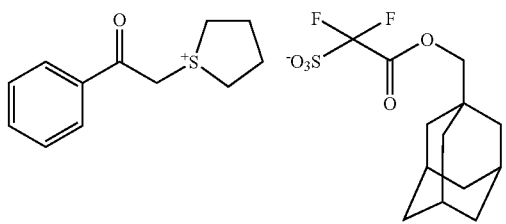

Acid Generator B3:

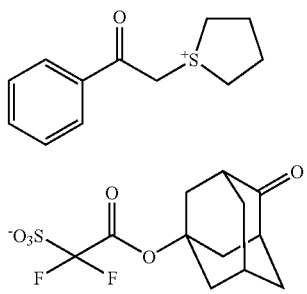

Acid Generator B4:

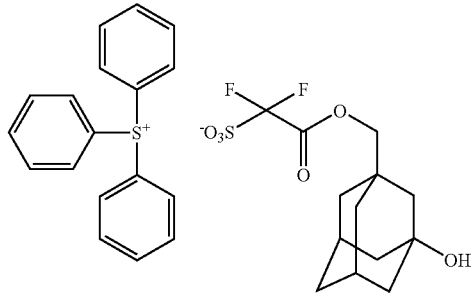

Acid Generator B5:

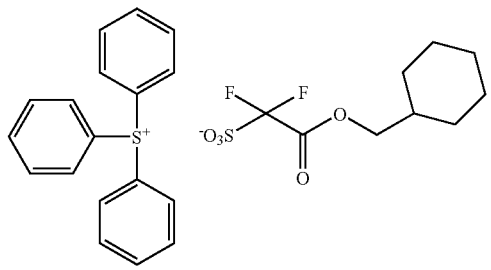

Acid Generator B6:
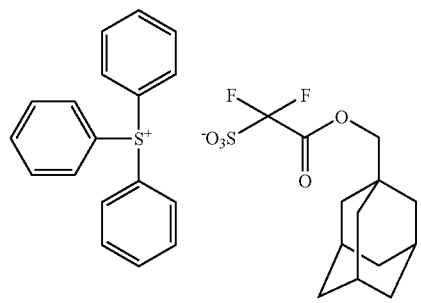
Acid Generator B7:
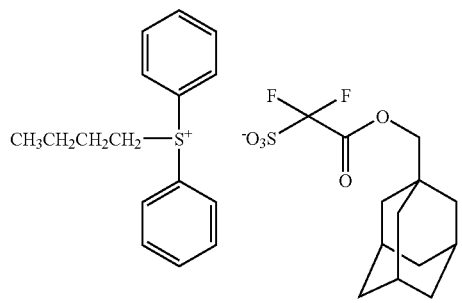
Acid Generator B8:
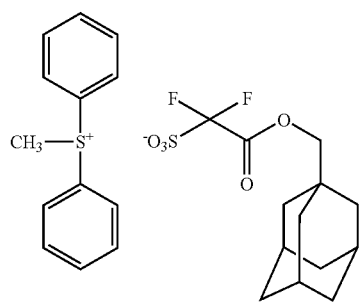
Acid Generator B9:
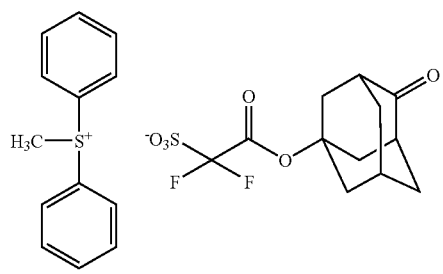
Acid Generator B10:
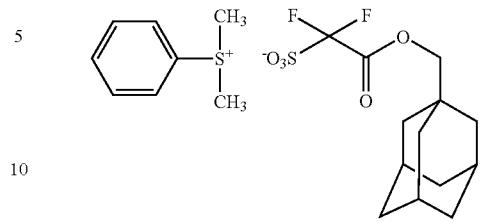
Acid Generator B11:
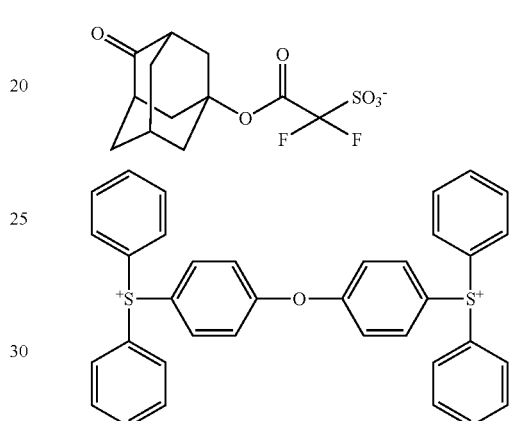
Acid Generator C1:
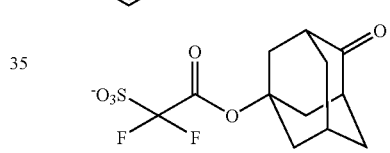
Acid Generator C2:
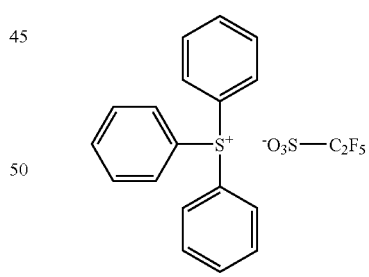

<Resin>

Resins A1 to A6

<Quencher>

Q1: 2,6-diisopropylaniline

<Solvent>

| | |
|---|---|
| Y1: propylene glycol monomethyl ether acetate | 145 parts |
| 2-heptanone | 20.0 parts |
| propylene glycol monomethyl ether | 20.0 parts |
| γ-butyrolactone | 3.5 parts |

The following components were mixed and dissolved, further, filtrated through a fluorine resin filter having pore diameter of 0.2 μm, to prepare resist liquid.

Resin (kind and amount are described in Tables 1-1 and 1-2)

Acid generator (kind and amount are described in Tables 1-1 and 1-2)

Quencher (kind and amount are described in Tables 1-1 and 1-2)

Solvent (kind is described in Tables 1-1 and 1-2)

Silicon wafers were each coated with "ARC-29", which is an organic anti-reflective coating composition available from Nissan Chemical Industries, Ltd., and then baked under the conditions: 205° C., 60 seconds, to form a 780 Å-thick organic anti-reflective coating. Each of the resist liquids prepared as above was spin-coated over the anti-reflective coating so that the thickness of the resulting film became 0.15 μm after drying. The silicon wafers thus coated with the respective resist liquids were each prebaked on a direct hotplate at a temperature shown in column of "PB" of Table 1 for 60 seconds. Using an ArF excimer stepper ("FPA5000-AS3" manufactured by CANON INC., NA=0.75, ⅔ Annular), each wafer thus formed with the respective resist film was subjected to line and space pattern exposure, with the exposure quantity being varied stepwise.

After the exposure, each wafer was subjected to post-exposure baking on a hotplate at a temperature shown in column of "PEB" of Table 1 for 60 seconds and then to paddle development for 60 seconds with an aqueous solution of 2.38 wt % tetramethylammonium hydroxide.

Each of a dark field pattern developed on the organic anti-reflective coating substrate after the development was observed with a scanning electron microscope, the results of which are shown in Table 2. The term "dark field pattern", as used herein, means a pattern obtained by exposure and development through a reticle comprising chromium base surface (light-shielding portion) and linear glass layers (light-transmitting portion) formed in the chromium surface and aligned with each other. Thus, the dark field pattern is such that, after exposure and development, resist layer surrounding the line and space pattern remains on substrate.

Effective Sensitivity (ES): It is expressed as the amount of exposure that the line pattern and the space pattern become 1:1 after exposure through 100 nm line and space pattern mask and development.

Resolution: It is expressed as the minimum size of space pattern which gave the space pattern split by the line pattern at the exposure amount of the effective sensitivity.

Line Edge Roughness (LER): Each of a wall surface of pattern developed on the organic anti-reflective coating substrate after the development was observed with a scanning electron microscope. When the wall surface is as same as that of Comparative Example 4, its evaluation is marked by "Δ", when the wall surface is smoother than that of Comparative Example 4, its evaluation is marked by "○", and when the wall surface is rougher than that of Comparative Example 4, its evaluation is marked by "X".

TABLE 1-1

| Ex. No. | Resin (kind/amount (part)) | Acid generator (kind/amount (part)) | Quencher (kind/amount (part)) | Solvent | PB (° C.) | PEB (° C.) |
|---|---|---|---|---|---|---|
| Ex. 1 | A1/10 | B1/0.40 B3/0.30 | Q1/0.065 | Y1 | 100 | 105 |
| Ex. 2 | A1/10 | B1/0.40 B2/0.30 | Q1/0.065 | Y1 | 100 | 105 |
| Ex. 3 | A1/10 | B1/0.40 C2/0.30 | Q1/0.065 | Y1 | 100 | 105 |
| Ex. 4 | A1/10 | B1/0.40 C1/0.08 | Q1/0.065 | Y1 | 100 | 105 |
| Ex. 5 | A3/10 | B1/0.40 B3/0.30 | Q1/0.065 | Y1 | 100 | 105 |
| Ex. 6 | A3/10 | B1/0.40 B2/0.30 | Q1/0.065 | Y1 | 100 | 105 |
| Ex. 7 | A3/10 | B4/0.40 B2/0.30 | Q1/0.065 | Y1 | 100 | 105 |
| Ex. 8 | A3/10 | B5/0.36 B2/0.30 | Q1/0.065 | Y1 | 100 | 105 |
| Ex. 9 | A3/10 | B6/0.40 B2/0.30 | Q1/0.065 | Y1 | 100 | 105 |
| Ex. 10 | A3/10 | B7/0.43 B2/0.30 | Q1/0.065 | Y1 | 100 | 105 |
| Ex. 11 | A3/10 | B8/0.45 B2/0.30 | Q1/0.065 | Y1 | 100 | 105 |
| Ex. 12 | A3/10 | B9/0.45 B2/0.30 | Q1/0.065 | Y1 | 100 | 105 |
| Ex. 13 | A3/10 | B10/0.73 B2/0.30 | Q1/0.065 | Y1 | 100 | 105 |
| Ex. 14 | A3/10 | B11/0.61 B2/0.30 | Q1/0.065 | Y1 | 100 | 105 |
| Ex. 15 | A4/10 | B1/0.40 B2/0.30 | Q1/0.065 | Y1 | 100 | 95 |
| Ex. 16 | A5/10 | B1/0.40 B2/0.30 | Q1/0.065 | Y1 | 100 | 90 |
| Ex. 17 | A6/10 | B1/0.40 B2/0.30 | Q1/0.065 | Y1 | 100 | 95 |

TABLE 1-2

| Ex. No. | Resin (kind/amount (part)) | Acid generator (kind/amount (part)) | Quencher (kind/amount (part)) | Solvent | PB (° C.) | PEB (° C.) |
|---|---|---|---|---|---|---|
| Comp. Ex. 1 | A2/10 | B1/0.40 B2/0.30 | Q1/0.065 | Y1 | 100 | 105 |
| Comp. Ex. 2 | A2/10 | B1/0.40 C2/0.30 | Q1/0.065 | Y1 | 100 | 105 |
| Comp. Ex. 3 | A1/10 | C1/0.40 | Q1/0.065 | Y1 | 100 | 105 |
| Comp. Ex. 4 | A1/10 | B1/0.50 | Q1/0.065 | Y1 | 100 | 105 |
| Comp. Ex. 5 | A1/10 | B2/1.50 | Q1/0.065 | Y1 | 100 | 105 |
| Comp. Ex. 6 | A3/10 | B4/0.51 | Q1/0.065 | Y1 | 100 | 105 |

TABLE 2

| Ex. No. | ES (mJ/cm$^2$) | Resolution (nm) | LER |
|---|---|---|---|
| Ex. 1 | 31 | 90 | ○ |
| Ex. 2 | 28 | 90 | ○ |
| Ex. 3 | 26 | 90 | ○ |

TABLE 2-continued

| Ex. No. | ES (mJ/cm²) | Resolution (nm) | LER |
|---|---|---|---|
| Ex. 4 | 26 | 90 | ○ |
| Ex. 5 | 37 | 90 | ○ |
| Ex. 6 | 33 | 90 | ○ |
| Ex. 7 | 37 | 90 | ○ |
| Ex. 8 | 29 | 90 | ○ |
| Ex. 9 | 30 | 90 | ○ |
| Ex. 10 | 27 | 90 | ○ |
| Ex. 11 | 24 | 90 | ○ |
| Ex. 12 | 25 | 90 | ○ |
| Ex. 13 | 27 | 90 | ○ |
| Ex. 14 | 35 | 90 | ○ |
| Ex. 15 | 43 | 90 | ○ |
| Ex. 16 | 39 | 90 | ○ |
| Ex. 17 | 42 | 90 | ○ |
| Comp. Ex. 1 | 53 | 90 | X |
| Comp. Ex. 2 | 44 | 90 | X |
| Comp. Ex. 3 | 21 | 95 | ○ |
| Comp. Ex. 4 | 29 | 90 | Δ |
| Comp. Ex. 5 | 34 | 100 | ○ |
| Comp. Ex. 6 | 39 | 90 | Δ |

Apparent from Table 2, the resist compositions of Examples, which accord to the present invention, give good resist pattern in resolution and in smoothness of wall surface.

The present composition provides good resist pattern in resolution and line edge roughness and is especially suitable for ArF excimer laser lithography, KrF excimer laser lithography and ArF immersion lithography.

What is claimed is:

1. A chemically amplified resist composition comprising:
a resin which comprises a structural unit having an acid-labile group and a structural unit represented by the formula (I):

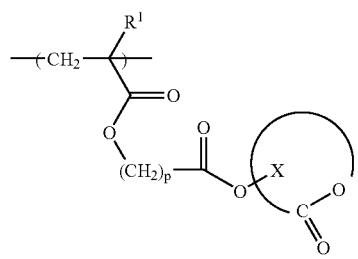

wherein $R^1$ represents a hydrogen atom or a methyl group, ring X represents a C3-C30 cyclic hydrocarbon group in which one —$CH_2$— is substituted with —COO—, and at least one hydrogen atom in the C3-C30 cyclic hydrocarbon group may be substituted, and p represents an integer of 1 to 4, and which itself is insoluble or poorly soluble in an alkali aqueous solution but becomes soluble in an alkali aqueous solution by the action of an acid, and at least two salts selected from a salt represented by the formula (II):

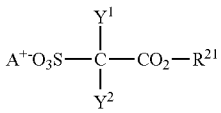

wherein $Y^1$ and $Y^2$ each independently represent a fluorine atom or a C1-C6 perfluoroalkyl group, $A^+$ represents an organic counter ion and $R^{21}$ represents a C1-C30 hydrocarbon group which may be substituted and at least one —$CH_2$— in the C1-C30 hydrocarbon group may be substituted with —CO— or —O—, and a salt represented by the formula (III):

wherein $R^{23}$ represents a C1-C8 linear or branched chain perfluoroalkyl group and $A'^+$ represents an organic counter ion.

2. The chemically amplified resist composition according to claim 1, wherein the structural unit having an acid-labile group is a structural unit represented by the formula (IVa):

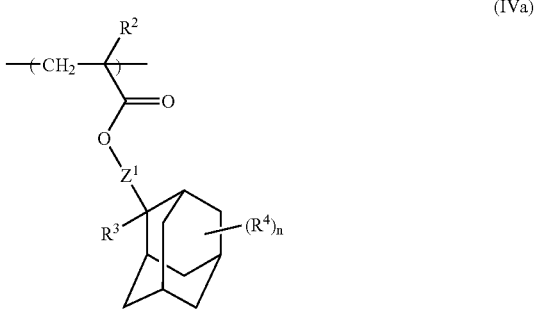

wherein $R^2$ represents a hydrogen atom or a methyl group, $R^3$ represents a C1-C8 hydrocarbon group, $R^4$ represents a methyl group, n represents an integer of 0 to 14, $Z^1$ represents a single bond or —$(CH_2)_r$—COO—, and r represents an integer of 1 to 4, or a structural unit represented by the formula (IVb):

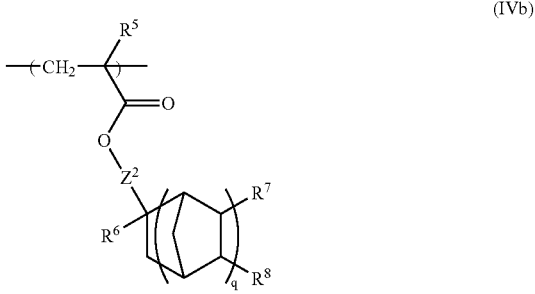

wherein $R^5$ represents a hydrogen atom or a methyl group, $R^6$ represents a C1-C8 hydrocarbon group, $R^7$ and $R^8$ each independently represent a hydrogen atom or a C1-C8 monovalent hydrocarbon group which may have at least one heteroatom, and $R^7$ and $R^8$ may be bonded to form a C1-C8 divalent hydrocarbon group which may have at least one heteroatom which forms a ring together with the adjacent carbon atoms to which $R^7$ and $R^8$ are bonded, and $R^7$ and $R^8$ may be bonded to form a carbon-carbon double bond between the carbon atom to which $R^7$ is bonded and the carbon atom to which $R^8$ is bonded, q represents an integer of 1 to 3, $Z^2$ represents a single bond or —(CH$_2$)$_s$—COO—, and s represents an integer of 1 to 4.

3. The chemically amplified resist composition according to claim 1, wherein the resin further comprises a structural unit represented by the formula (V):

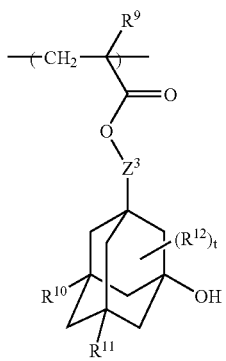

(V)

wherein $R^9$ represents a hydrogen atom or a methyl group, $R^{10}$ and $R^{11}$ each independently represent a hydrogen atom, a methyl group or a hydroxyl group, $R^{12}$ represents a methyl group, t represents an integer of 0 to 12, $Z^3$ represents a single bond or —(CH$_2$)$_u$—COO— and u represents an integer of 1 to 4.

4. The chemically amplified resist composition according to claim 1, wherein the structural unit represented by the formula (I) is a structural unit represented by the formula (VIa), (VIb) or (VIc):

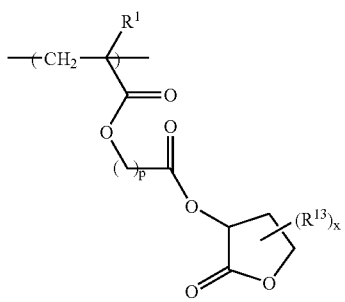

(VIa)

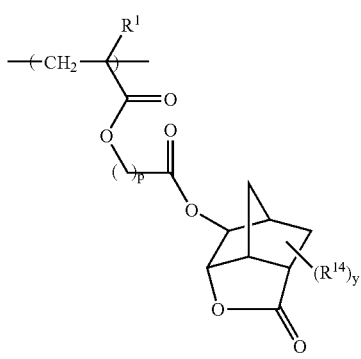

(VIb)

-continued

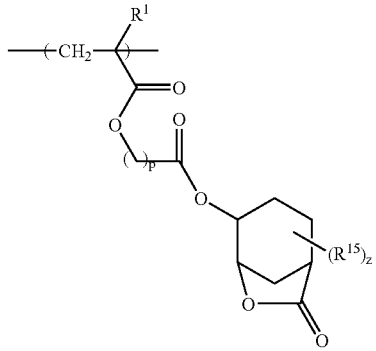

(VIc)

wherein $R^1$ represents a hydrogen atom or a methyl group, p represents an integer of 1 to 4, $R^{13}$ represents a methyl group, x represents an integer of 0 to 5, $R^{14}$ represents a C1-C4 hydrocarbon group, a carboxyl group or a cyano group, y represents an integer of 0 to 3, $R^{15}$ represents a C1-C4 hydrocarbon group, a carboxyl group or a cyano group, z represents an integer of 0 to 3, and when y is 2 or 3, $R^{14}$s may be the same or different, and when z is 2 or 3, $R^{15}$s may be the same or different.

5. The chemically amplified resist composition according to claim 1, wherein the salt represented by the formula (II) is a salt represented by the formula (VII):

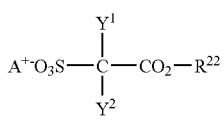

(VII)

wherein $Y^1$ and $Y^2$ each independently represent a fluorine atom or a C1-C6 perfluoroalkyl group, $A^+$ represents an organic counter ion, and $R^{22}$ represents a C1-C20 linear or branched chain hydrocarbon group which may be substituted or a C3-C30 cyclic hydrocarbon group which may be substituted, and at least one —CH$_2$— in the C1-C20 linear or branched chain hydrocarbon group or the C3-C30 cyclic hydrocarbon group may be substituted with —CO— or —O—.

6. The chemically amplified resist composition according to claim 1, wherein the salt represented by the formula (II) is a salt represented by the following formula (XII):

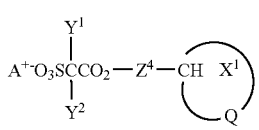

(XII)

wherein $Y^1$ and $Y^2$ each independently represent a fluorine atom or a C1-C6 perfluoroalkyl group, $A^+$ represents an organic counter ion, $Z^4$ represents a single bond or a C1-C4 alkylene group, Q represents —CH$_2$—, —CO— or —CH(OH)— and ring $X^1$ represents a C3-C30 monocyclic or polycyclic hydrocarbon group in which two hydrogen atoms are substituted with =O at Q position when Q is —CO— or in which a hydrogen atom is substituted with a hydroxyl group at Q position when Q is —CH(OH)—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group.

7. The chemically amplified resist composition according to claim 1, wherein $A^+$ and $A'^+$ are the same or different, and each independently represents at least one cation selected from the group consisting of the formula (VIIIa):

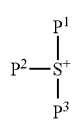

(VIIIa)

wherein $P^1$, $P^2$ and $P^3$ each independently represent a C1-C30 linear or branched chain alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group, a cation represented by the formula (VIIIb):

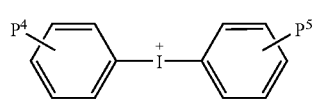

(VIIIb)

wherein $P^4$ and $P^5$ each independently represent a hydrogen atom, a hydroxyl group, a C1-C12 alkyl group or a C1-C12 alkoxy group, a cation represented by the formula (VIIIc):

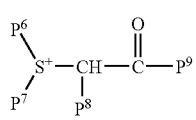

(VIIIc)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, and at least one —CH$_2$— in the divalent acyclic hydrocarbon group may be substituted with —CO—, —O— or —S—, $P^8$ represents a hydrogen atom, $P^9$ represents a C1-C12 alkyl group, a C3-C12 cycloalkyl group or an aromatic group which may be substituted, or $P^8$ and $P^9$ are bonded to form a divalent a cyclic hydrocarbon group which forms a 2-oxocycloalkyl group together with the adjacent —CHCO—, and at least one —CH$_2$— in the divalent acyclic hydrocarbon group may be replaced with —CO—, —O— or —S—; and a cation represented by the formula (VIIId):

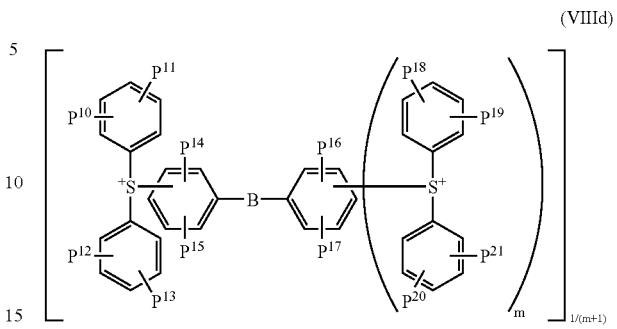

(VIIId)

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent a hydrogen atom, a hydroxyl group, a C1-C12 alkyl group or a C1-C12 alkoxy group, B represents a sulfur or oxygen atom and m represents 0 or 1.

8. The chemically amplified resist composition according to claim 1, wherein $A^+$ and $A'^+$ are the same or different, and each independently represents a cation represented by the formula (VIIIe), (VIIIf), (VIIIg) or (VIIIj):

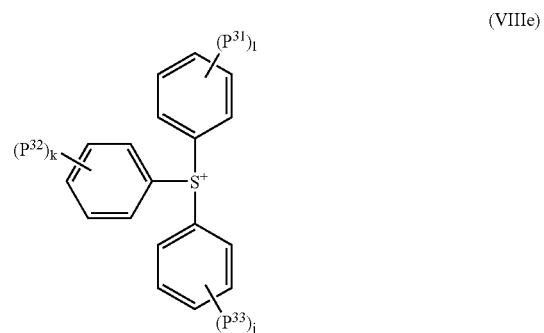

(VIIIe)

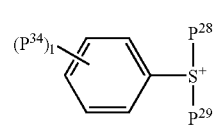

(VIIIf)

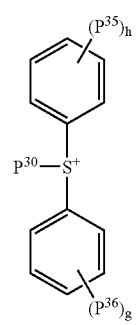

(VIIIg)

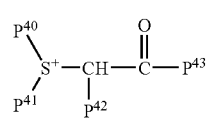

(VIIIj)

wherein $P^{28}$, $P^{29}$ and $P^{30}$ each independently represent a C1-C20 alkyl group or a C3-C30 cyclic hydrocarbon group except a phenyl group, and at least one hydrogen atom in the C1-C20 alkyl group may be substituted with a hydroxyl group, a C1-C12 alkoxy group or a C3-C12 cyclic hydrocarbon group and at least one hydrogen atom in the C3-C30 cyclic hydrocarbon group may be substituted with a hydroxyl group, a C1-C12 alkyl group or a C1-C12 alkoxy group, and $P^{31}$, $P^{32}$, $P^{33}$, $P^{34}$, $P^{35}$ and $P^{36}$ each independently represent a hydroxyl group, a C1-C12 alkyl group, a C1-C12 alkoxy group or a C3-C12 cyclic hydrocarbon group, and l, k, j, i, h and g each independently represent an integer of 0 to 5, $P^{40}$ and $P^{41}$ each independently represent a C1-C6 alkyl group or a C3-C6 cycloalkyl group, or $P^{40}$ and $P^{41}$ are bonded to form a C3-C7 divalent acyclic hydrocarbon group which forms the ring together with the adjacent $S^+$, $P^{42}$ represents a hydrogen atom, $P^{43}$ represents a C1-C6 alkyl group or a C6-C12 aromatic group which may be substituted with at least one selected from the C1-C6 alkoxy group, the C2-C12 acyl group and the nitro group, or $P^{42}$ and $P^{43}$ are bonded to form a C3-C7 divalent acyclic hydrocarbon group which forms a 2-oxocycloalkyl group together with the adjacent —CHCO—, and at least one —CH$_2$— in the C3-C7 divalent acyclic hydrocarbon group may be replaced with —CO—, —O— or —S—.

9. The chemically amplified resist composition according to claim 1, wherein $A^+$ and $A'^+$ are the same or different, and each independently represents a cation represented by the formula (VIIIh) or (VIIIk):

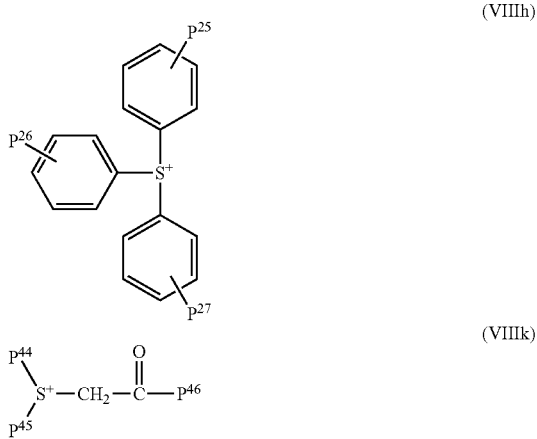

wherein $P^{25}$, $P^{26}$ and $P^{27}$ each independently represent a hydrogen atom, a hydroxyl group, a C1-C12 alkyl group or a C1-C12 alkoxy group, $P^{44}$ and $P^{45}$ are bonded to form a C3-C7 divalent acyclic hydrocarbon group which forms the ring together with the adjacent $S^+$, $P^{46}$ represents a phenyl or naphthyl group.

10. The chemically amplified resist composition according to claim 1, wherein $A^+$ and $A'^+$ are the same or different, and each independently represents a cation represented by the formula (VIIIi) or (VIIIl):

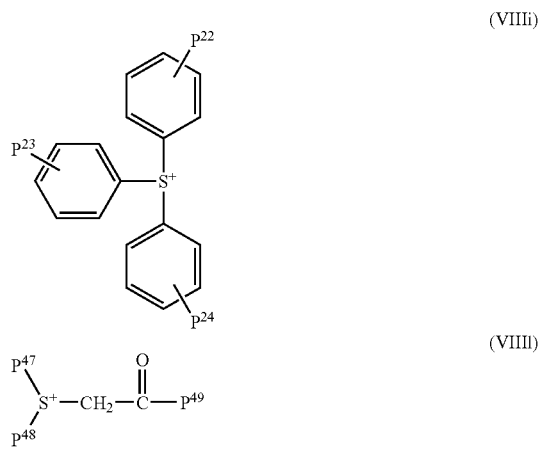

wherein $P^{22}$, $P^{23}$ and $P^{24}$ each independently represent a hydrogen atom or a C1-C4 alkyl group, $P^{47}$ and $P^{48}$ are bonded to form a C4-C5 divalent acyclic hydrocarbon group which forms the ring together with the adjacent $S^+$, $P^{49}$ represents a phenyl group.

11. The chemically amplified resist composition according to claim 1, wherein the chemically amplified resist composition comprises the salt represented by the formula (II) and at least one salt selected from the salt represented by the formula (II) and the salt represented by the formula (III).

12. The chemically amplified resist composition according to claim 1, wherein the chemically amplified resist composition comprises at least two salts selected from the salt represented by the formula (II).

13. The chemically amplified resist composition according to claim 1, wherein at least two salts selected from a salt represented by the formula (II) and a salt represented by the formula (III) are at least two salts selected from the salt represented by the formula (II) in which $A^+$ is the cation (VIIIa) or (VIIIc) and the salt represented by the formula (III) in which $A'^+$ is the cation (VIIIa) or (VIIIc).

14. The chemically amplified resist composition according to claim 1, wherein the chemically amplified resist composition further comprises a basic compound.

* * * * *